US012751166B2

(12) United States Patent
Yu et al.

(10) Patent No.: US 12,751,166 B2
(45) Date of Patent: Sep. 29, 2026

(54) DISPLAY SUBSTRATE, METHOD FOR MANUFACTURING THE SAME, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Ziyang Yu, Beijing (CN); Ming Hu, Beijing (CN); Zhiliang Jiang, Beijing (CN); Haijun Qiu, Beijing (CN); Long Ma, Beijing (CN); Tianyi Cheng, Beijing (CN); Jianpeng Wu, Beijing (CN); Qingqing Yan, Beijing (CN); Xiangnan Pan, Beijing (CN); Quanyong Gu, Beijing (CN); Pan Zhao, Beijing (CN); Qing He, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 339 days.

(21) Appl. No.: 18/566,537

(22) PCT Filed: Feb. 22, 2023

(86) PCT No.: PCT/CN2023/077611

§ 371 (c)(1),
(2) Date: Dec. 1, 2023

(87) PCT Pub. No.: WO2024/174120

PCT Pub. Date: Aug. 29, 2024

(65) Prior Publication Data

US 2025/0098452 A1 Mar. 20, 2025

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .. H10K 59/131; H10K 59/1201; H10K 59/12; H10K 59/128; G09G 3/20
See application file for complete search history.

(56) References Cited

U.S. PATENT DOCUMENTS 10,535,285 B2 * 1/2020 Zeng .................... G09G 3/3677
11,749,192 B2 * 9/2023 Li ........................ G09G 3/2007
345/214

(Continued)

FOREIGN PATENT DOCUMENTS

CN 105164743 A 12/2015
CN 105448227 A 3/2016

(Continued)

*Primary Examiner* — Douglas W Owens
(74) *Attorney, Agent, or Firm* — BROOKS KUSHMAN P.C.

(57) ABSTRACT

Display substrate, method for manufacturing the same, and display device are disclosed. The display substrate comprises: a base substrate comprising a display region and a peripheral region located at a periphery of the display region, the display region comprises at least two display sub-regions; the display substrate further comprises scanning lines and sub-pixels, wherein the scanning lines comprise first scanning lines comprising at least two scanning line segments independent from each other, and the at least two scanning line segments are located in different display sub-regions; and the sub-pixels are divided into rows of sub-pixels, the rows of sub-pixels comprise a target row of sub-pixels which is divided into at least two sub-pixel groups located in different display sub-regions, and the (Continued)

scanning line segment is coupled to each sub-pixel in a corresponding sub-pixel group belonging to a same display sub-region.

19 Claims, 45 Drawing Sheets

(56) References Cited

U.S. PATENT DOCUMENTS

| | | | | |
|---|---|---|---|---|
| 12,230,182 | B2 * | 2/2025 | Wei | G09G 3/3233 |
| 2014/0085279 | A1 | 3/2014 | Shiomi | |
| 2016/0019856 | A1 | 1/2016 | Tanaka et al. | |
| 2016/0111055 | A1 | 4/2016 | Na et al. | |
| 2017/0372651 | A1 | 12/2017 | He et al. | |
| 2018/0330671 | A1 | 11/2018 | Kim et al. | |
| 2020/0152725 | A1 | 5/2020 | Chen et al. | |
| 2021/0098300 | A1 * | 4/2021 | Kusunoki | G06F 3/1446 |
| 2021/0264863 | A1 | 8/2021 | Wang et al. | |
| 2023/0127696 | A1 | 4/2023 | Zheng et al. | |

FOREIGN PATENT DOCUMENTS

| | | | |
|---|---|---|---|
| CN | 106205449 | A | 12/2016 |
| CN | 108352146 | A | 7/2018 |
| CN | 109473043 | A | 3/2019 |
| CN | 109712564 | A | 5/2019 |
| CN | 110998703 | A | 4/2020 |
| CN | 113823207 | A | 12/2021 |
| JP | 2000112435 | A | 4/2000 |

* cited by examiner

DISPLAY SUBSTRATE, METHOD FOR MANUFACTURING THE SAME, AND DISPLAY DEVICE

CROSS-REFERENCE TO RELATED APPLICATION

This application is the U.S. national phase of PCT Application No. PCT/CN2023/077611 filed on Feb. 22, 2023, which is incorporated herein by reference in its entirety.

TECHNICAL FIELD

The present disclosure relates to the technical field of displaying, and more particularly, to a display substrate, a method for manufacturing the same, and a display device.

BACKGROUND

The organic light-emitting diode (OLED) has advantages of high contrast, fast response and low power consumption. In order to further reduce power consumption, the OLED display product adopts a driving mode of combining a low-temperature polysilicon transistor and an oxide transistor, i.e., a low-temperature polysilicon-oxide displaying technique, which can realize a displaying with low frame frequency and can reduce a driving power consumption by reducing repeated refreshing for a static image.

SUMMARY

The present disclosure to provide a display substrate, a method for manufacturing the same, and a display device.

To achieve this, the present disclosure provides the following technical solutions.

In a first aspect of the present disclosure, a display substrate is provided, which includes a base substrate. The base substrate comprises a display region and a peripheral region located at a periphery of the display region, the display region comprises at least two display sub-regions. The display substrate further comprising:

a plurality of scanning lines, wherein the plurality of scanning lines comprise a plurality of first scanning lines, the first scanning line comprise at least two scanning line segments which are independent from each other, and the at least two scanning line segments are located in different display sub-regions; and a plurality of sub-pixels, wherein the plurality of sub-pixels are divided into a plurality of rows of sub-pixels, the plurality of rows of sub-pixels comprise a target row of sub-pixels, the target row of sub-pixels are divided into at least two sub-pixel groups, the at least two sub-pixel groups are located in different display sub-regions, and a scanning line segment of the at least two scanning line segments is coupled to each sub-pixel in a corresponding sub-pixel group belonging to a same display sub-region.

Optionally, the plurality of rows of sub-pixels further comprise non-target rows of sub-pixels, and all sub-pixels comprised in a same non-target row of sub-pixels are located in a same display sub-region. The plurality of scanning lines further comprise a plurality of second scanning lines, and the second scanning line is coupled to each sub-pixel in a corresponding non-target row of sub-pixels.

Optionally, the display region comprises two display sub-regions arranged along a first direction, the first scanning line comprises two scanning line segments arranged along the first direction, and at least a portion of the scanning line segment is located in a corresponding display sub-region; or, the display region comprises at least three display sub-regions arranged along a first direction, the first scanning line comprises at least three scanning line segments arranged along the first direction, and at least a portion of the scanning line segment is located in a corresponding display sub-region.

Optionally, the display region further comprises a plurality of display sub-regions distributed in an array, the plurality of display sub-regions are divided into a plurality of rows of display sub-regions, and quantities of display sub-regions comprised in the plurality of rows of display sub-regions are the same or different.

Optionally, in a same first scanning line, an n-th spacing region is disposed between an n-th scanning line segment and an (n+1)-th scanning line segment, wherein n is an integer greater than or equal to 1; n-th spacing regions in at least some of the first scanning lines are located at different positions along a first direction.

Optionally, in a same first scanning line, an n-th spacing region is disposed between an n-th scanning line segment and the (n+1)-th scanning line segment, wherein n is an integer greater than or equal to 1; n-th spacing regions in at least some of the first scanning lines are located in a same column along a second direction.

Optionally, the target row of sub-pixels comprises m sub-pixels arranged along the first direction, and a layout range for the n-th spacing region is between (m/2−a) and (m/2+a), wherein (m/2−a) represents a (m/2−a)-th sub-pixel, (m/2+a) represents a (m/2+a)-th sub-pixel; a meets: a*d1≤d2, wherein d1 is a width of a layout region occupied by one sub-pixel along the first direction, and d2 is a width of the display region along the first direction.

Optionally, in the plurality of first scanning lines, an n-th spacing region of an odd-numbered first scanning line and an n-th spacing region of an even-numbered first scanning lines are located at different positions along the first direction.

Optionally, in the plurality of first scanning lines, in the plurality of first scanning lines, the n-th spacing region of the odd-numbered first scanning line is adjacent to the (m/2−a)-th sub-pixel, and the n-th spacing region of the even-numbered first scanning line is adjacent to the (m/2+a)-th sub-pixel.

Optionally, the display substrate further comprises:

a first gate driving circuit to a k-th gate driving circuit, wherein the first scanning line comprises k scanning line segments arranged along a first direction, and k is an integer greater than or equal to 2;

the first gate driving circuit and the k-th gate driving circuit are located in the peripheral region and are oppositely arranged along the first direction, and the display region is located between the first gate driving circuit and the k-th gate driving circuit; and the first gate driving circuit is coupled to a 1-st scanning line segment adjacent to the first gate driving circuit, and the k-th gate driving circuit is coupled to a k-th scanning line segment adjacent to the k-th gate driving circuit.

Optionally, k is an integer greater than or equal to 3;

a second gate driving circuit to a (k−1)-th gate driving circuit are located in the display region; a y-th gate driving circuit is coupled to a y-th scanning line segment, wherein y is an integer satisfying 2≤y≤k−1.

Optionally, k is an integer greater than or equal to 3;

a second gate driving circuit to a (k−1)-th gate driving circuit are located in the peripheral region, and the second gate driving circuit to the (k−1)-th gate driving circuit are located at one side of the display region along the second direction; a y-th gate driving circuit is coupled to a y-th scanning line segment, wherein y is an integer satisfying $2 \le y \le k-1$.

Optionally, the sub-pixel comprises a sub-pixel driving circuit; the sub-pixel driving circuit comprises a driving transistor and a compensation transistor, a first electrode of the compensation transistor is coupled to a second electrode of the driving transistor, and a second electrode of the compensation transistor is coupled to a gate electrode of the driving transistor.

The first scanning lines comprise a first gate line, the scanning line segments comprise a first gate line segment, and the first gate line segment is coupled to a gate electrode of a corresponding compensation transistor belonging to a same display sub-region.

Optionally, the display substrate further comprises a first initialization signal line; the sub-pixel driving circuit further comprises a first reset transistor, a first electrode of the first reset transistor is coupled to a corresponding initialization signal line, and a second electrode of the first reset transistor is coupled to the second electrode of the driving transistor.

The first scanning lines further comprise a first reset line, the scanning line segments further comprise a first reset line segment, and the first reset line segment is coupled to a gate electrode of a corresponding first reset transistor belonging to a same display sub-region.

Optionally, the display substrate further comprises a plurality of data lines; the sub-pixel driving circuit further comprises a data writing transistor, a first electrode of the data writing transistor is coupled to a corresponding data line, and a second electrode of the data writing transistor is coupled to a first electrode of the driving transistor.

The first scanning lines further comprise a second gate line, the scanning line segments further comprise a second gate line segment, and the second gate line segment is coupled to a gate electrode of a corresponding data writing transistor belonging to a same display sub-region.

Optionally, the display substrate further comprises a power supply line, at least a portion of the power supply line is located in a spacing region between adjacent first gate line segments; and/or at least a portion of the power supply line is located in a spacing region between adjacent first reset line segments; and/or at least portion of the power supply line is located in a spacing region between adjacent second gate line segments.

Optionally, the display substrate further comprises a power supply line; the sub-pixel driving circuit further comprises a power supply control transistor, a first electrode of the power supply control transistor is coupled to the power supply line, and a second electrode of the power supply control transistor is coupled to a first electrode of the driving transistor.

The first scanning lines further comprise a light-emitting control line, the scanning line segments further comprise a light-emitting control line segment, and the light-emitting control line segment is coupled to a gate electrode of a corresponding power supply control transistor belonging to a same display sub-region.

Optionally, the display substrate further comprises a third initialization signal line and a second reset line; the sub-pixel driving circuit further comprises a third reset transistor, a first electrode of the third reset transistor is coupled to the third initialization signal line, a second electrode of the third reset transistor is coupled to the first electrode of the driving transistor, and a gate electrode of the third reset transistor being coupled to a corresponding second reset line.

At least a portion of the third initialization signal line is located in a spacing region between adjacent light-emitting control line segments.

Optionally, the display substrate further comprises a third initialization signal line; the sub-pixel driving circuit further comprises a third reset transistor, a first electrode of the third reset transistor is coupled to the third initialization signal line, and a second electrode of the third reset transistor is coupled to a first electrode of the driving transistor.

The first scanning lines further comprise a second reset line, the scanning line segments further comprise a second reset line segment, and the second reset line segment is coupled to a gate electrode of a corresponding third reset transistor belonging to a same display sub-region.

Optionally, the display substrate further comprises a first initialization signal line; the sub-pixel driving circuit further comprises a first reset transistor and a first reset line, a first electrode of the first reset transistor is coupled to a corresponding initialization signal line, a second electrode of the first reset transistor is coupled to the second electrode of the driving transistor, and a gate electrode of the first reset transistor is coupled to a corresponding first reset line.

At least a portion of the first initialization signal line is located in a spacing region between adjacent second reset line segments.

Optionally, the display substrate further comprises: power supply lines, first initialization signal lines, second initialization signal lines, third initialization signal lines and a cathode layer;

power supply lines located in different display sub-regions are independent of each other; and/or, first initialization signal lines located in different display sub-regions are independent from each other; and/or, second initialization signal lines located in different display sub-regions are independent from each other; and/or, third initialization signal lines located in different display sub-regions are independent from each other; and/or, cathode layers located in the different display sub-regions are independent of each other.

Based on the technical solution of the display substrate, in a second aspect of the present disclosure a display device is provided, which comprises the above-mentioned display substrate.

Based on the technical solution of the display substrate, in a third aspect of the present disclosure, a display substrate manufacturing method is provided, for manufacturing the above-mentioned display substrate which comprising a base substrate, the base substrate comprising a display region and a peripheral region located at a periphery of the display region, the display region comprising: at least two display sub-regions;

the manufacturing method including:

fabricating a plurality of scanning lines, wherein the plurality of scanning lines comprise a plurality of first scanning lines, the first scanning lines comprise at least two scanning line segments which are independent from each other, and the at least two scanning line segments are located in different display sub-regions; and fabricating a plurality of sub-pixels, wherein the plurality of sub-pixels are divided into a plurality of rows of sub-pixels, the plurality of rows of sub-pixels comprise a target row of sub-pixels, the target row of sub-pixels are divided into at least two sub-pixel groups, the at least two sub-pixel groups are located in different display sub-regions, and the scanning line segment is coupled to each sub-pixel in a corresponding sub-pixel group belonging to a same display sub-region.

Optionally, the fabricating a plurality of sub-pixels specifically comprises:

fabricating non-target rows of sub-pixels, wherein all sub-pixels comprised in a same non-target row of sub-pixels is located in a same display sub-region; and the fabricating a plurality of scanning lines specifically comprises:

fabricating a plurality of second scanning lines, wherein the second scanning line is coupled to each sub-pixel in a corresponding non-target row of sub-pixels.

BRIEF DESCRIPTION OF THE DRAWINGS

The accompanying drawings, which are introduced to provide a further understanding of the present disclosure and are incorporated in and constitute a part of the present disclosure, illustrated embodiment(s) of the present disclosure and the description thereof serve to explain the disclosure and do not constitute an undue limitation of the disclosure.

DETAILED DESCRIPTION

In order to further explain the display substrate, the method for manufacturing the same, and the display device provided by embodiments of the present disclosure, a detailed description will be given below with reference to the accompanying drawings.

Currently, when an image updating is performed on an OLED display product, voltages of all pixels is required to be initialized and written within one frame. In certain application scenario, for example, video is displayed at left side while comments are displayed at right side and the like, voltages of pixels in a half-screen picture does not need to be updated frequently to maintain an original displaying brightness. In this case, there may be a waste in power consumption if pixels in the whole screen is repeatedly updated.

Therefore, there is a need for a split-screen refreshing in display products and which can reduce the power consumption of display products.

Figure 1:
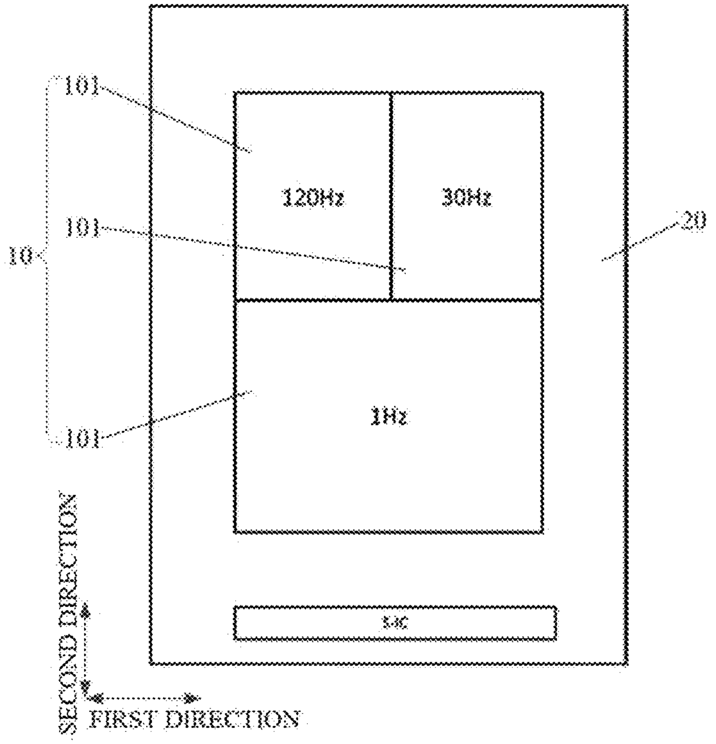
FIG. 1 is a first schematic diagram of a display substrate comprising a plurality of display sub-regions provided in an embodiment of the present disclosure.
Figure 2:
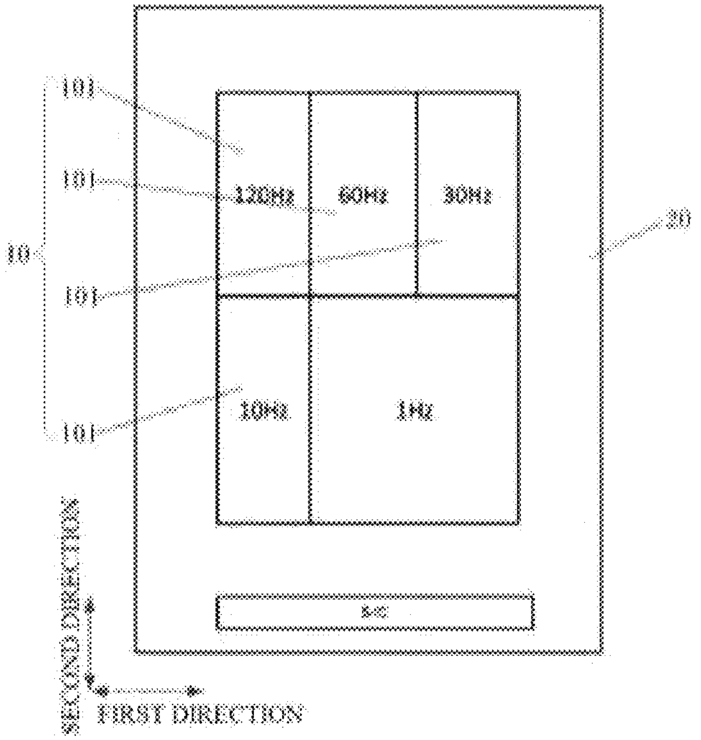
FIG. 2 is a second schematic diagram of a display substrate comprising a plurality of display sub-regions provided in an embodiment of the present disclosure.

With reference to FIGS. 1 and 2, an embodiment of the present disclosure provides a display substrate. The display substrate comprises a base substrate. The base substrate comprises a display region 10 and a peripheral region 20 located at a periphery of the display region 10. The display region 10 comprises at least two display sub-regions 101. The display substrate further comprises a plurality of scanning lines.

As shown in FIGS. 3 to 9, 11 and 12, the plurality of scanning lines comprises a plurality of first scanning lines 31. The first scanning line 31 comprises at least two scanning line segments 310 which are separated from each other. The at least two scanning line segments 310 are located in different display sub-regions.

Figure 13:
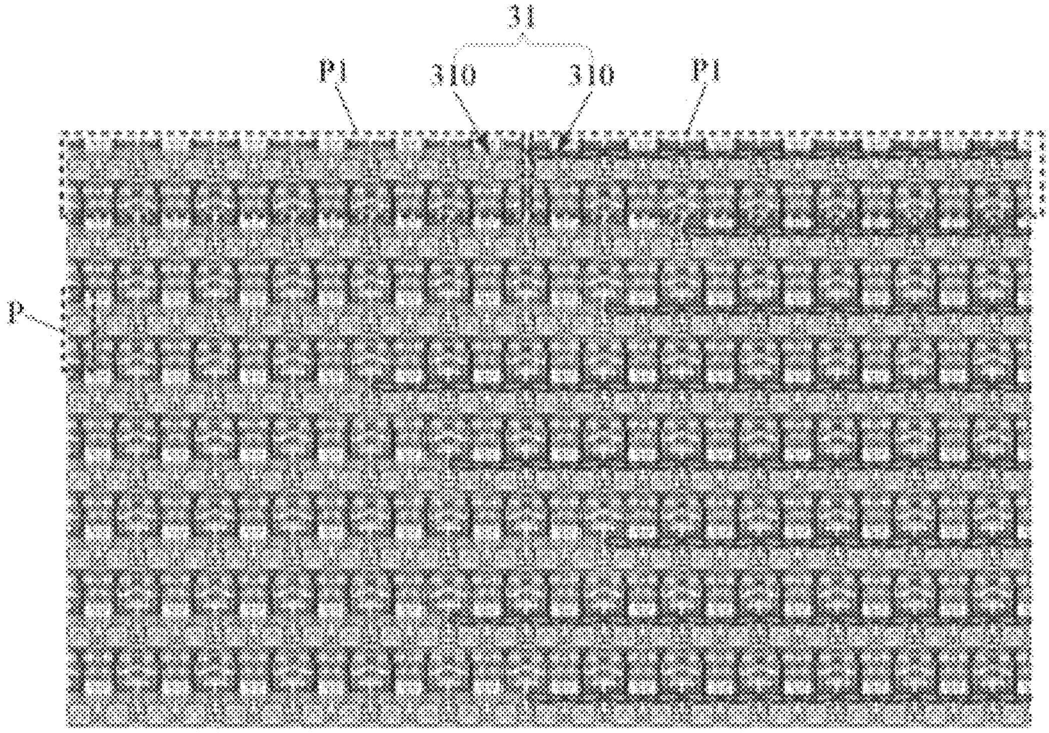
FIG. 13 is a schematic layout diagram of a plurality of sub-pixel driving circuits of a display substrate provided in an embodiment of the present disclosure.
Figure 14:
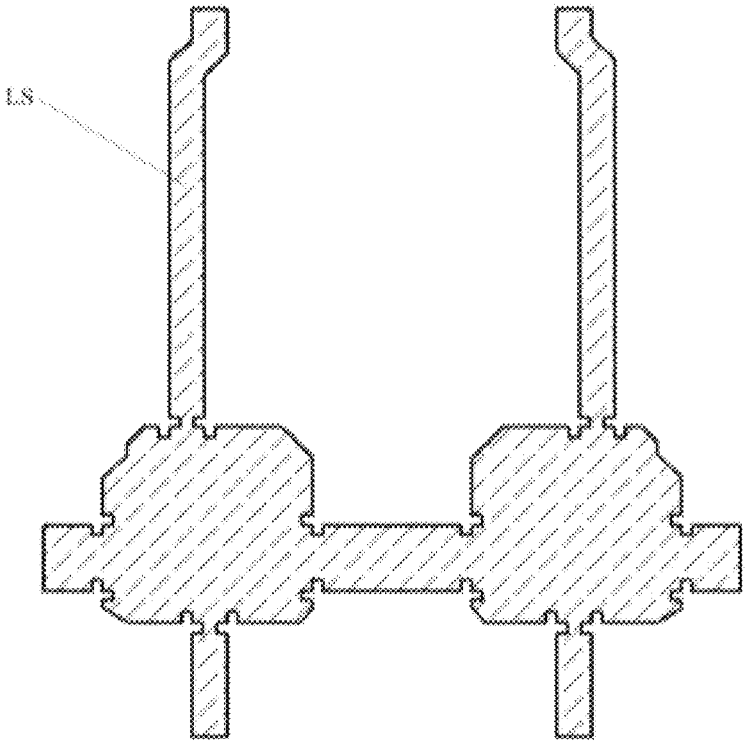
FIG. 14 is a schematic layout diagram of a light-shielding layer corresponding to two sub-pixels provided in an embodiment of the present disclosure.
Figure 15:
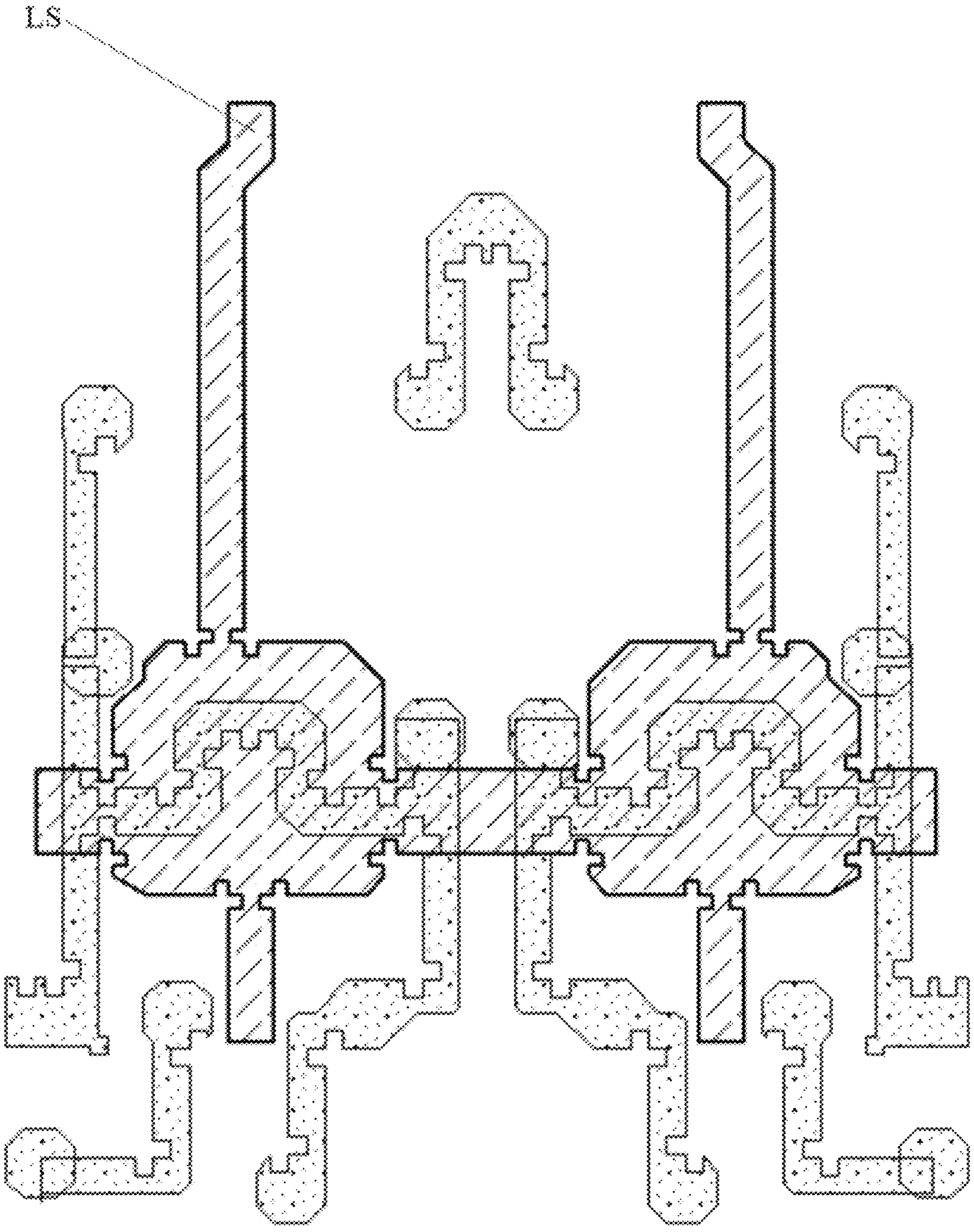
FIG. 15 is a schematic layout diagram of a light-shielding layer and a first active layer corresponding to two sub-pixels provided in an embodiment of the present disclosure.

As shown in FIG. 13, a plurality of sub-pixels P are provided. The plurality of sub-pixels P are divided into a plurality of rows of sub-pixels. The plurality of rows of sub-pixels comprise a target row of sub-pixels. The target row of sub-pixels may be divided into at least two sub-pixel groups P1. The at least two sub-pixel groups P1 are located in different display sub-regions. One scanning line segment 310 is coupled to various sub-pixels in a corresponding sub-pixel group P1 which belongs to the same display sub-region as the one scanning line segment 310.

It is noted that a driver chip S-IC is illustrated in FIGS. 1 to 9. In FIGS. 3 to 9, the "i" means that a labeled element corresponds to an i-th row of sub-pixels, and the "j" means that a labeled element corresponds to a j-th row of sub-pixels. In FIGS. 3 to 9, the "x" means that a labeled element corresponds to an x-th column, and the "z" means that a labeled element corresponds to a z-th column.

Illustratively, frequencies of scanning signals transmitted by the at least two scanning line segments 310 may be independently controlled, such that the scanning signals having the same or different frequencies may be transmitted by the at least two scanning line segments 310. Illustratively, the scanning line segment 310 is coupled to a corresponding gate driving circuit which provides a scanning signal to the scanning line segment 310. A frequency of the scanning signal may be adjusted by adjusting a frequency of a frame starting signal to which the gate driving circuit is coupled, but the present disclosure is not limited thereto.

Illustratively, the display includes the display region 10 and the peripheral region 20, the peripheral region 20 at least partially surrounds the display region 10 or the peripheral region 20 fully encloses the display region 10.

Illustratively, the display region 10 comprises two display sub-regions arranged along a first direction.

Illustratively, the display region 10 comprises at least three display sub-regions arranged along the first direction.

Illustratively, as shown in FIG. 1, the display region 10 comprises a plurality of display sub-regions distributed in an array, the plurality of display sub-regions comprises two rows of display sub-regions arranged along a second direction, a first row of display sub-regions comprises two display sub-regions arranged along the first direction, and a second row of display sub-regions comprises one display sub-region, a width of the one display sub-region in the first direction is greater than the width of any one of the display sub-regions in the first row in the first direction. Illustratively, the two display sub-regions in the first row may adopt refresh frequencies of 120 Hz and 30 Hz, respectively, and the one display sub-region in the second row may implement a refresh frequency of 1 Hz, but the present disclosure is not limited thereto.

Illustratively, as shown in FIG. 2, the display region 10 comprises a plurality of display sub-regions distributed in an array, the plurality of display sub-regions comprises two rows of display sub-regions arranged along the second direction, a first row of display sub-regions comprises three display sub-regions arranged along the first direction, and a second row of display sub-regions comprises two display sub-regions arranged along the first direction. A width of any one of the two display sub-regions in the first direction may be greater than, equal to or less than a width of any one of the display sub-regions in the first row in the first direction. Illustratively, the three display sub-regions in the first row may implement refresh frequencies of 120 Hz, 60 Hz and 30 Hz, respectively, and the two display sub-regions in the second row may implement refresh frequencies of 10 Hz and 1 Hz, respectively, but the present disclosure is not limited thereto.

Illustratively, the first direction and the second direction intersect with each other. For example, the first direction includes a transverse direction and the second direction includes a longitudinal direction, but the present disclosure is not limited thereto.

Illustratively, the display substrate includes a plurality of scanning lines. At least a portion of the scanning line is located in the display region 10. The scanning line may also include a portion located in the peripheral region 20. The scanning line is configured to transmit a scanning signal.

Illustratively, the plurality of scanning lines are arranged along the second direction, the scanning lines includes at least a portion extending in the first direction.

Illustratively, the plurality of first scanning lines 31 are arranged along the second direction. The first scanning line 31 comprises at least two mutually independent scanning line segments 310 arranged along the first direction. The scanning line segment 310 comprises at least a portion extending in the first direction. The at least two scanning line segments 310 are located in different display sub-regions, i.e., each scanning line segment 310 is located in a different display sub-region.

Figure 10:
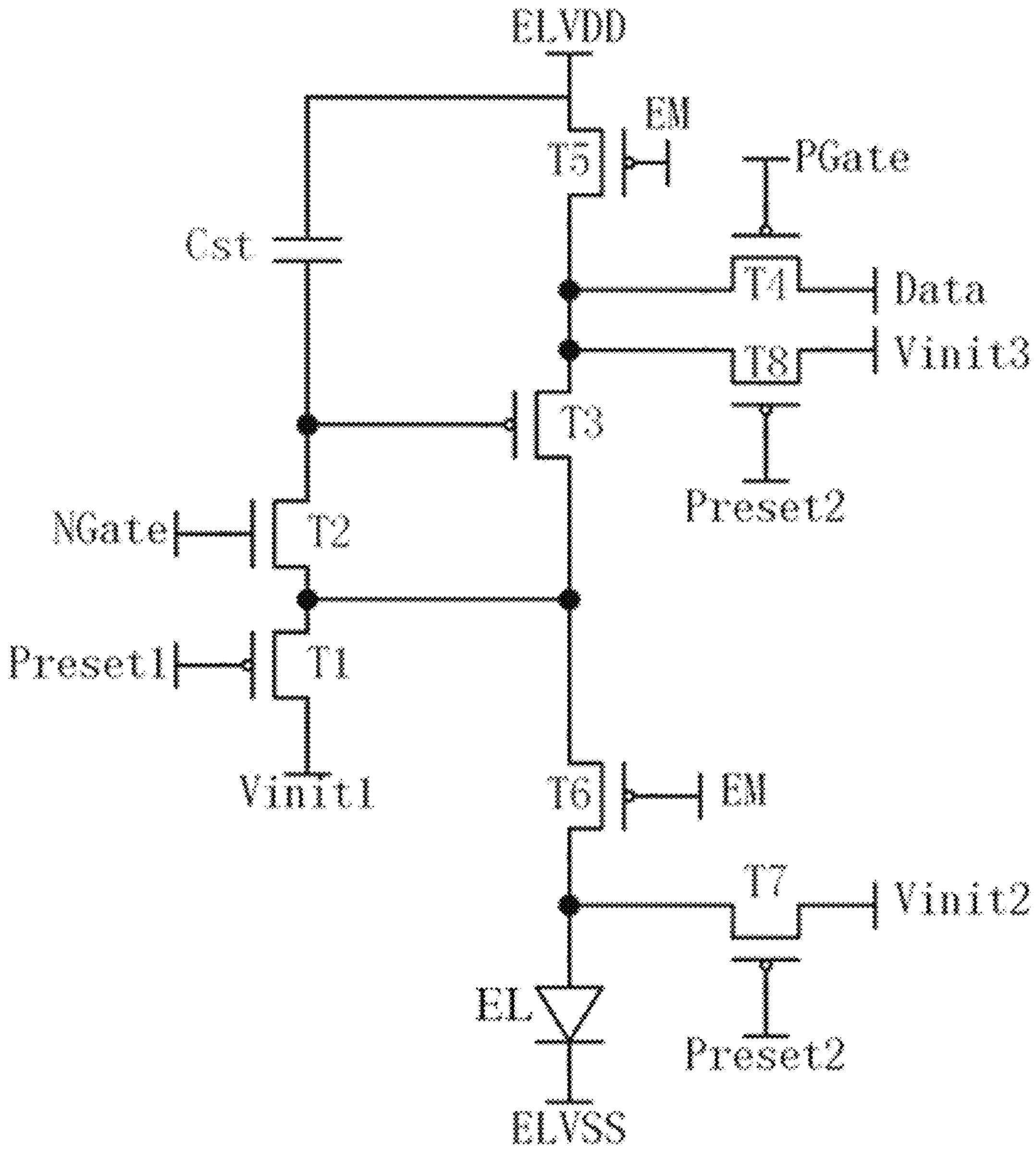
FIG. 10 is a circuit configuration diagram of a sub-pixel driving circuit provided in an embodiment of the present disclosure.
Figure 11:
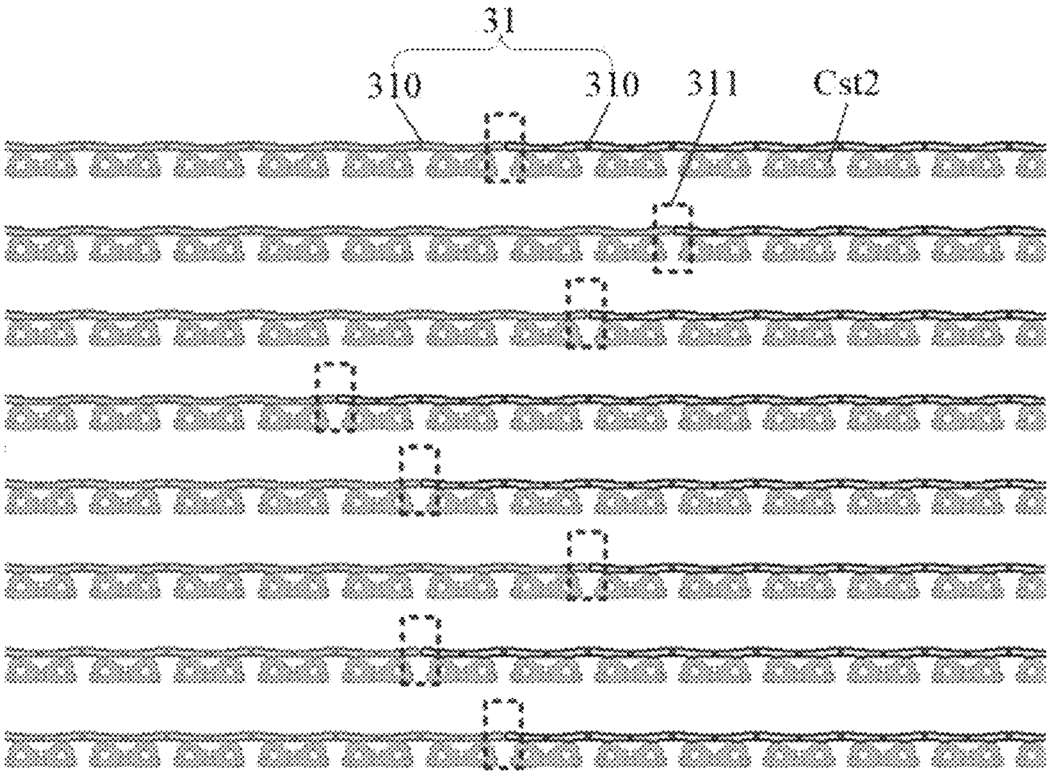
FIG. 11 is a schematic layout diagram of a second gate metal layer of a display substrate provided in an embodiment of the present disclosure.

Illustratively, as shown in FIG. 10, the display substrate includes a plurality of sub-pixels located in the display region 10. The sub-pixel includes a sub-pixel driving circuit and a light emitting element EL. The sub-pixel driving circuit is coupled to an anode of the light-emitting element EL, and is configured for supplying a driving signal to the light-emitting element EL to drive the light-emitting element EL to emit light.

Illustratively, the plurality of sub-pixels are distributed in an array. The plurality of sub-pixels is divided into a plurality of rows of sub-pixels and a plurality of columns of sub-pixels. The plurality of rows of sub-pixels are arranged along the second direction, each row of sub-pixels comprises a plurality of sub-pixels arranged along the first direction. The columns of sub-pixels are arranged along the first direction, each column of sub-pixels comprises a plurality of sub-pixels arranged along the second direction.

Illustratively, the plurality of rows of sub-pixels comprises a plurality of target rows of sub-pixels, which can be divided into at least two sub-pixel groups P1 arranged along the first direction. Each sub-pixel group P1 comprises a plurality of sub-pixels arranged along the first direction.

Illustratively, the at least two sub-pixel groups P1 are located in different display sub-regions, i.e., the sub-pixel groups P1 belonging to the same target rows of sub-pixels are located in different display sub-regions, respectively.

Illustratively, the plurality of rows of sub-pixels are in one-to-one correspondence with the plurality of scanning lines. The scanning line is coupled to each of sub-pixels in a corresponding row of sub-pixels.

Illustratively, the plurality of first scanning lines 31 are in one-to-one correspondence with the plurality of target rows of sub-pixels, and a first scanning lines 31 is coupled to each of sub-pixels in a corresponding target row of sub-pixels. Illustratively, the first scanning line 31 comprises at least two scanning line segments 310 which are independent from each other. The target row of sub-pixels can be divided into at least two sub-pixel groups P1. The at least two scanning line segments 310 are in one-to-one correspondence with the at least two sub-pixel groups P1. Each of the scanning line segments 310 is coupled to each of sub-pixels in a corresponding sub-pixel group P1 that is belonging to the same display sub-region as the scanning line segment.

According to the specific structure of the display substrate, it can be seen that in the display substrate provided by the embodiments of the present disclosure, the display region 10 is arranged to comprise at least two display sub-regions; the first scanning line 31 is arranged to comprise at least two scanning line segments 310 which are independent from each other, and the at least two scanning line segments 310 are located in different display sub-regions; and the target row of sub-pixels is divided into at least two sub-pixel groups P1, the at least two sub-pixel groups P1 are located in different display sub-regions, and the scanning line segment 310 is respectively coupled with each sub-pixel in a corresponding sub-pixel group P1 belonging to the same display sub-region. This arrangement enables the sub-pixel group P1 in each display sub-region to be independently controlled by the scanning line segment 310, thereby enabling refreshing of display sub-regions per sub-region, so that various display sub-region can adopts different refresh rates. Therefore, in the display substrate provided by the embodiments of the present disclosure, a split-screen refreshing can be realized, the power consumption of data transmission in the display substrate and the power consumption at the system side can reduced while ensuring the image displaying quality, thereby effectively reducing the displaying power consumption of the display substrate.

In some embodiments, the plurality of rows of sub-pixels further comprise non-target rows of sub-pixels, and each sub-pixel comprised in the same non-target row of sub-pixels is located in the same display sub-region. The plurality of scanning lines further comprises a plurality of second scanning lines. One of the second scanning lines is respectively coupled to each of sub-pixels in a corresponding non-target row of sub-pixels.

Illustratively, as shown in FIG. 1, the non-target row of sub-pixels are located at a display sub-region 101 in the second row and the plurality of second scanning lines are located in the display sub-region 101 in the second row. Illustratively, the second scanning line includes, but the present disclosure is not limited to, a first gate line.

Illustratively, the plurality of rows of sub-pixels comprises a plurality of non-target rows of sub-pixels, the plurality of non-target rows of sub-pixels are arranged along the second direction. Each non-target row of sub-pixels comprises a plurality of sub-pixels arranged along the first direction, and each of sub-pixels comprised in the same non-target row of sub-pixels is located in the same display sub-region. The second scanning line to which the non-target row of sub-pixels is coupled is located in the same display sub-region as the non-target row of sub-pixels.

Illustratively, the second scanning line does not include a plurality of line segments and is a one-piece structure along the first direction.

Illustratively, each sub-pixel in the non-target row of sub-pixels can be sequentially arranged from a left border of the display region 10 to a right border of the display region 10. The second scanning line may extend from a left side of the display region 10 to a right side of the display region 10.

With the arrangement that the plurality of rows of sub-pixels further comprises non-target rows of sub-pixels, and the arrangement that the plurality of scanning lines further comprises the plurality of the second scanning lines, the display substrate is enabled to comprise such a display sub-region which extends across the whole display region 10 along the first direction, so that a variety of split-screen modes can be realized in the display substrate.

In some embodiments, as shown in FIGS. 3 to 9, the display region 10 comprises two display sub-regions arranged along the first direction, the first scanning line 31 comprises two scanning line segments 310 arranged along the first direction, and at least a portion of the scanning line segment 310 is located in a corresponding display sub-region.

Alternatively, the display region 10 comprises at least three display sub-regions arranged along the first direction, the first scanning line 31 comprises at least three scanning line segments 310 arranged along the first direction, and at least a portion of the scanning line segment 310 are located in a corresponding display sub-region.

Illustratively, the display region 10 comprises two display sub-regions arranged along the first direction, areas of the two display sub-regions are the same or different. By arranging the display region 10 to comprise two display sub-regions arranged along the first direction, the display substrate is enabled to realize left and right split-screen refreshing.

Illustratively, the display region 10 comprises at least three display sub-regions arranged along the first direction, areas of the at least three display sub-regions may be the same or different. Sub-pixels in each display sub-region can be independently controlled by a scanning line segment 310 coupled thereto.

In some embodiments, as shown in FIGS. 1 and 2, the display region 10 further comprises a plurality of display sub-regions distributed in an array, the plurality of display sub-regions are divided into a plurality of rows of display sub-regions, a quantity of display sub-regions comprised in each row of display sub-regions may be the same or different.

Illustratively, in the plurality of display sub-regions distributed in an array, and areas of display sub-regions may be the same or different. A boundary between adjacent display sub-regions may extend in the second direction or in a direction having an angle with respect to the second direction.

By arranging the display region 10 to comprise the plurality of display sub-regions distributed in an array, different frequency refreshing rate at multiple regions in the display substrate can be realized, which can further reduce the power consumption of the display substrate.

Figure 3:
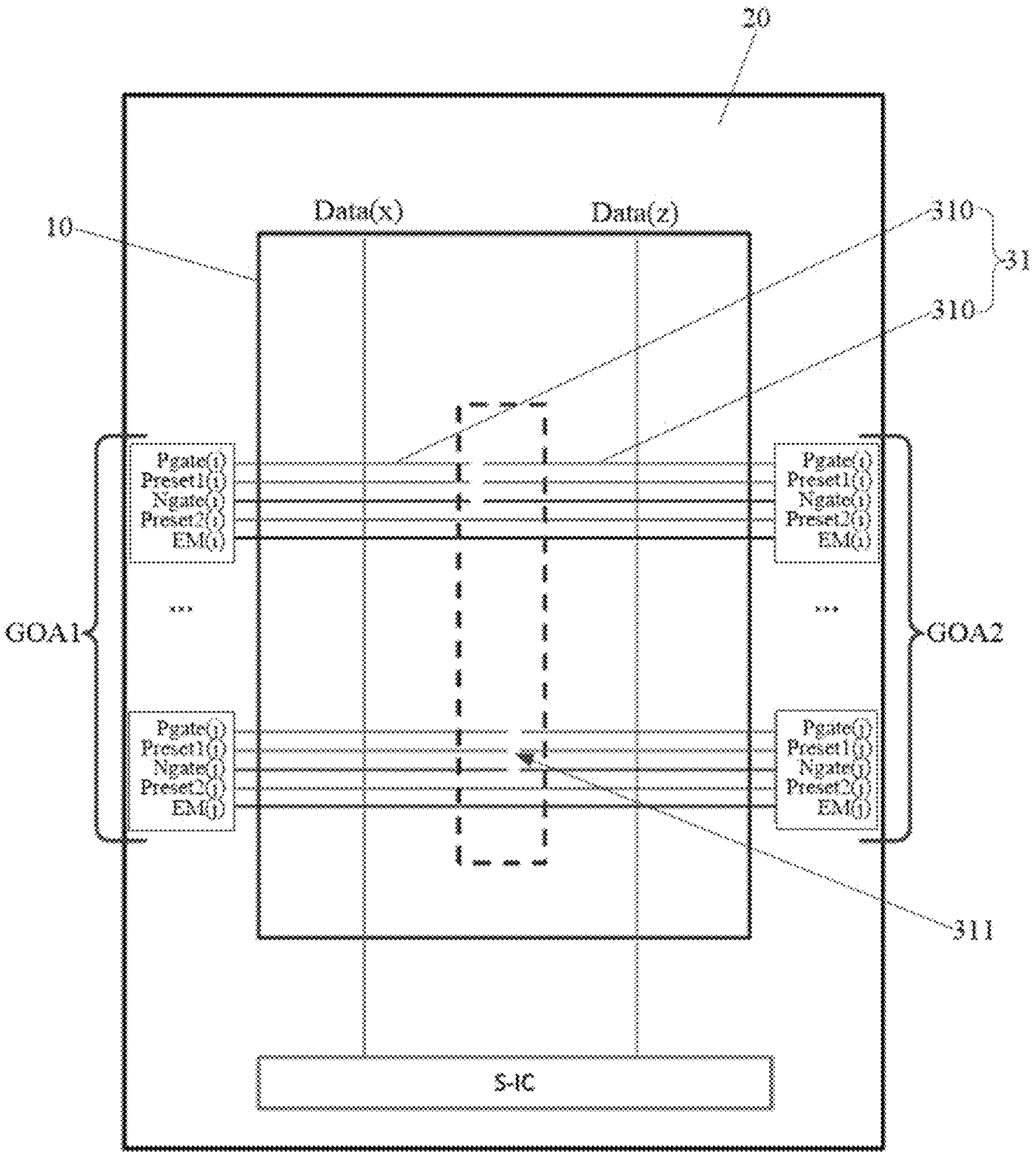
FIG. 3 is a schematic diagram of a first layout of a display substrate provided in an embodiment of the present disclosure.
Figure 4:
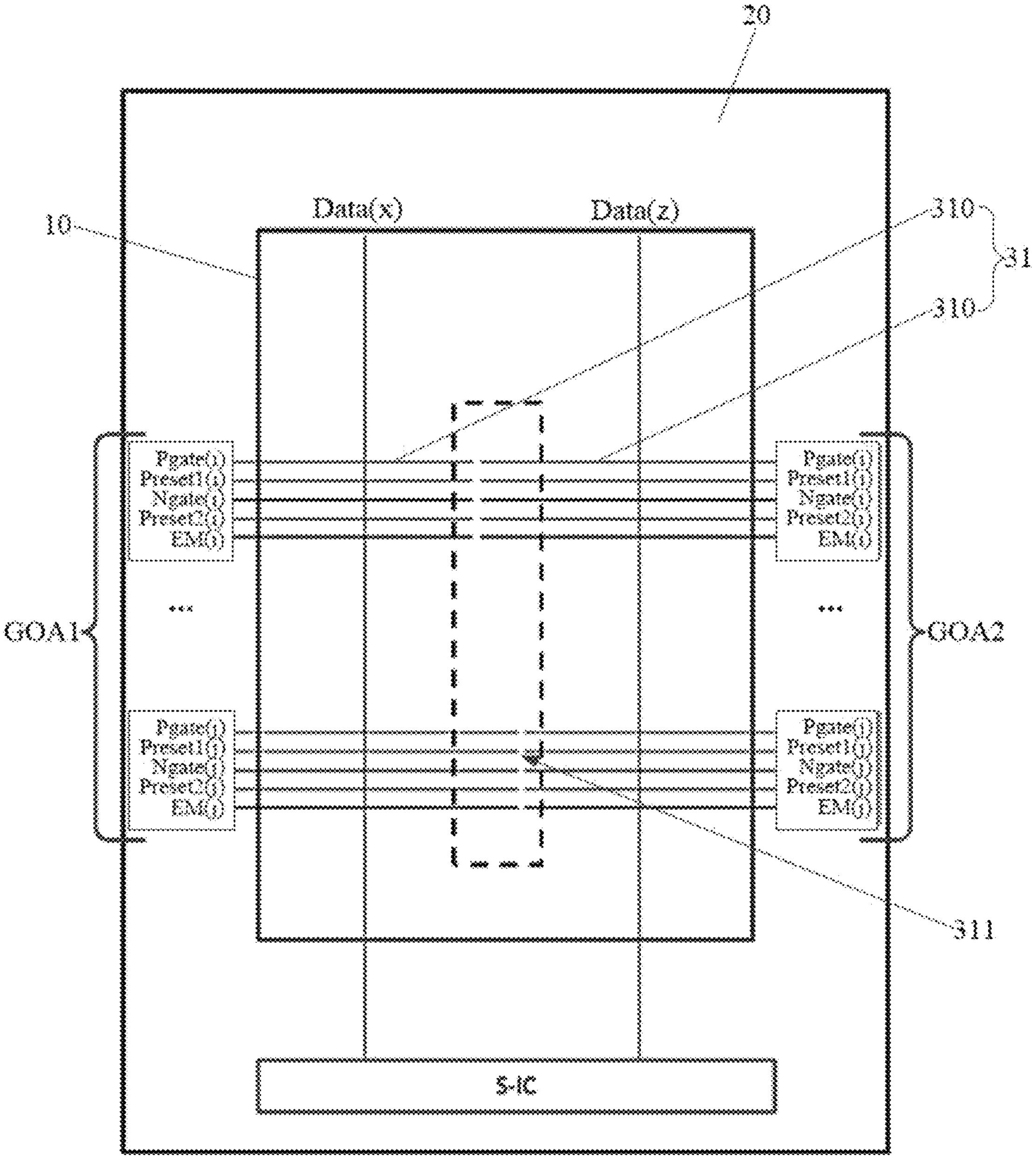
FIG. 4 is a schematic diagram of a second layout of a display substrate provided in an embodiment of the present disclosure.

As shown in FIGS. 3 and 4, in some embodiments, in one single first scanning line 31, there is an n-th spacing region 311 between the n-th scanning line segment and the (n+1)-th scanning line segment, wherein n is an integer greater than or equal to 1. In at least some of the first scanning lines 31, n-th spacing regions 311 is displaced at a distance in the first direction.

Figure 5:
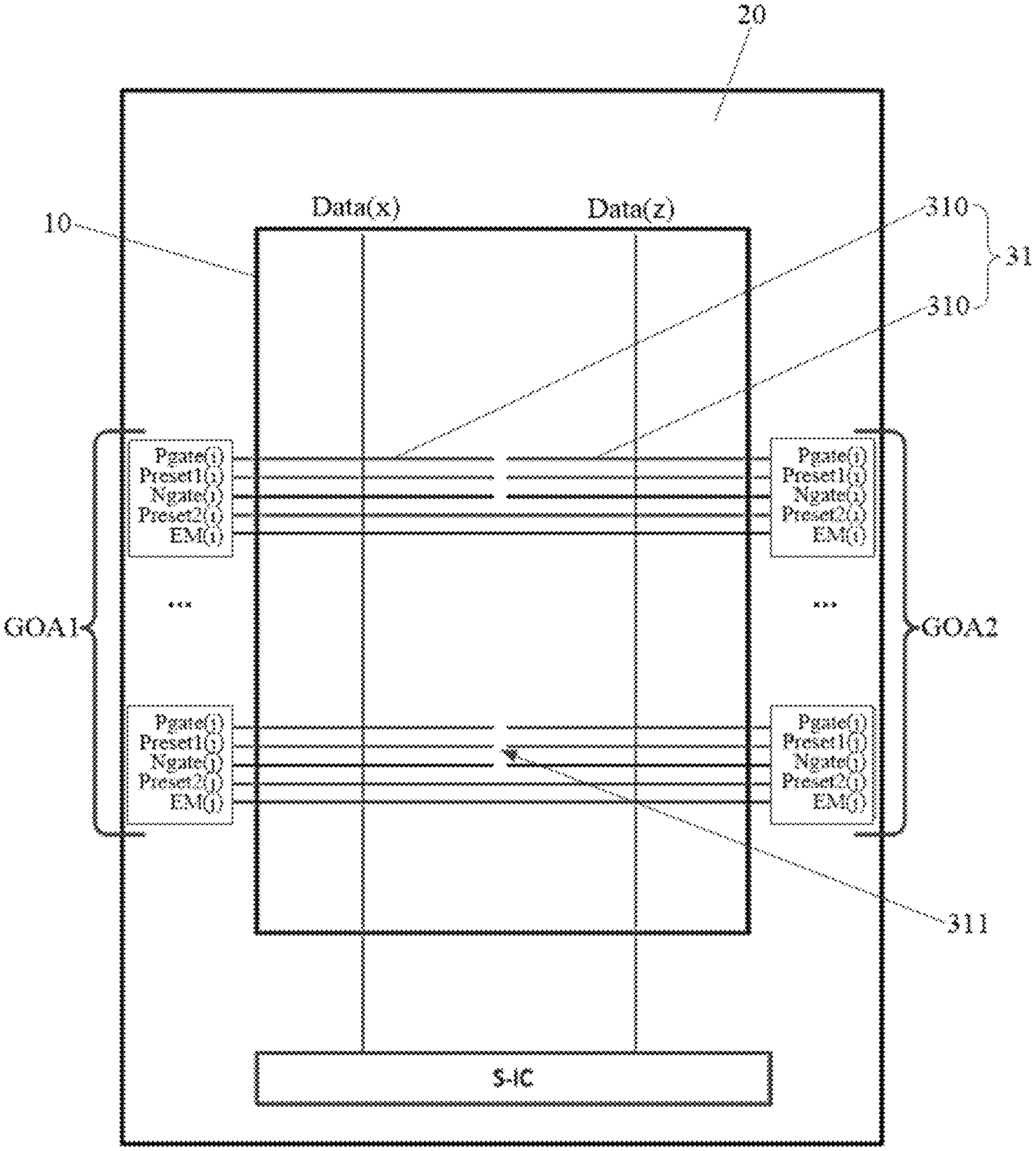
FIG. 5 is a schematic diagram of a third layout of a display substrate provided in an embodiment of the present disclosure.
Figure 6:
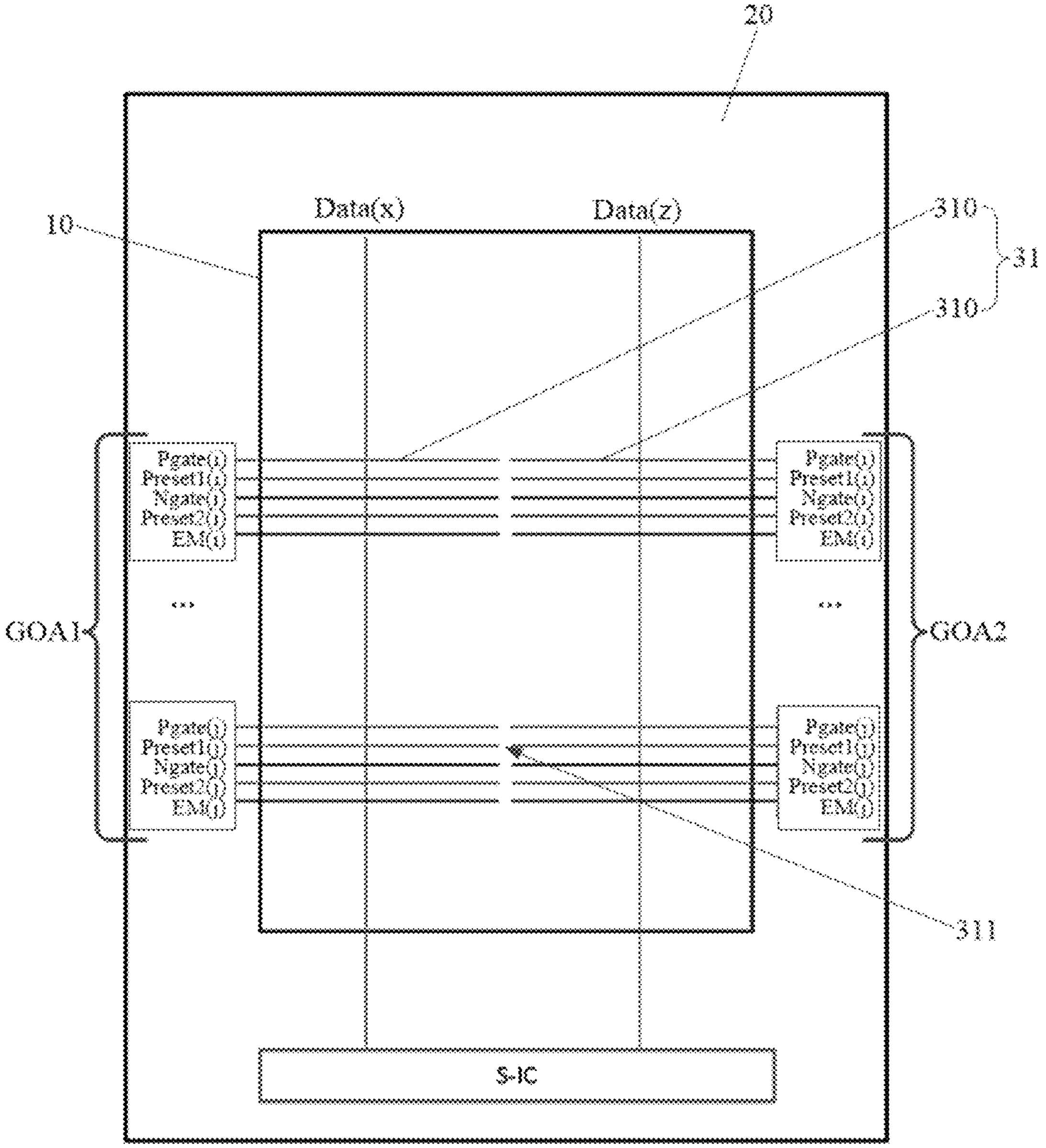
FIG. 6 is a schematic diagram of a fourth layout of a display substrate provided in an embodiment of the present disclosure.

As shown in FIGS. 5 and 6, in some embodiments, in one single first scanning line 31, there is an n-th spacing region 311 between an n-th scanning line segment 310 and an (n+1)-th scanning line segment 310, wherein n is an integer greater than or equal to 1. In at least some of the first scanning lines 31, n-th spacing regions 311 are located in the same column in the second direction.

It is noted that the above-mentioned spacing region 311 is at a position where the first scanning line 31 is disconnected, i.e., a region between adjacent scanning line segments 310 in the first direction.

Figure 12:
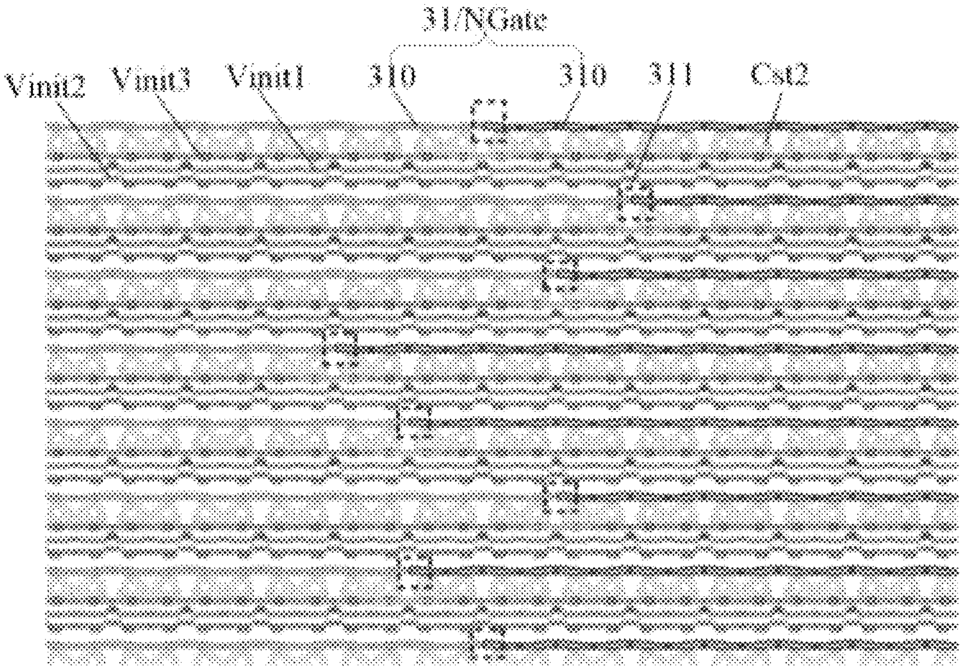
FIG. 12 is a schematic layout diagram of a second gate metal layer and a third gate metal layer of a display substrate provided in an embodiment of the present disclosure.

Illustratively, as shown in FIG. 12, in at least some of the first scanning lines 31, each of the at least some of the first scanning lines 31 has an n-th spacing region, and the n-th spacing regions are displaced with each other in the first direction.

Illustratively, in different types of the first scanning lines 31, the n-th spacing regions are located at different positions in the first direction. For example, in an n-th spacing region provided in the first gate line NGate, an n-th spacing region provided in the second gate line PGate, an n-th spacing region provided in the first reset line Preset1, an n-th spacing region provided in the second reset line Preset2, and an n-th spacing region provided in the light-emitting control line EM, n-th spacing regions in at least two different types of signal lines located at different positions in the first direction. For example, the n-th spacing region provided in the first gate line NGate is shift with respect to the n-th spacing region provided in the second gate line PGate.

Illustratively, in at least some of the first scanning lines 31, n-th spacing regions included in the first scanning lines 31 are located in the same column in the second direction.

In the display substrate provided in the above-mentioned embodiment, by arranging the n-th spacing regions in the at least some of the first scanning lines 31 to be located at different positions in the first direction, or the n-th spacing regions in the at least some of the first scanning lines 31 to be located in the same column in the second direction, a boundary between adjacent display sub-regions can be advantageously blurred, namely, blurring a split-screen position of the display substrate. In this way there is no explicit split-screen boundary when performing the split-screen refreshing, thereby improving the split-screen displaying quality.

In some embodiments, the target row of sub-pixels includes m sub-pixels arranged along a first direction, where m is a positive integer. A layout range of the n-th spacing region is between (m/2−a) and (m/2+a), where (m/2−a) represents the (m/2−a)-th sub-pixel, and (m/2+a) represents the (m/2+a)-th sub-pixel. The parameter "a" meets: $a*d1 \leq d$, where d1 is a width of a layout region occupied by one sub-pixel in the first direction and d is the width of the display region 10 in the first direction.

Illustratively, in each target row of sub-pixels, the n-th spacing region may be arranged any position which is ed between the (m/2−a)-th sub-pixel and the (m/2+a)-th sub-pixel. Note that a layout position of the (m/2)-th sub-pixel is located approximately at a center position of the display region 10 in the first direction.

Illustratively, in the plurality of first scanning lines 31, an n-th spacing region of an odd-numbered first scanning line 31 is shifted from an n-th spacing region of an even-numbered first scanning line 31 in the first direction.

Illustratively, in the plurality of first scanning lines 31, the n-th spacing region of the odd-numbered first scanning line 31 is adjacent to the (m/2−a)-th sub-pixel, and the n-th spacing region of the even-numbered first scanning line 31 is adjacent to the (m/2+a)-th sub-pixel.

In the display substrate provided in the above-mentioned embodiment, positions of the n-th spacing regions included in various first scanning lines 31 can be distributed non-fixedly from the (m/2−a)-th sub-pixel to the (m/2+a)-th sub-pixel, so that the split-screen position of the display substrate can be effectively blurred to ensure that there is no clear split-screen boundary when performing the split-screen refreshing, thereby improving the split-screen displaying quality.

As shown in FIGS. 3 to 9, in some embodiments, the display substrate further comprises a first gate driving circuit GOA1 to a k-th gate driving circuit, wherein the first scanning line 31 comprises k scanning line segments 310 arranged along the first direction, with k being an integer greater than or equal to 2.

The first gate driving circuit GOA1 and the k-th gate driving circuit are located in the peripheral region 20 and are oppositely disposed in first direction, and the display region 10 is located between the first gate driving circuit GOA1 and the k-th gate driving circuit.

The first gate driving circuit GOAL is coupled to a 1-st scanning line segment 310 adjacent to the first gate driving circuit GOA1, and the k-th gate driving circuit is coupled to a k-th scanning line segment 310 adjacent to the k-th gate driving circuit.

Illustratively, the display substrate is divided into a first display sub-region and a second display sub-region arranged along first direction. Namely, k=2, the first gate driving circuit GOA1 is located at the left frame of the display substrate and is close to the first display sub-region, and the second gate driving circuit GOA2 is located at the right frame of the display substrate and is close to the second display sub-region. The first gate driving circuit GOA1 is coupled to a plurality of first scanning line segments 310 in the first display sub-region. The second gate driving circuit GOA2 is coupled to a plurality of second scanning line segments 310 in the second display sub-region.

Illustratively, the gate driving circuits each include a plurality of shift register units. Each shift register unit is coupled to a at least one corresponding scanning line segment 310, and is configured for providing a respective scanning signal to the at least one scanning line segment 310.

By arranging the first gate driving circuit GOA1 to be coupled to the 1-st scanning line segment 310 adjacent thereto, and the k-th gate driving circuit to be coupled to the k-th scanning line segment 310 adjacent thereto, the layout difficulty of the gate driving circuit is minimized to the maximum extent while ensuring the scanning signal can be provided to the scanning line segment 310, such an arrangement is also beneficial to realize a narrow bezel design of the display substrate.

Figure 7:
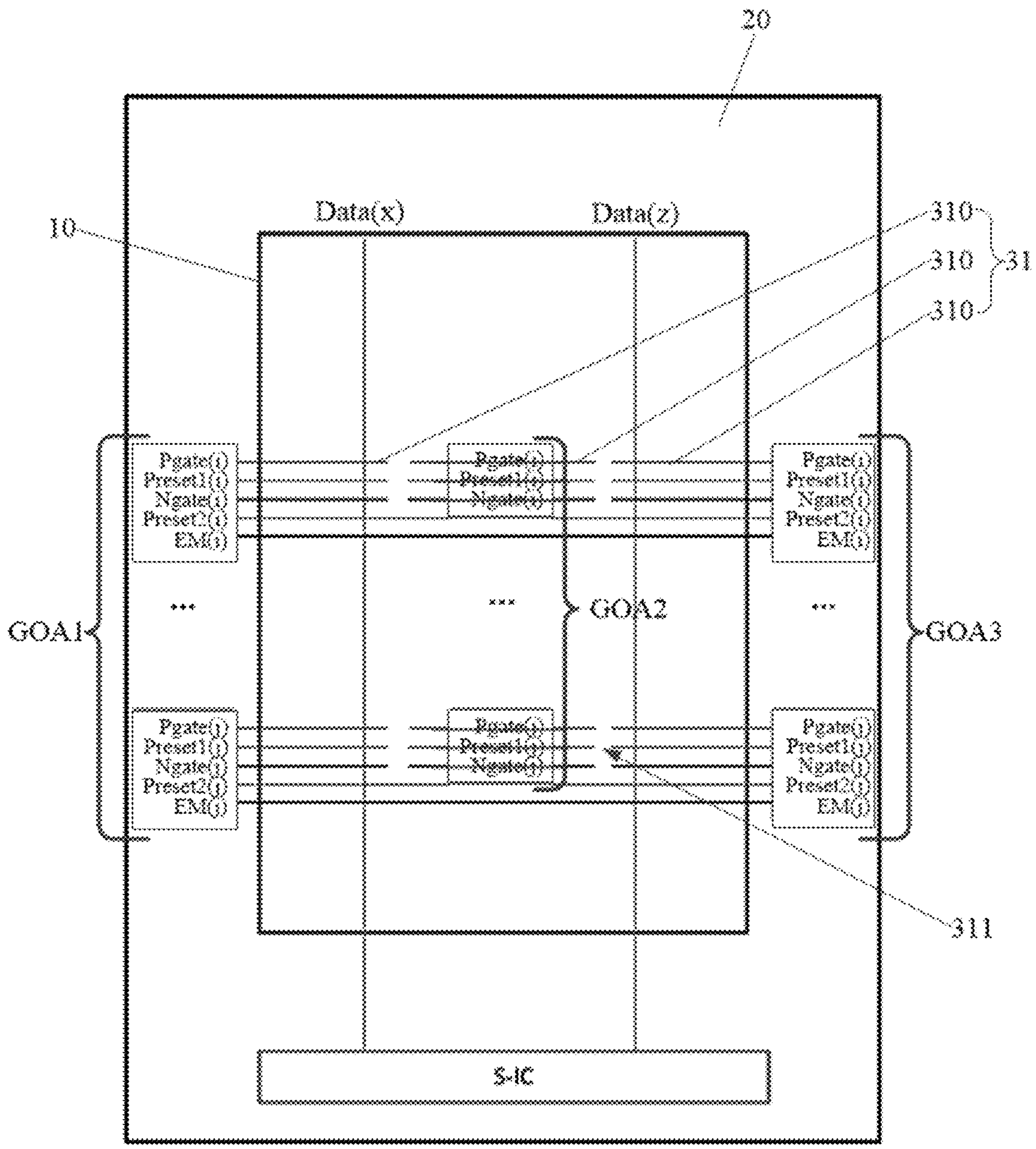
FIG. 7 is a schematic diagram of a fifth layout of a display substrate provided in an embodiment of the present disclosure.
Figure 8:
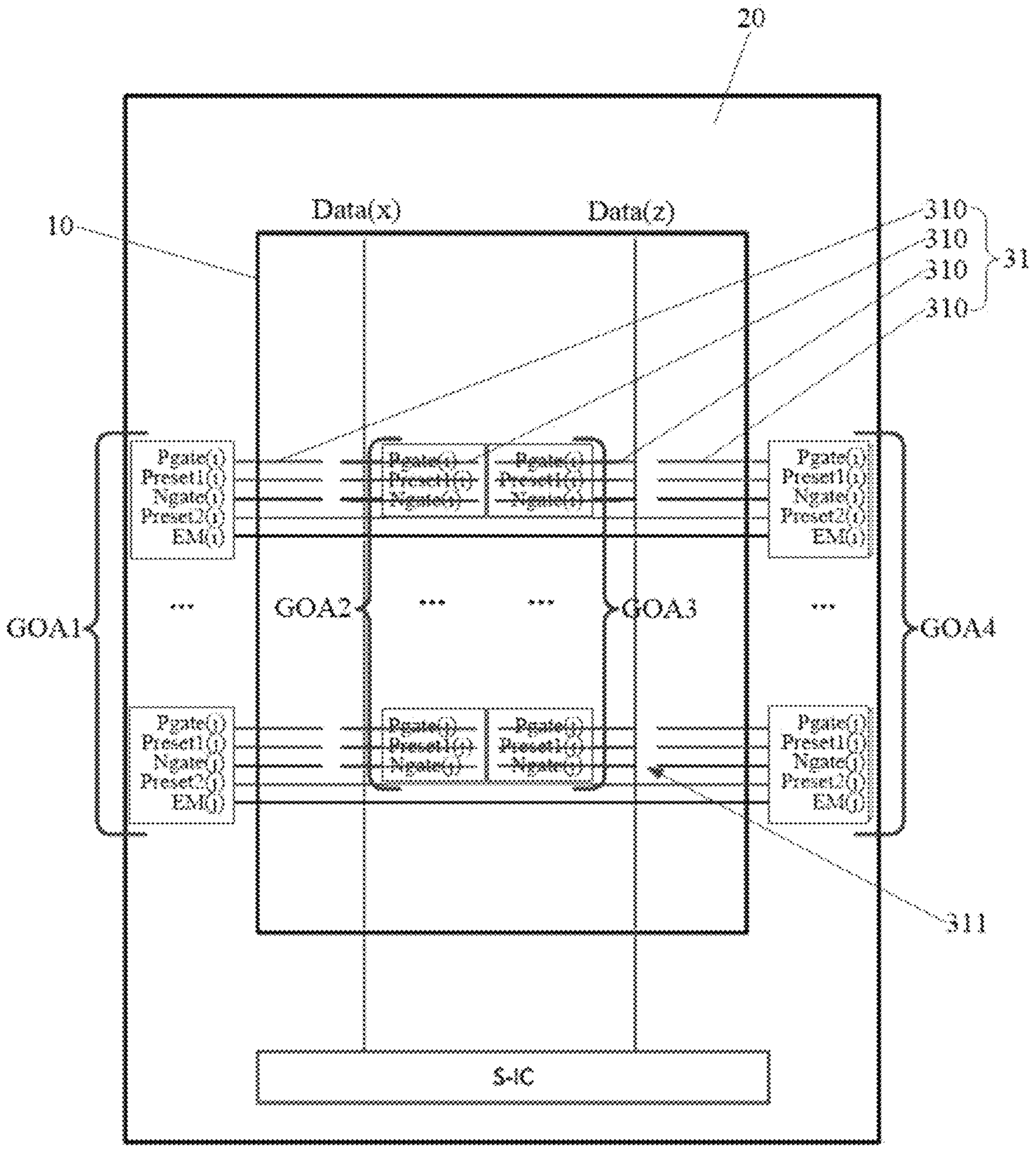
FIG. 8 is a schematic diagram of a sixth layout of a display substrate provided in an embodiment of the present disclosure.
Figure 9:
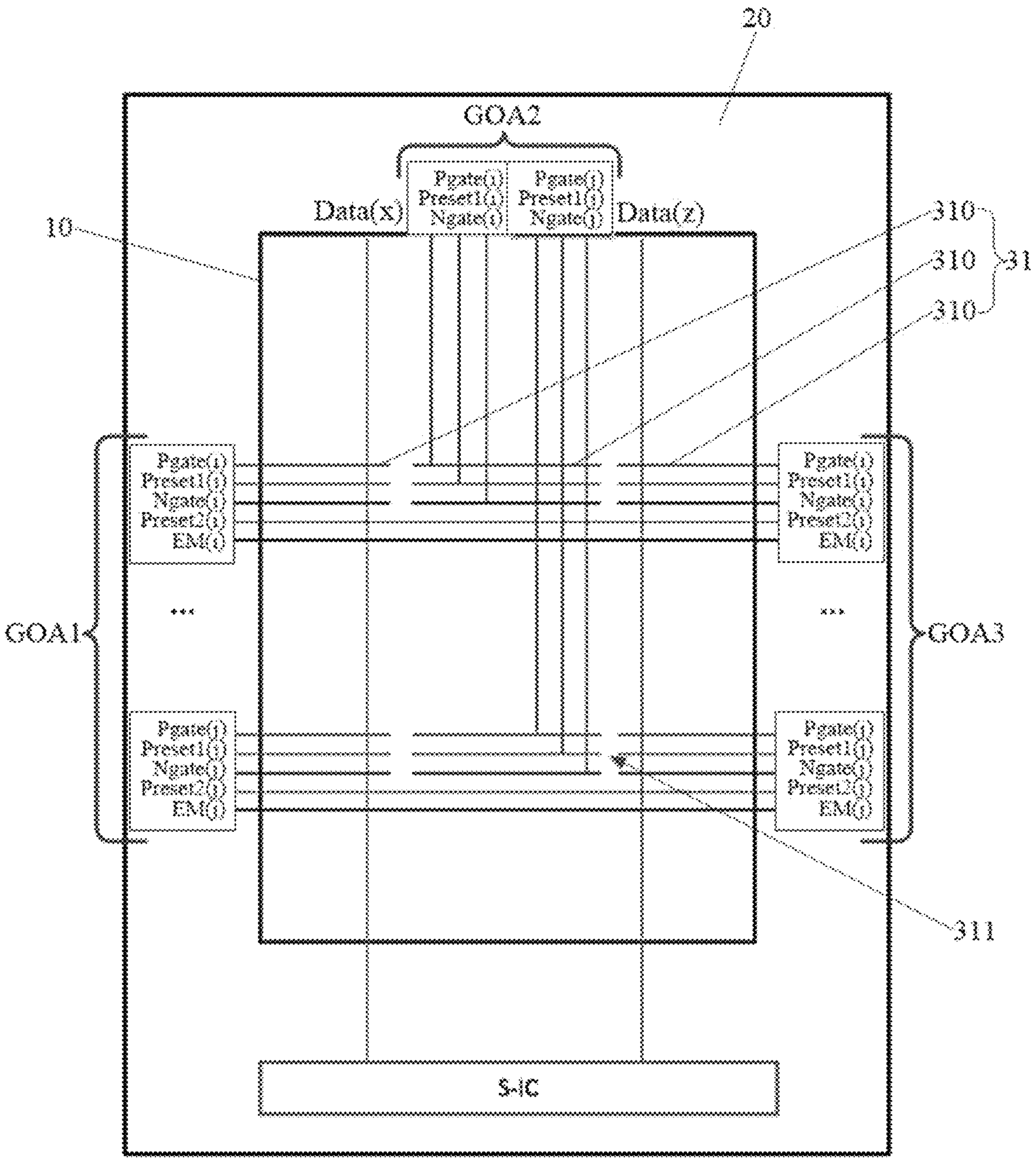
FIG. 9 is a schematic diagram of a seventh layout of a display substrate provided in an embodiment of the present disclosure.

As shown in FIGS. 7 to 9, in some embodiments, k is an integer greater than or equal to 3; the second gate driving circuit GOA2 to the (k−1)-th gate driving circuit are located in the display region 10; and the y-th gate driving circuit is coupled to the y-th scanning line segment 310, where y is an integer satisfying 2≤y≤k−1.

Illustratively, each of the second gate driving circuits GOA2 to the (k−1)-th gate driving circuit is located in a display sub-region where the scanning line segment 310 coupled thereto is located, but the present disclosure is not limited thereto.

Illustratively, as shown in FIG. 7, a case where k=3 is illustrated, the second gate driving circuit GOA2 is located in the display region 10 and the third gate driving circuit GOA3 is located at the right frame.

Illustratively, as shown in FIG. 8, a case where k=4 is illustrated, the second gate driving circuit GOA2 and the third gate driving circuit GOA3 are located in the display region 10, and the fourth gate driving circuit GOA4 is located in the right frame.

By arranging the second gate driving circuit GOA2 to the (k−1)-th gate driving circuit to be located in the display region 10, and the y-th gate driving circuit to be coupled to the y-th scanning line segment 310, a difficulty in connecting the scanning line segment 310 located at a middle position (namely, not the first segment and the last segment) to a corresponding gate driving circuit can be reduced, which is also beneficial to realize the narrow bezel design of the display substrate.

As shown in FIG. 9, in some embodiments, k is an integer greater than or equal to 3. The second gate driving circuit GOA2 to the (k−1)-th gate driving circuit are located at the peripheral region 20, and the second gate driving circuit GOA2 to the (k−1)-th gate driving circuit are located at one side of the display region 10 in the second direction. The y-th gate driving circuit is coupled to the y-th scanning line segment 310, and y is an integer satisfying 2≤y≤k−1.

As shown in FIG. 9, a case where k=3 is illustrated, the second gate driving circuit GOA2 is located at one side of the display region 10 in the second direction, and the third gate driving circuit GOA3 is located at the right frame. The first gate driving circuit GOAL is located at the left frame.

Illustratively, the second gate driving circuits GOA2 to the (k−1)-th gate driving circuit are located at the upper frame of the display substrate, but the present disposed is not limited thereto. The driving chip S-IC comprised in the display substrate is located on the lower frame.

Illustratively, the y-th gate driving circuit is coupled to the y-th scanning line segment 310 via a transparent conductive connection line which may be made of indium tin oxide (ITO) and may be formed in the same patterning process as other film layers made of ITO in the display substrate, but the present disclosure is not limited thereto.

Illustratively, the transparent conductive connection line comprises at least a portion extending in the second direction.

Illustratively, the transparent conductive connection line may extend in the same direction as a data line Data or in the same direction as a power supply line ELVDD, but the present disclosure is not limited thereto.

By arranging the second gate driving circuit GOA2 to the (k−1)-th gate driving circuit to be located at one side of the display region 10 in the second direction a reduction in the layout space for the sub-pixels inside the display region 10 can be avoided, which can effectively reduce a difficulty in the layout design of the gate driving circuit.

In some embodiments, the display substrate further comprises: a plurality of power supply lines ELVDD, a plurality of data lines Data, a plurality of first initialization signal lines Vinit1, a plurality of second initialization signal lines Vinit2, a plurality of third initialization signal lines Vinit3, a plurality of first gate lines NGate, a plurality of second gate lines PGate, a plurality of first reset lines Preset1, a plurality of second reset lines Preset2 and a plurality of light-emitting control lines EM. The power supply line ELVDD includes at least a portion extending in the second direction. The data line Data includes at least a portion extending in the second direction. The first initialization signal line Vinit1 comprises at least a portion extending in the first direction. The second initialization signal line Vinit2 comprises at least a portion extending in the first direction. The third initialization signal line Vinit3 comprises at least a portion extending in the first direction. The first gate line NGate includes at least a portion extending in the first direction. The second gate line PGate comprises at least a portion extending in the first direction. The first reset line Preset1 comprises at least a portion extending in the first direction. The second reset line Preset2 comprises at least a portion extending in the first direction. The light-emitting control line EM comprises at least a portion extending in the first direction.

The sub-pixel comprises a sub-pixel driving circuit, and the sub-pixel driving circuit adopts an 8T1C (namely, 8 transistors and 1 capacitor) structure, but the present disclosure is not limited thereto. The sub-pixel driving circuit comprises: a driving transistor T3, a first reset transistor T1, a compensation transistor T2, a data writing transistor T4, a power supply control transistor T5, a light-emitting control transistor T6, a second reset transistor T7, a third reset transistor T8 and a storage capacitor Cst.

A gate electrode of the first reset transistor T1 is coupled to a corresponding reset line, a first electrode of the first reset transistor T1 is coupled to a corresponding first initialization signal line Vinit1, and a second electrode of the first reset transistor T1 is coupled to a second electrode of the driving transistor T3.

A gate electrode of the compensation transistor T2 is coupled to a corresponding first gate line NGate, a first electrode of the compensation transistor T2 is coupled to the second electrode of the driving transistor T3, and a second electrode of the compensation transistor T2 is coupled to a gate electrode T3-*g* of the driving transistor T3.

A gate electrode of the data writing transistor T4 is coupled to a corresponding second gate line PGate, a first electrode of the data writing transistor T4 is coupled to a corresponding data line Data, and a second electrode of the data writing transistor T4 is coupled to a first electrode of the driving transistor T3.

A gate electrode of the power supply control transistor T5 is coupled to a corresponding light-emitting control line EM, a first electrode of the power supply control transistor T5 is coupled to a corresponding power supply line ELVDD, and a second electrode of the power supply control transistor T5 is coupled to the first electrode of the driving transistor T3.

A gate electrode of the light-emitting control transistor T6 is coupled to a corresponding light-emitting control line EM, a first electrode of the light-emitting control transistor T6 is coupled to the second electrode of the driving transistor T3, and a second electrode of the light-emitting control transistor T6 is coupled to an anode of a corresponding light emitting element EL.

A gate electrode of the second reset transistor T7 is coupled to a corresponding second reset line Preset2, a first electrode of the second reset transistor T7 is coupled to a corresponding second initialization signal line Vinit2, a second electrode of the second reset transistor T7 is coupled to an anode of a corresponding light-emitting element EL, and a cathode of the light-emitting element EL receives a power supply signal ELVSS.

A gate electrode of the third reset transistor T8 is coupled to a corresponding second reset line Preset2, a first electrode of the third reset transistor T8 is coupled to a corresponding third initialization signal line Vinit3, and a second electrode of the third reset transistor T8 is coupled to the first electrode of the driving transistor T3.

A first plate of the storage capacitor Cst is coupled to the gate electrode T3-*g* of the driving transistor T3, and a second plate Cst2 of the storage capacitor Cst is coupled to the power supply line ELVDD. Illustratively, the gate electrode T3-*g* of the driving transistor T3 is reused as the first plate of the storage capacitor Cst.

As shown in FIGS. 14 to 36, for example, the display substrate comprises following layers which are arranged in a stack on the base substrate in a direction away from the base substrate in the sequence listed: a light-shielding layer LS, a first active layer, a first gate insulating layer, a first gate metal layer, a second gate insulating layer, a second gate metal layer, a third gate insulating layer, a second active layer, a fourth gate insulating layer, a third gate metal layer, an interlayer insulating layer, a first source and drain metal layer, a passivation layer, a first planarization layer, a second source and drain metal layer, a second planarization layer, an anode layer, a light-emitting functional layer, a cathode layer and an encapsulation layer. Notably, other film layers may also be included in the display substrate.

Figure 16:
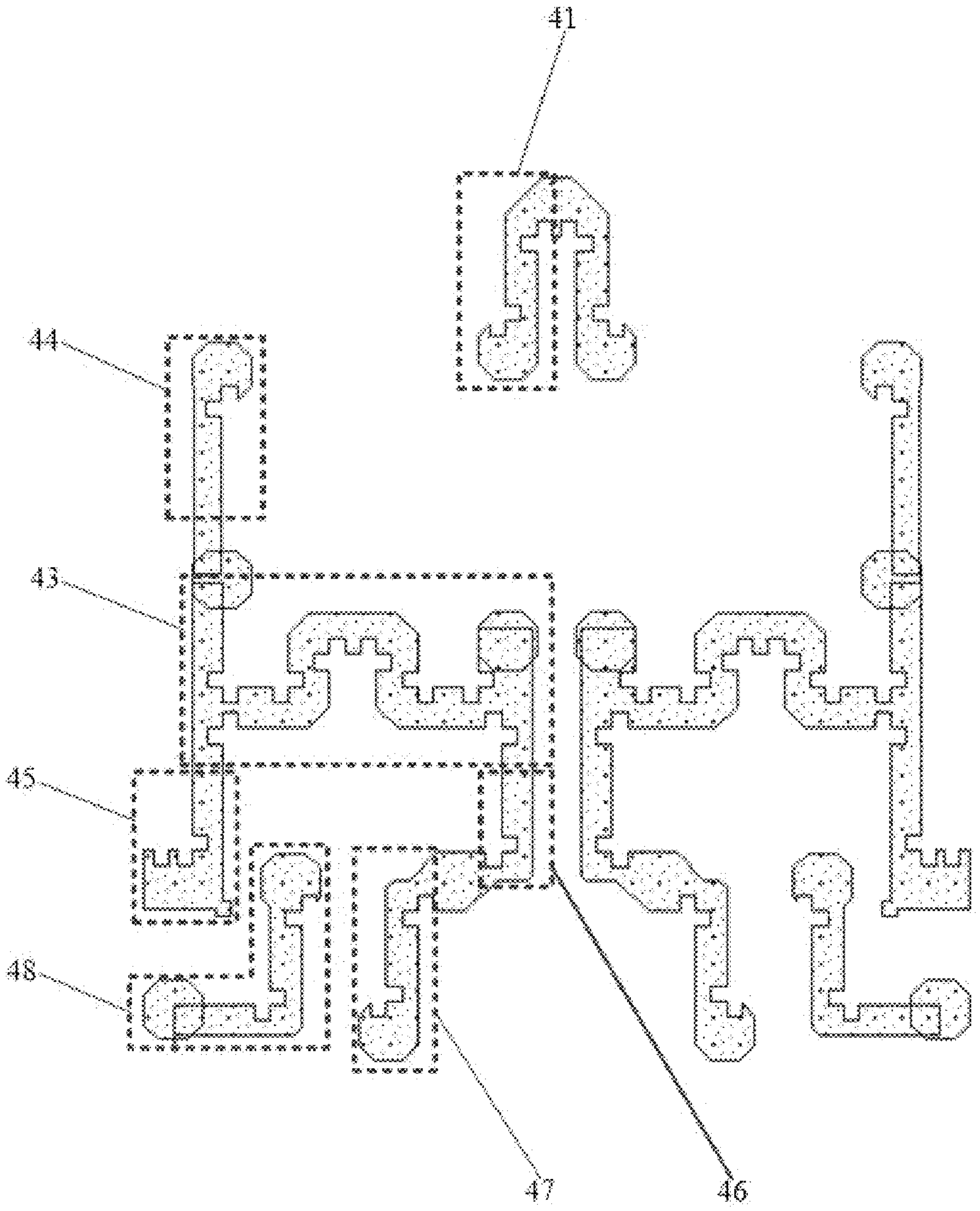
FIG. 16 is a schematic layout diagram of a first active layer corresponding to two sub-pixels provided in an embodiment of the present disclosure.
Figure 17:
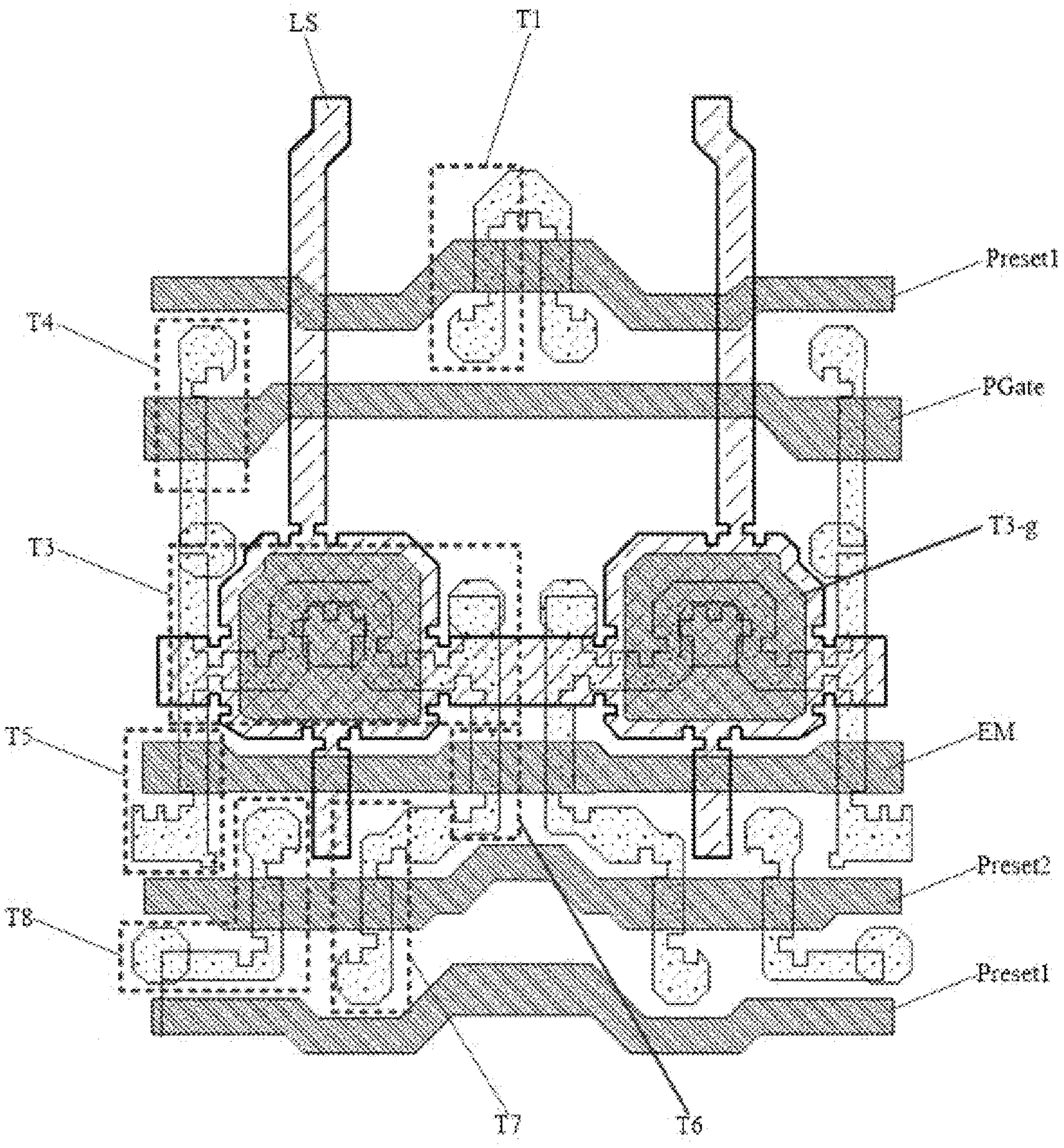
FIG. 17 is a schematic layout diagram of a first type of first gate metal layer being provided on the basis of FIG. 16.

As shown in FIGS. 16 and 17, the first active layer illustratively includes: a first active pattern 41 in the first reset transistor T1, a third active pattern 43 in the driving transistor T3, a fourth active pattern 44 in the data writing transistor T4, a fifth active pattern 45 in the power supply control transistor T5, a sixth active pattern 46 in the light-emitting control transistor T6, a seventh active pattern 47 in the second reset transistor T7, and an eighth active pattern 48 in the third reset transistor T8.

Figure 18:
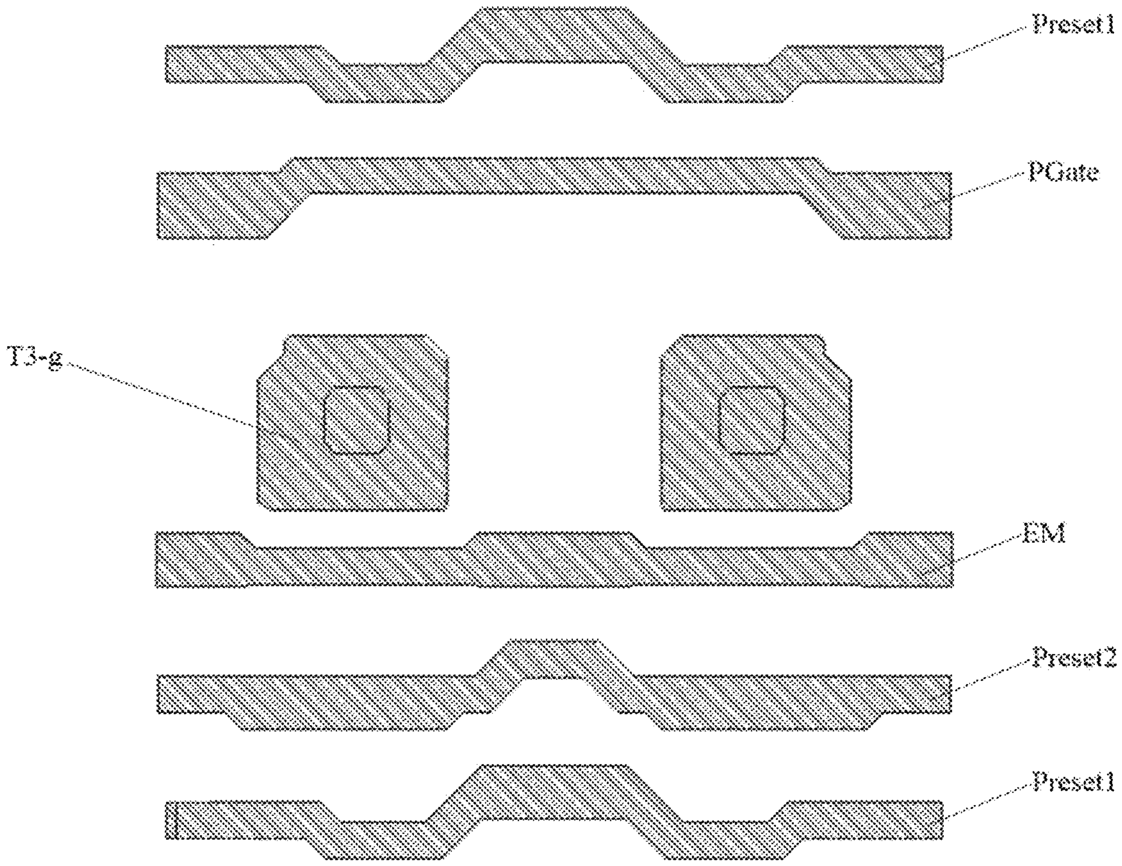
FIG. 18 is a schematic layout diagram of the first type of first gate metal layer provided in FIG. 17.
Figure 19:
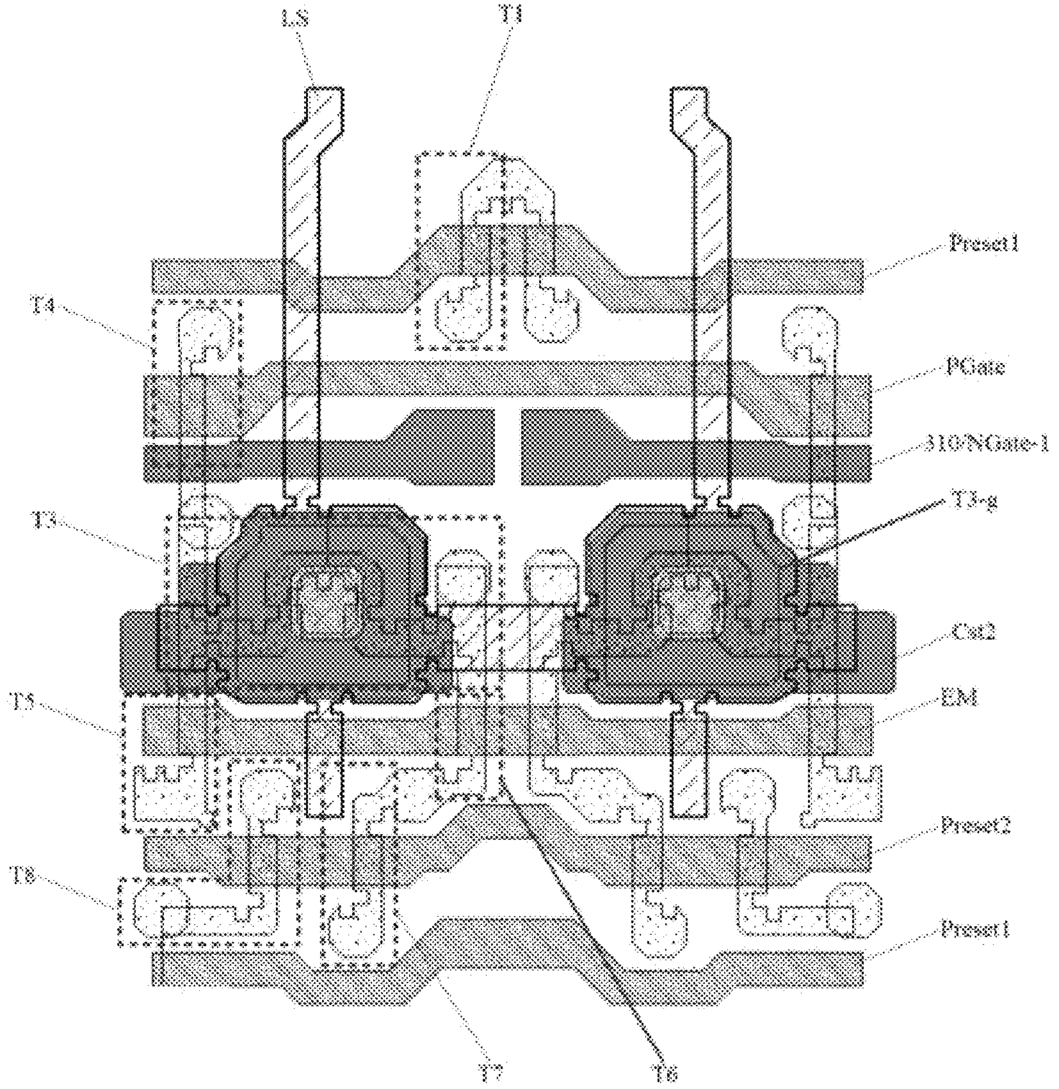
FIG. 19 is a layout diagram of a second gate metal layer being provided on the basis of FIG. 17.

As shown in FIG. 18, illustratively, the first gate metal layer comprises: a first reset line Preset1, a second gate line PGate, a gate electrode T3-*g* of the driving transistor T3, a light-emitting control line EM, a first reset line Preset1 and a second reset line Preset2.

Figure 20:
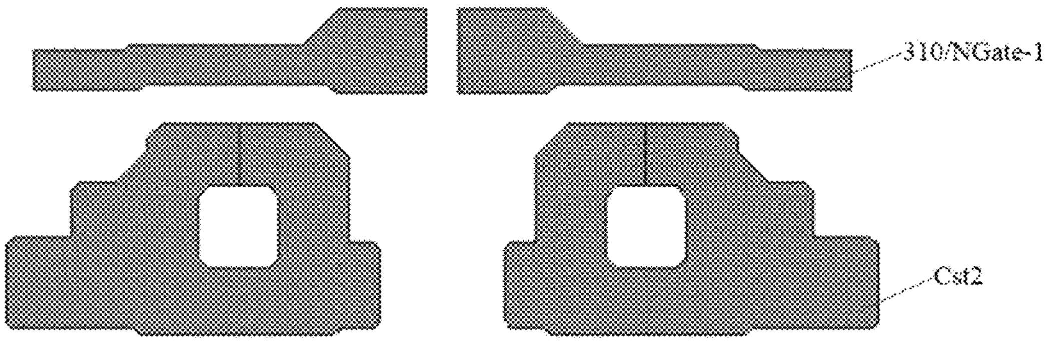
FIG. 20 is a schematic layout diagram of the second gate metal layer provided in FIG. 19.
Figure 21:
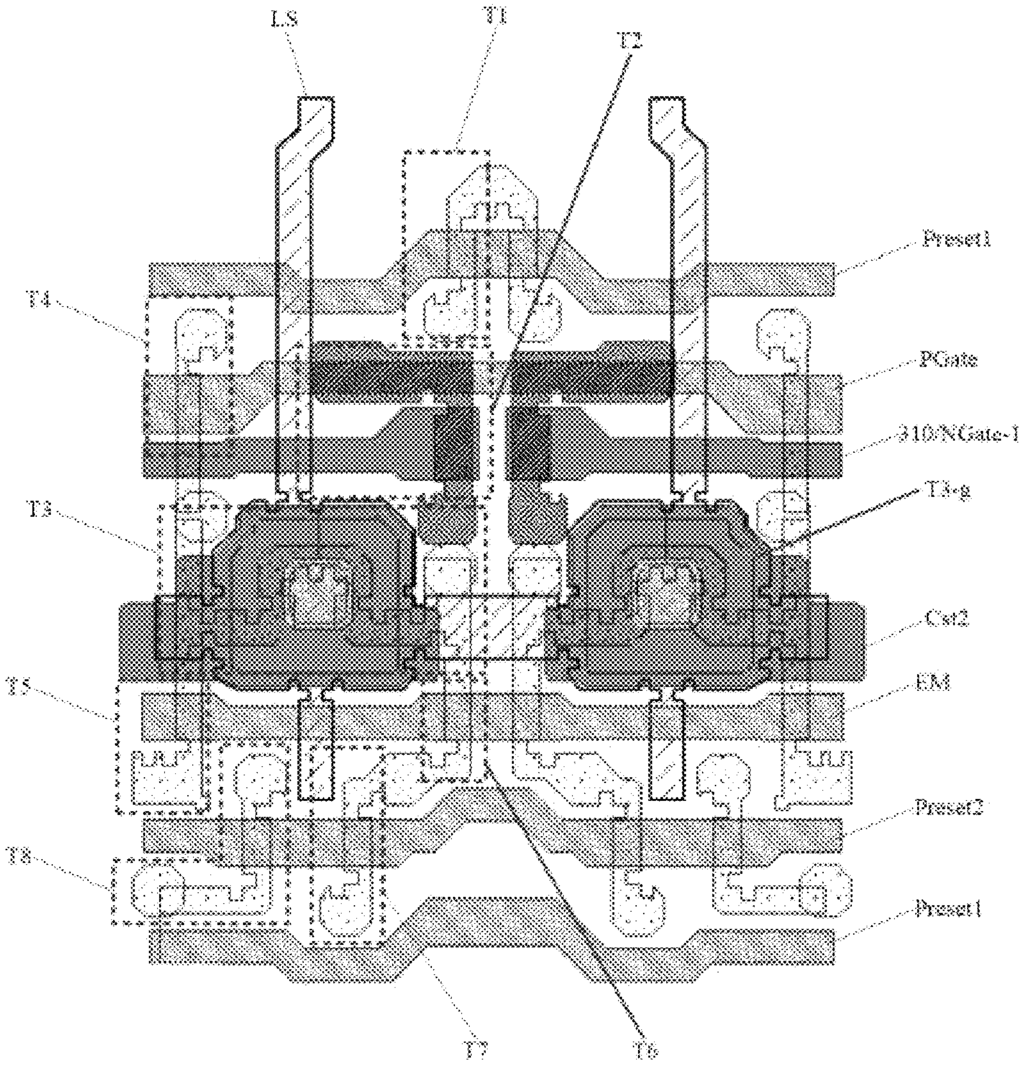
FIG. 21 is a schematic layout diagram of a second active layer being provided on the basis of FIG. 19.

As shown in FIG. 20, illustratively, the second gate metal layer comprises: a second plate Cst2 of the storage capacitor Cst, and a first gate film layer NGate-1 in the first gate line NGate.

Figure 22:
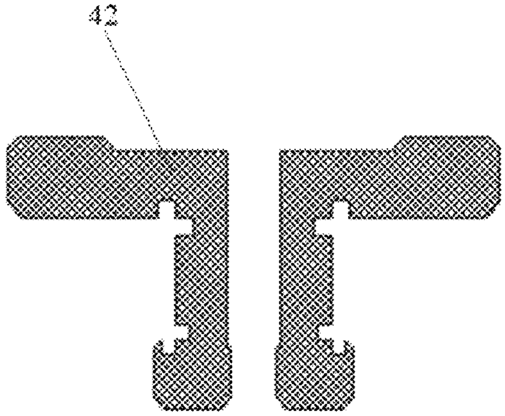
FIG. 22 is a schematic layout diagram of the second active layer provided in FIG. 21.

As shown in FIG. 22, illustratively, the second active layer comprises: a second active pattern 42 in the compensation transistor T2.

Figure 24:
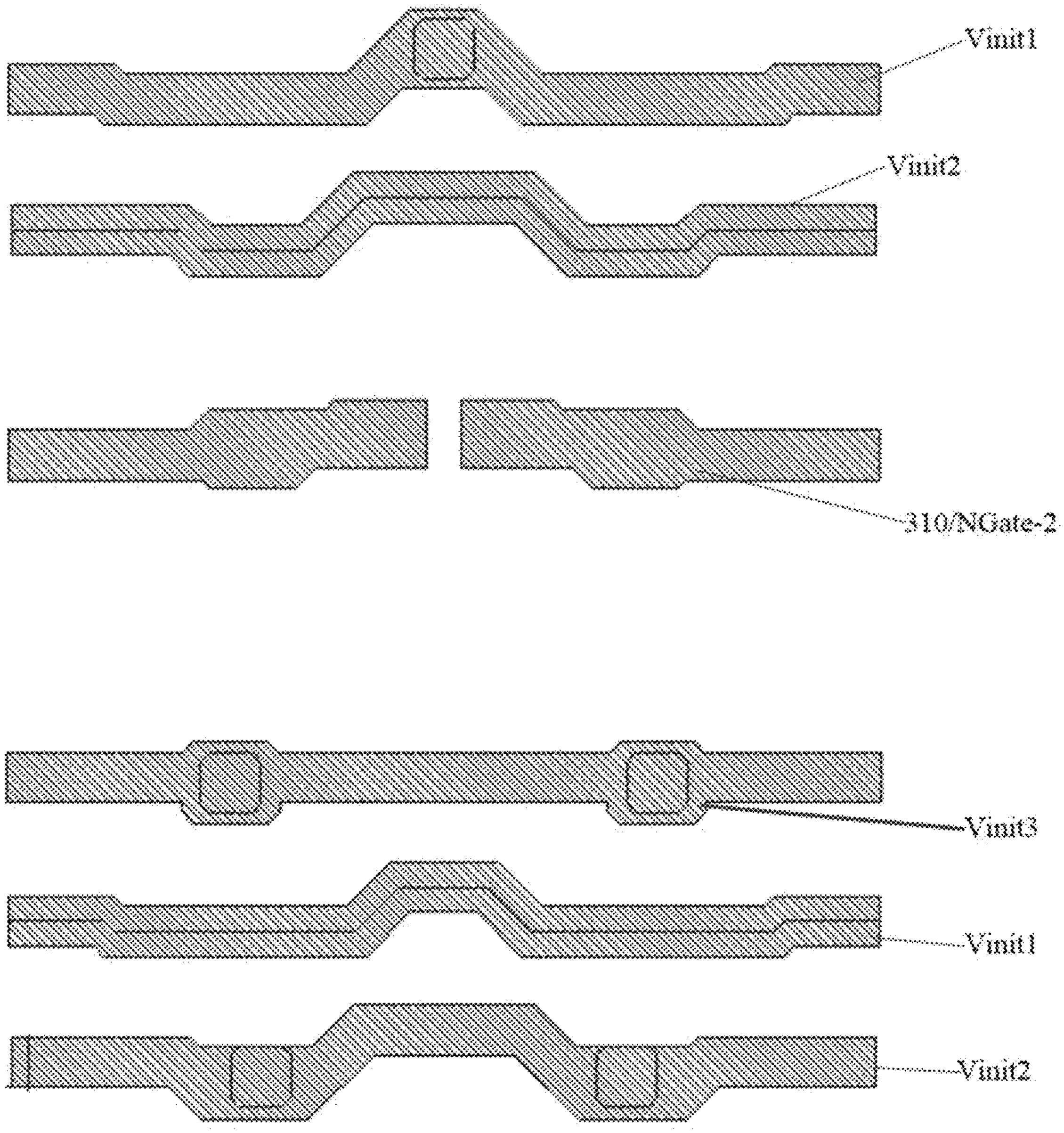
FIG. 24 is a schematic layout diagram of the third gate metal layer provided in FIG. 23.
Figure 25:
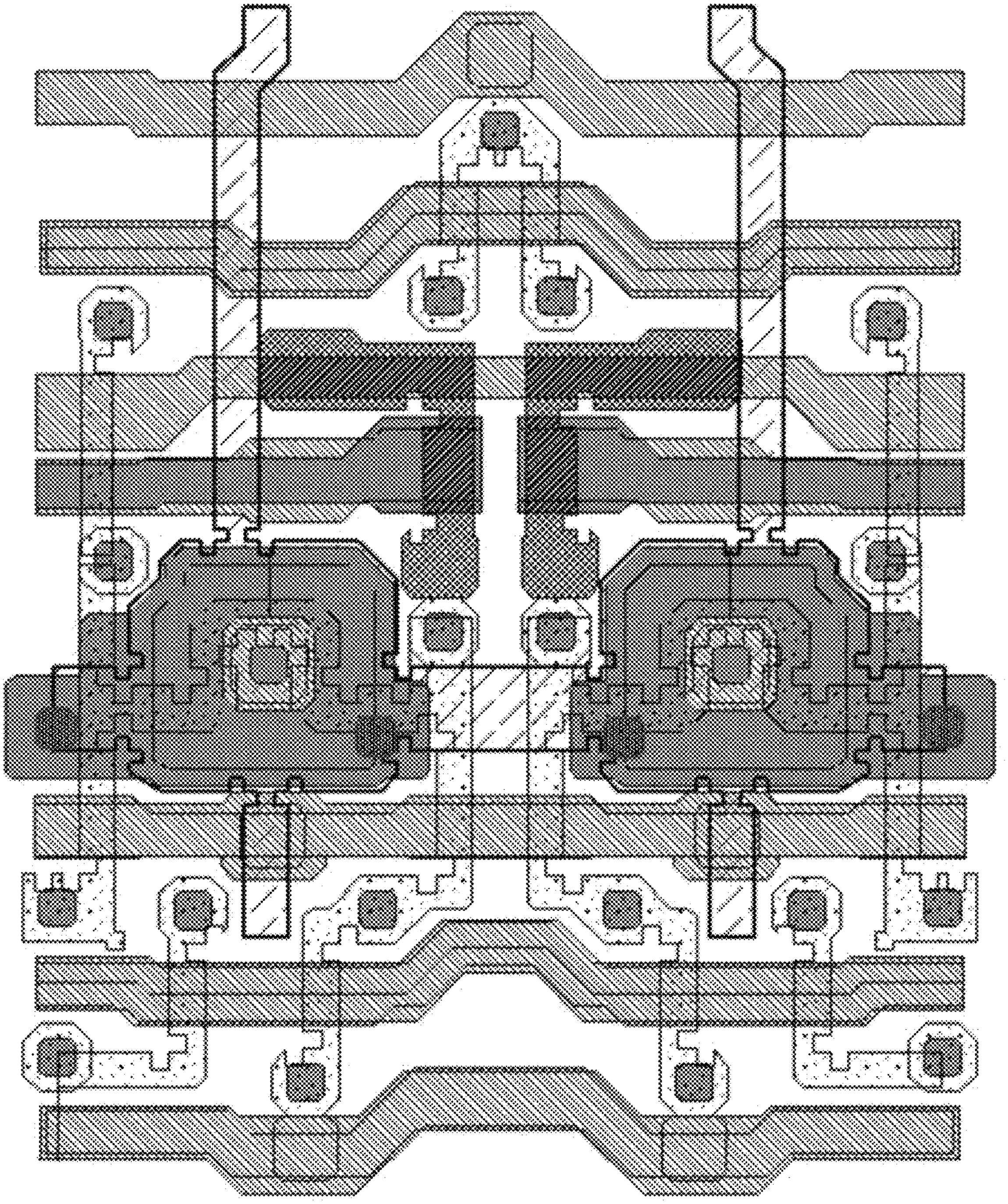
FIG. 25 is a schematic layout diagram of an interlayer insulating layer being provided on the basis of FIG. 23.

As shown in FIG. 24, illustratively, the third gate metal layer comprises: a first initialization signal line Vinit1, a second initialization signal line Vinit2, a second gate film layer NGate-2 in the first gate line NGate, and a third initialization signal line Vinit3.

Figure 26:
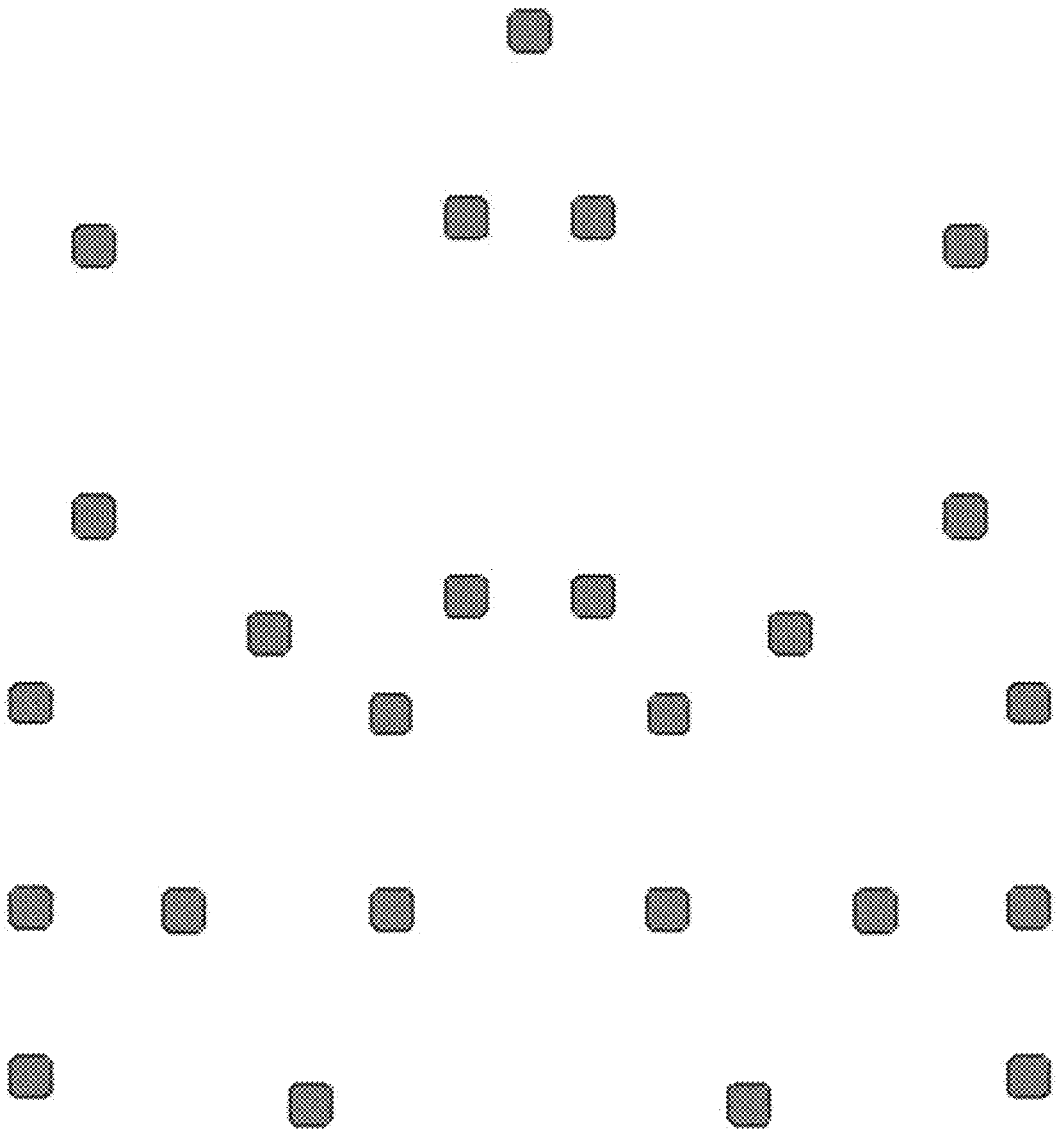
FIG. 26 is a schematic layout diagram of relatively deep via holes in the provided interlayer insulating layer in FIG. 25.
Figure 27:
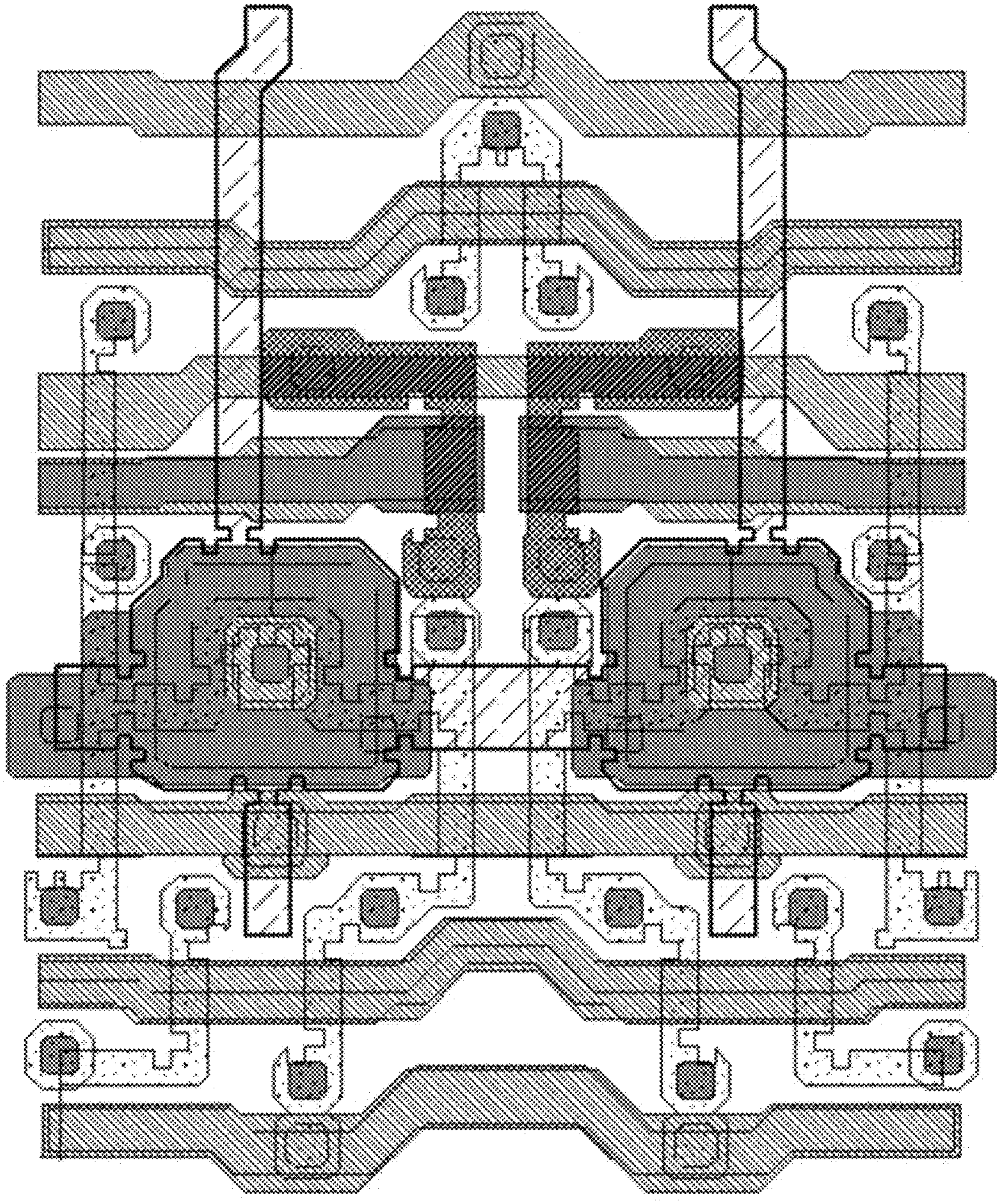
FIG. 27 is a schematic layout diagram of relatively shallow via holes formed in the provided interlayer insulating layer on the basis of FIG. 25.
Figure 28:
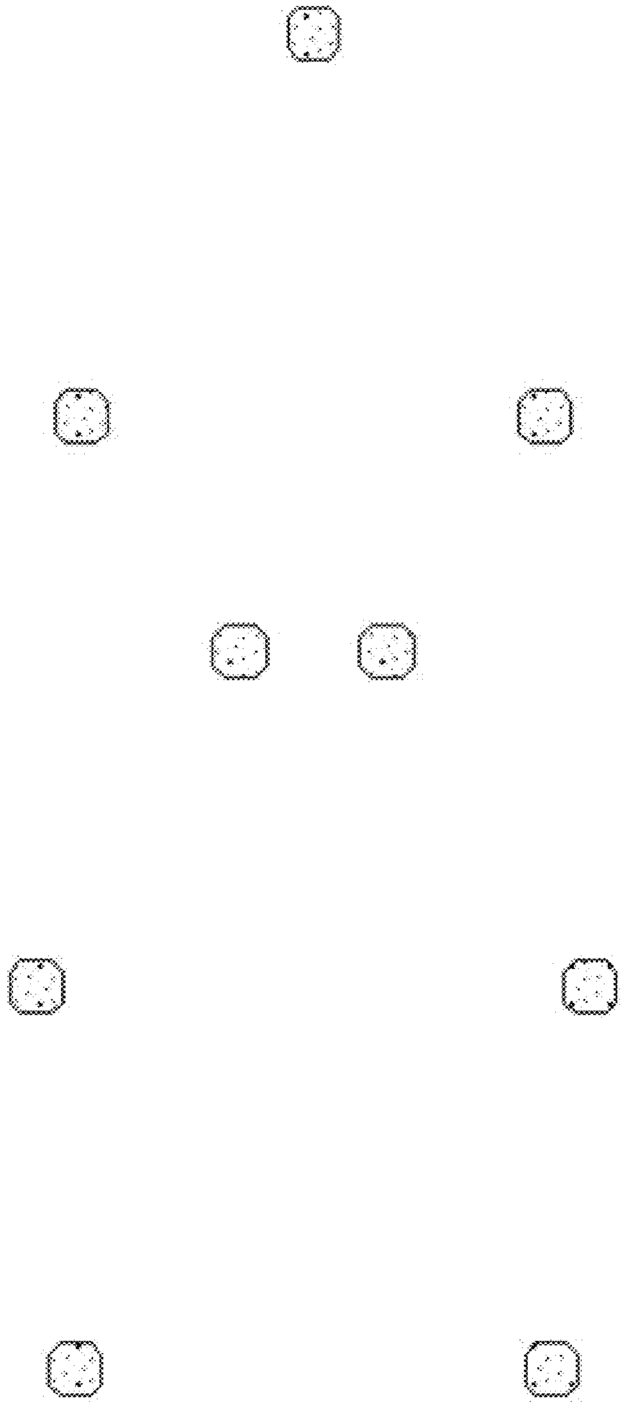
FIG. 28 is a schematic layout diagram of the shallower via hole in the provided interlayer insulating layer of FIG. 27.
Figure 29:
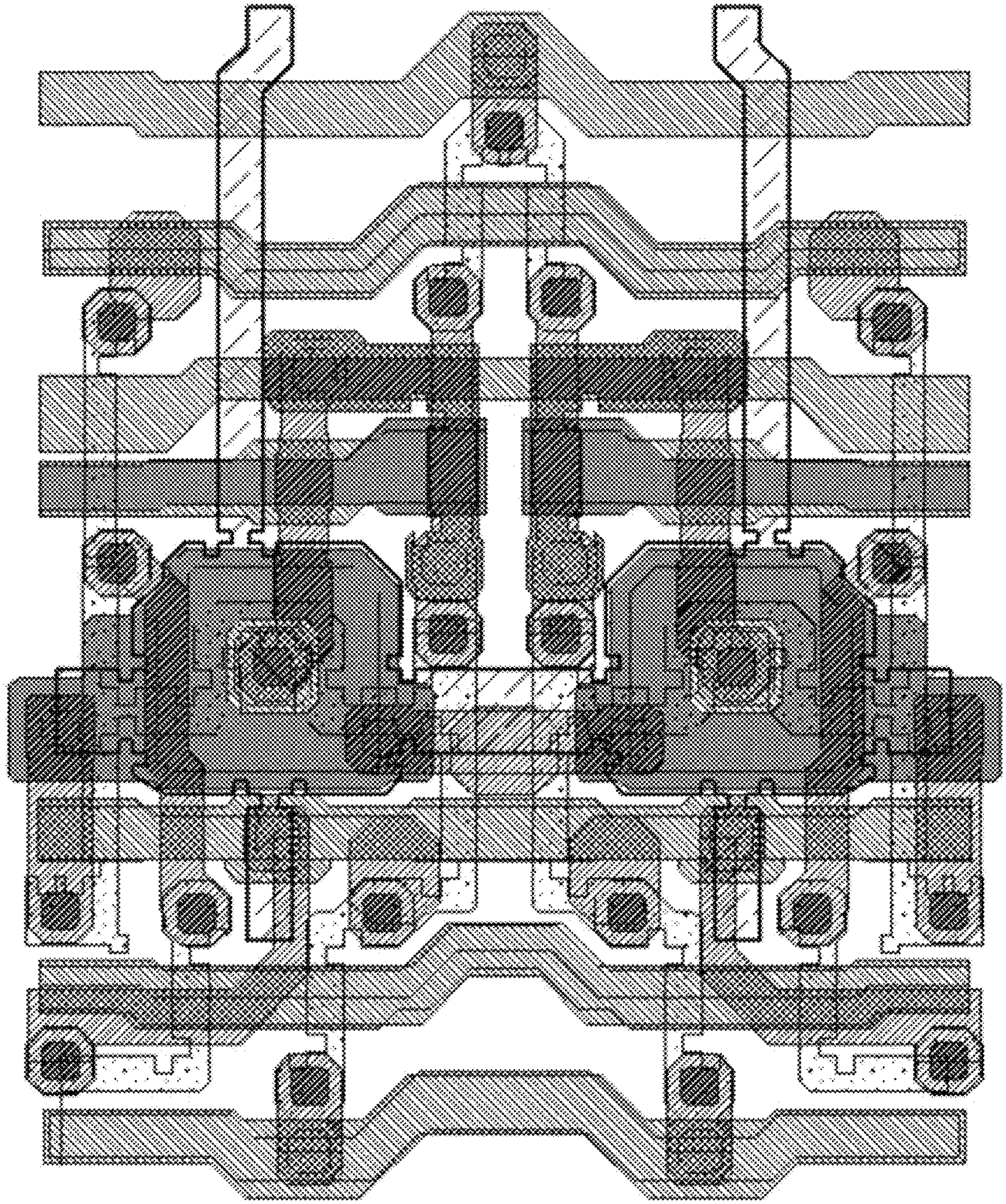
FIG. 29 is a schematic layout diagram of a first source and drain metal layer being provided on the basis of FIG. 27.

Illustratively, a plurality of through holes are formed in the interlayer insulating layer. As shown in FIG. 26, deeper holes in the interlayer insulating layer are illustrated, which enable a coupling between the first active layer and the first source and drain metal layer, or a coupling between the first gate metal layer and the first source and drain metal layer, or a coupling between the second gate metal layer and the first source and drain metal layer. As shown in FIG. 28, shallower holes in the interlayer insulating layer aero illustrated, which enable a coupling between the third gate metal layer and the first source and drain metal layer, or a coupling between the second active layer and the first source and drain metal layer.

Figure 30:
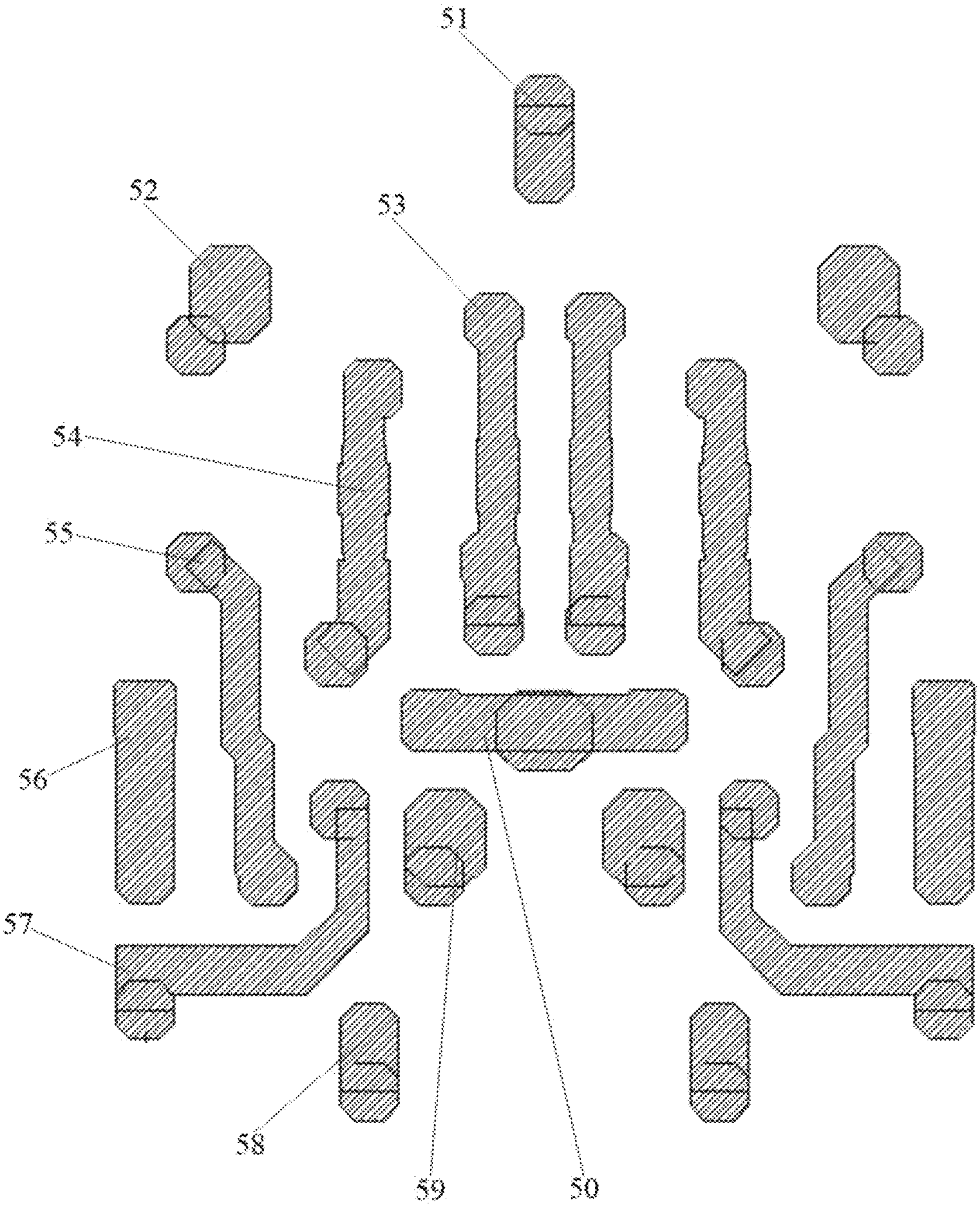
FIG. 30 is a schematic layout diagram of the first source and drain metal layer provided in FIG. 29.
Figure 31:
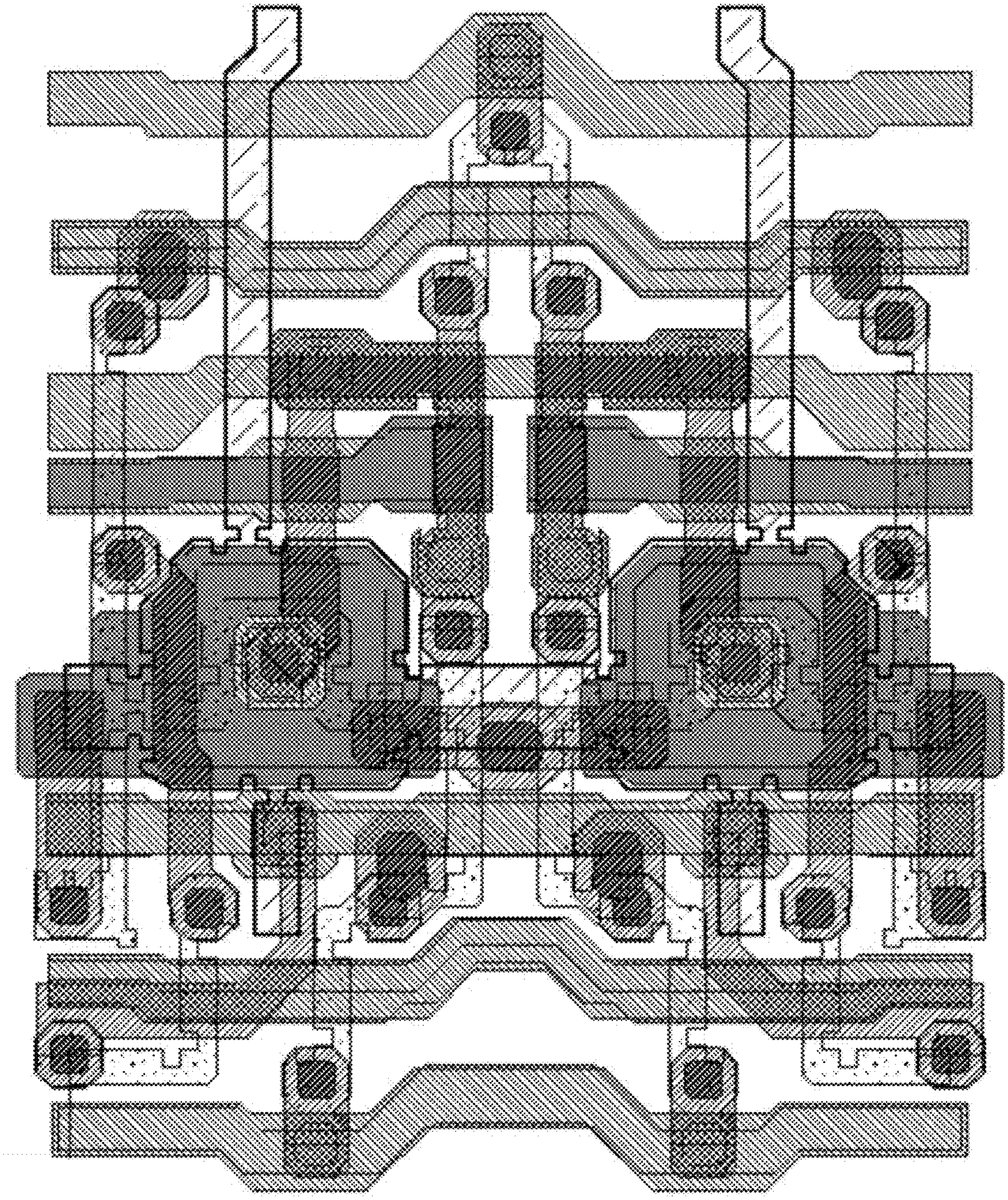
FIG. 31 is a schematic layout diagram of a passivation layer being provided on the basis of FIG. 29.

As shown in FIG. 30, illustratively, the first source and drain metal layer includes first to tenth conductive connection portions 51 to 50.

The first conductive connection portion 51 is coupled to the first electrode of the first reset transistor T1 and the first initialization signal line Vinit1. The second conductive connection portion 52 is coupled to the first electrode of the data writing transistor T4 and the data line Data. The third conductive connection portion 53 is coupled to the second electrode of the first reset transistor T1 and the second electrode of the driving transistor T3. The fourth conductive connection portion 54 is coupled to the second electrode of the compensation transistor T2 and the gate electrode T3-*g* of the driving transistor T3. The fifth conductive connection portion 55 is coupled to the second electrode of the third reset transistor T8 and the first electrode of the driving transistor T3. The sixth conductive connection portion 56 is coupled to the first electrode of the power supply control transistor T5 and the second plate Cst2 of the storage capacitor Cst. The seventh conductive connection portion 57 is coupled to the first electrode of the third reset transistor T8 and the third initialization signal line Vinit3. The eighth conductive connection portion 58 is coupled to the first electrode of the second reset transistor T7 and the second initialization signal line Vinit2. The ninth conductive connection portion 59 is coupled to the second electrode of the light-emitting control transistor T6 and the eleventh conductive connection portion 61. The tenth conductive connection portion 50 is coupled to the second plate Cst2 of the storage capacitor Cst and the power supply line ELVDD.

Figure 32:
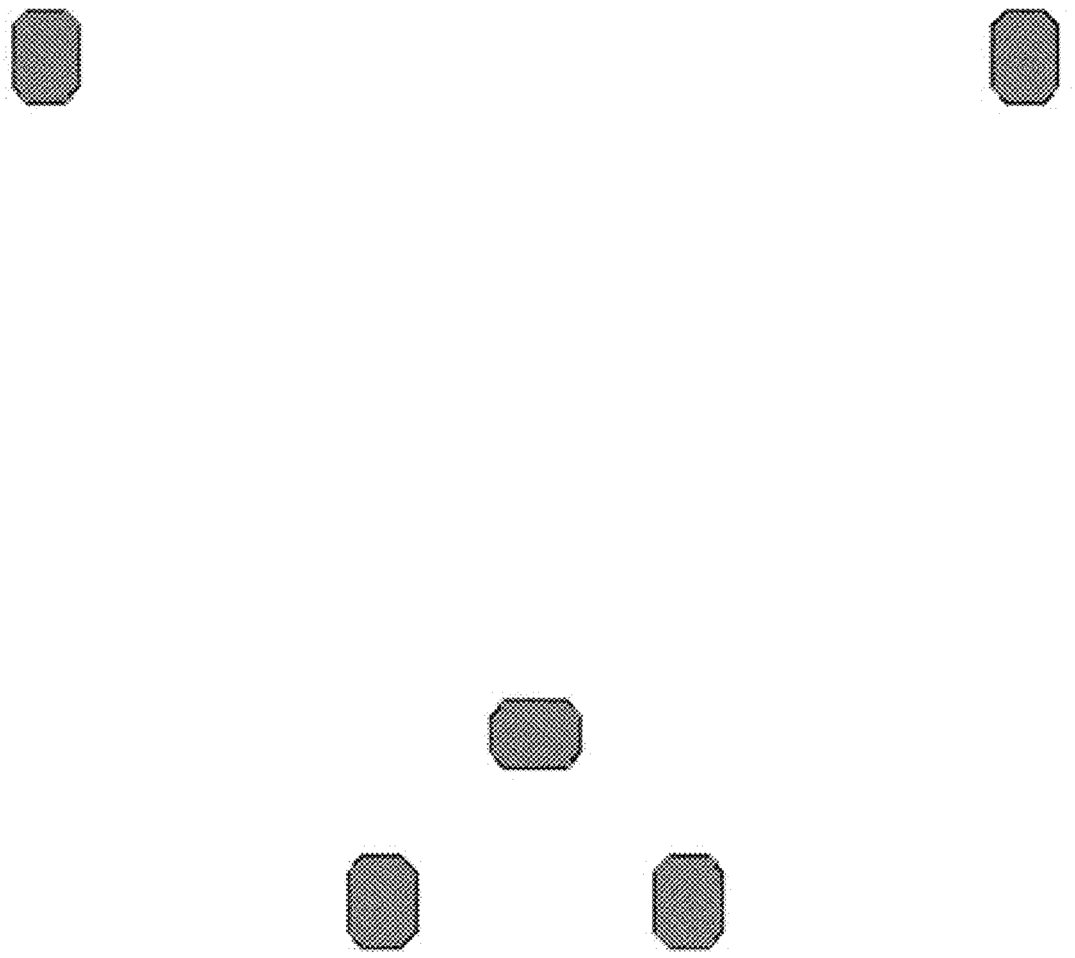
FIG. 32 is a schematic layout diagram of through holes in the provided passivation layer of FIG. 31.
Figure 33:
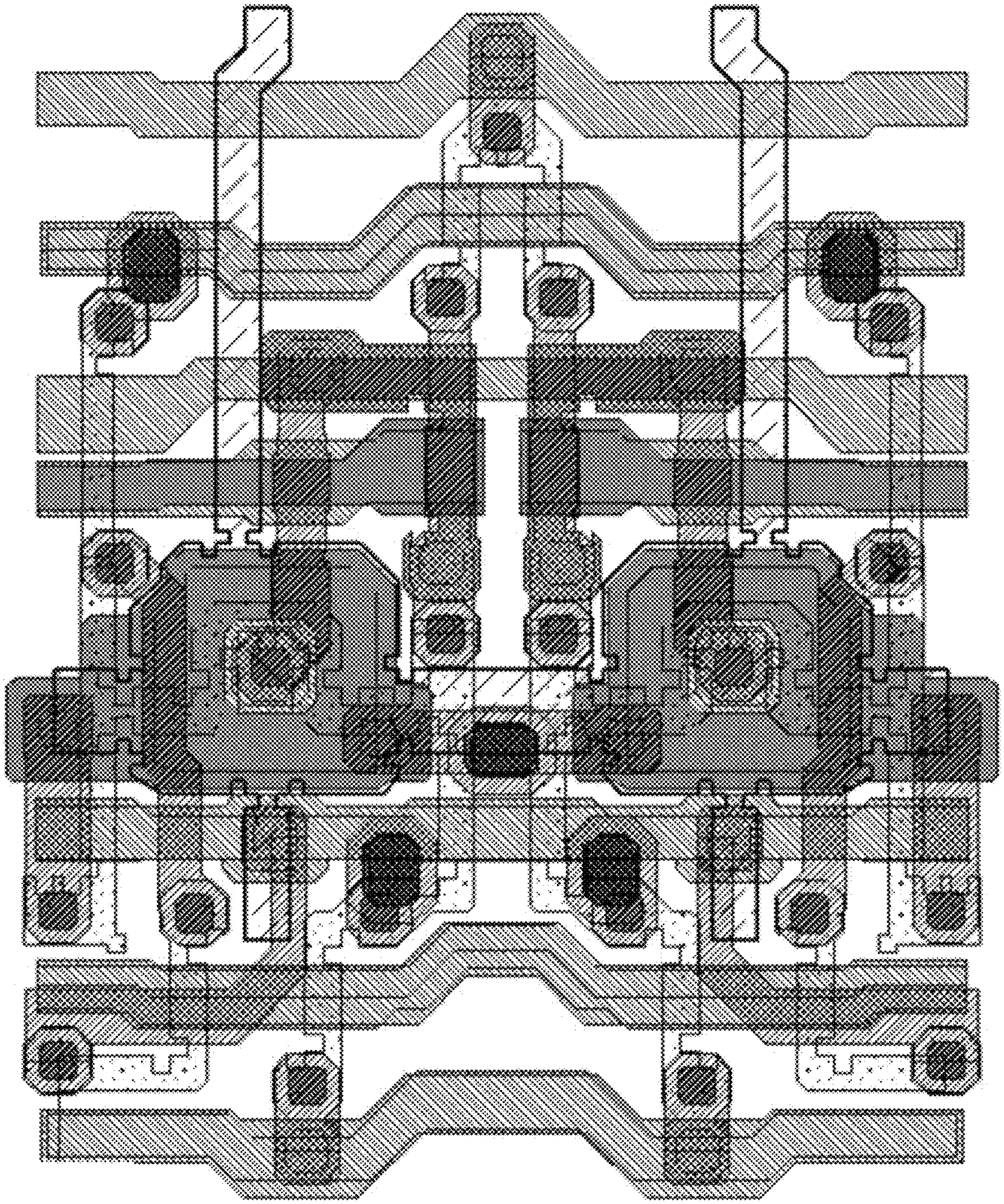
FIG. 33 is a schematic layout diagram of a first planarization layer being provided on the basis of FIG. 31.

Illustratively, as shown in FIG. 32, a plurality of through holes are formed in the passivation layer.

Figure 34:
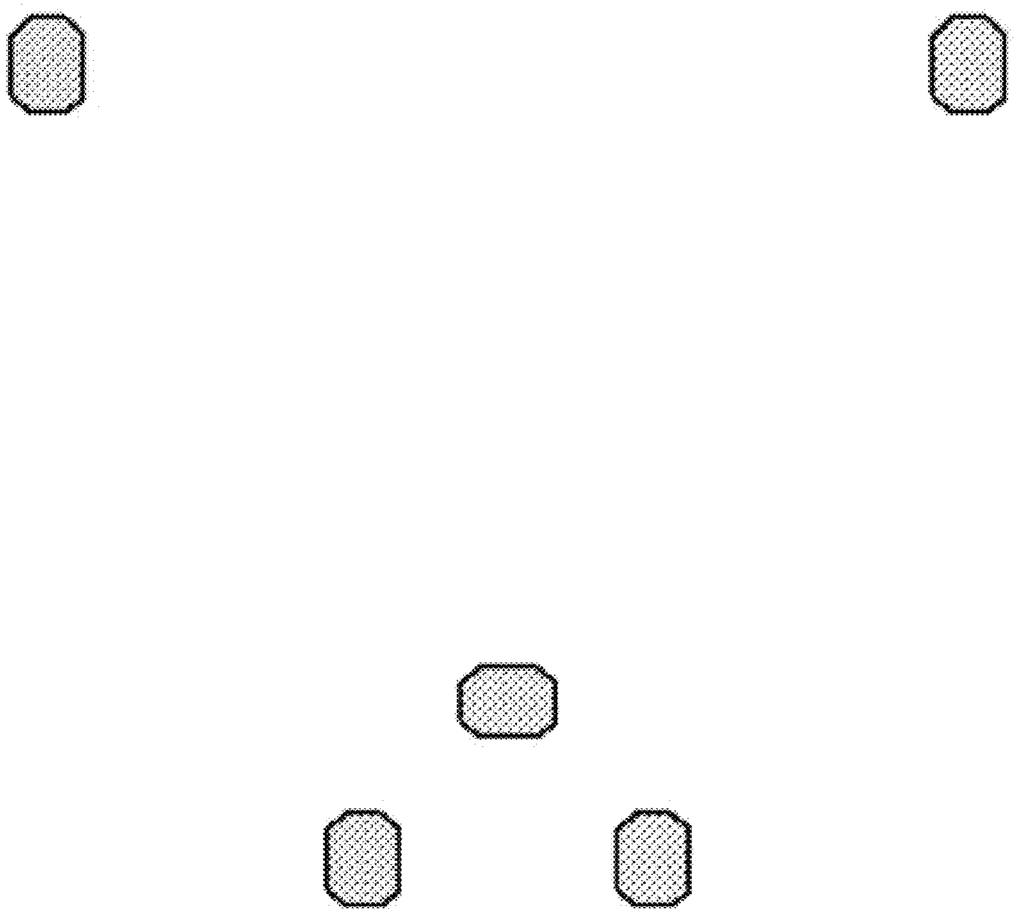
FIG. 34 is a schematic layout diagram of through holes in the provided first planarization layer in FIG. 33.
Figure 35:
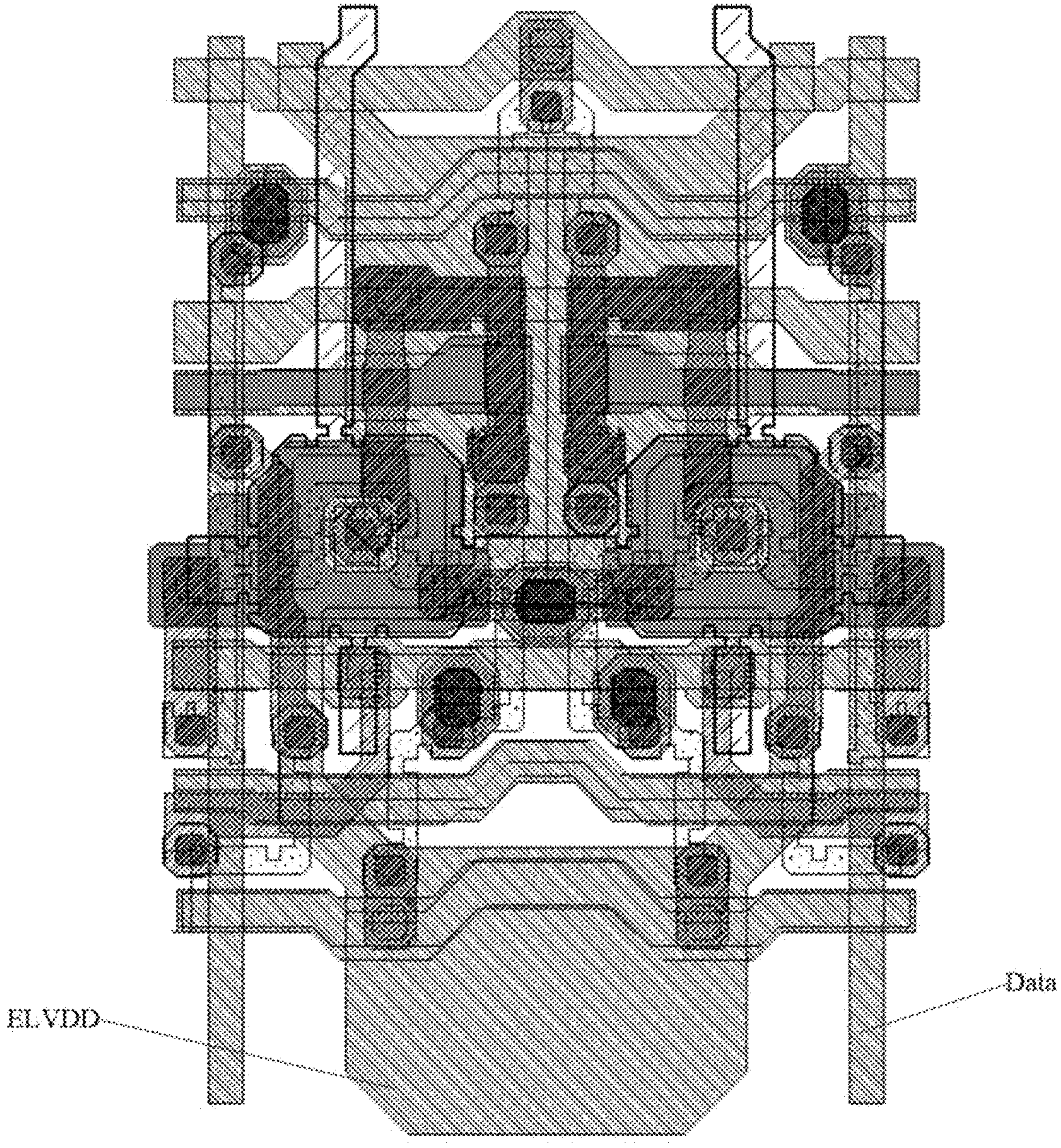
FIG. 35 is a schematic layout diagram of a second source and drain metal layer being provided on the basis of FIG. 33.

Illustratively, as shown in FIG. 34, a plurality of through holes are formed in the first planarization layer. The through holes in the first planarization layer overlap with the through holes in the passivation layer, for enabling a coupling between the first source and drain metal layer and the second source and drain metal layer.

Figure 36:
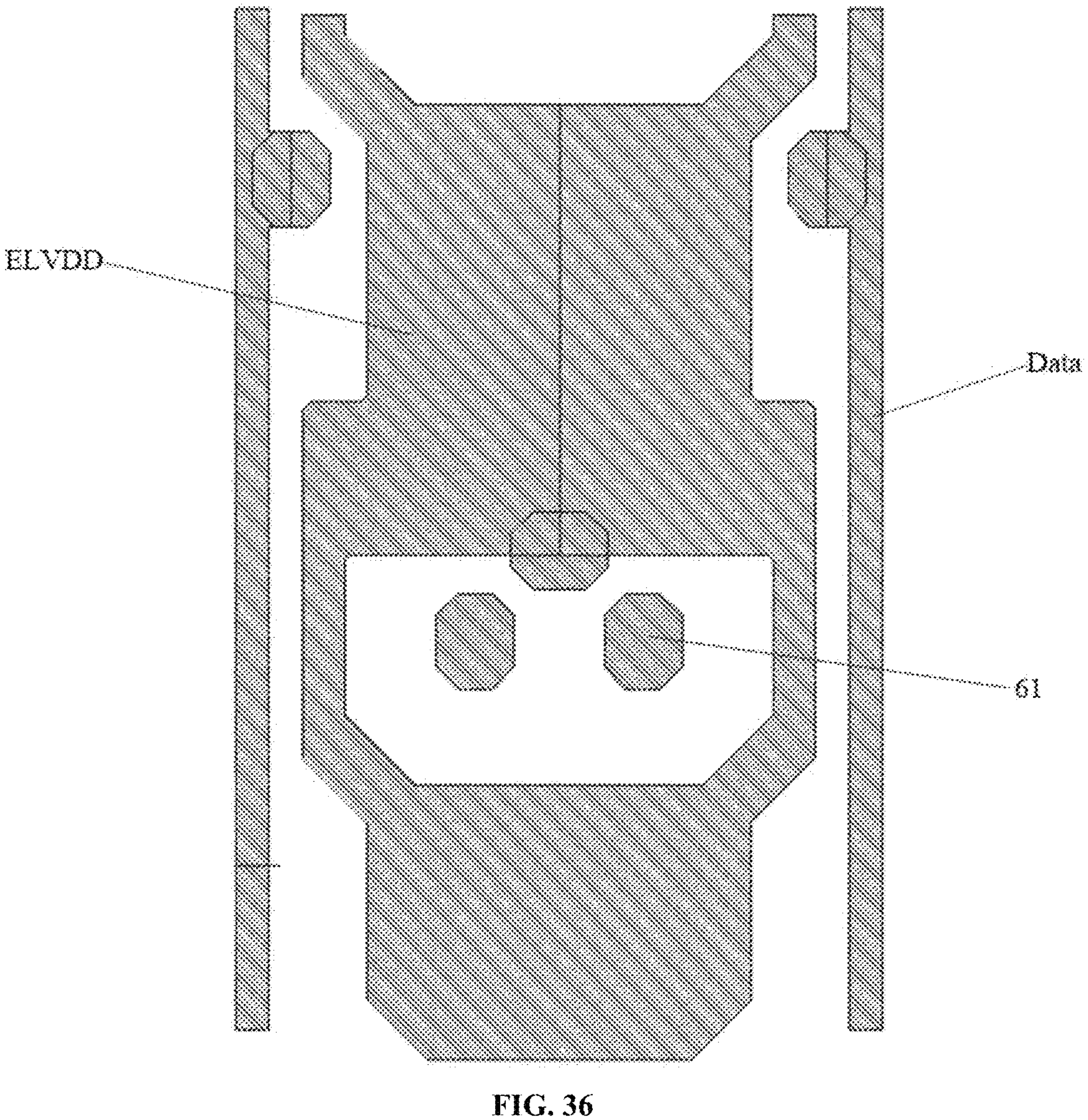
FIG. 36 is a schematic layout diagram of the second source and drain metal layer provided in FIG. 35.
Figure 37:
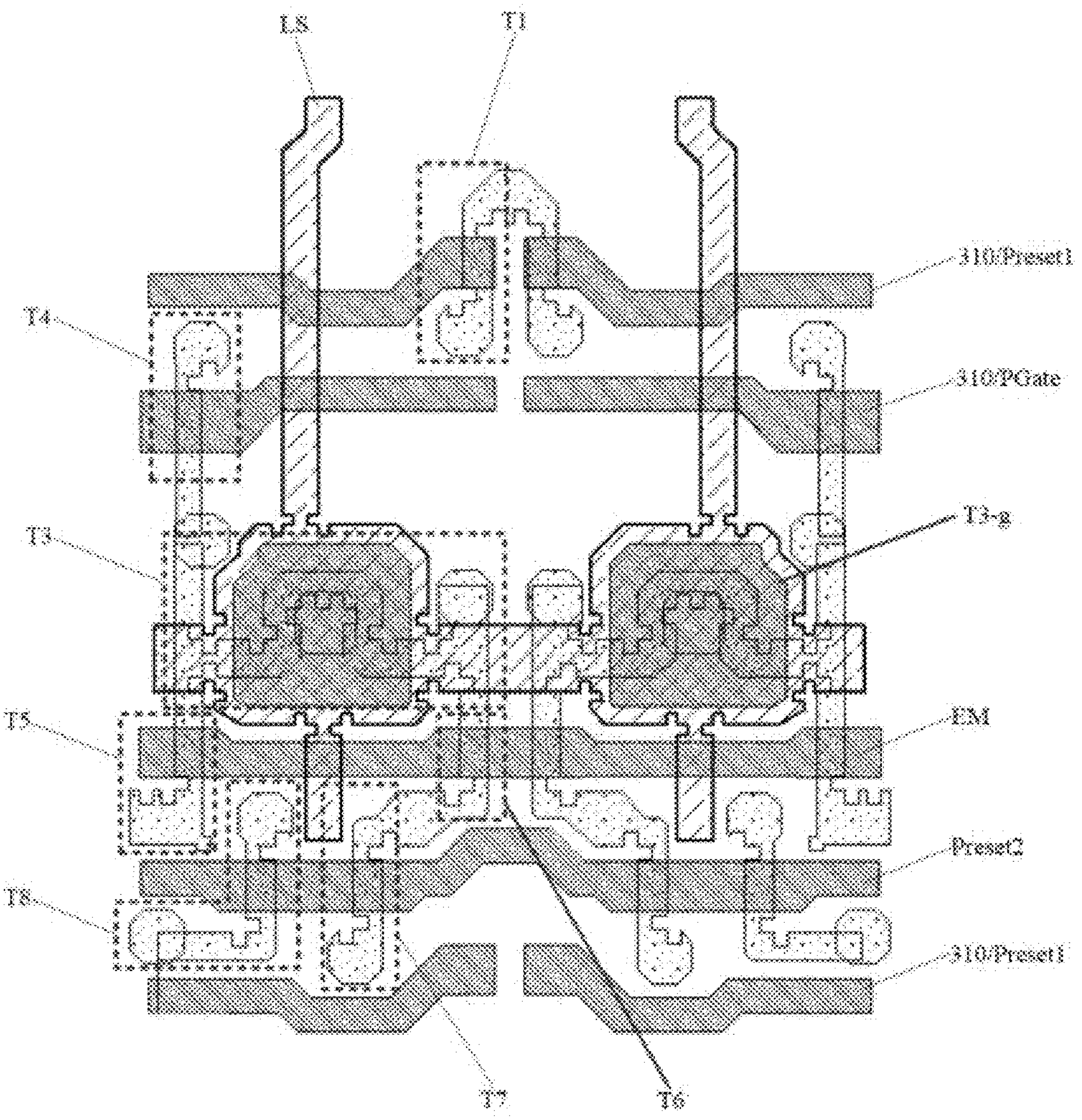
FIG. 37 is a schematic layout diagram of a second type of first gate metal layer being provided on the basis of FIG. 16.
Figure 38:
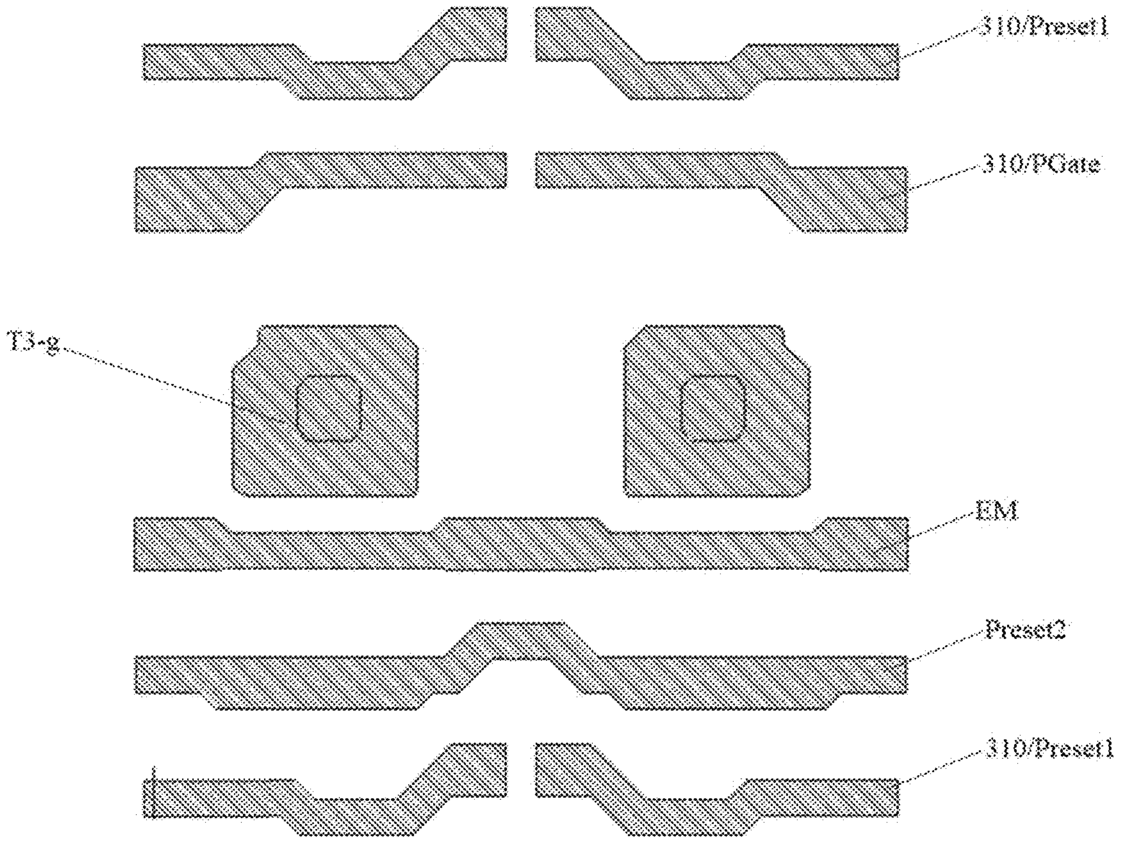
FIG. 38 is a schematic layout diagram of a first gate metal layer provided in FIG. 37.
Figure 39:
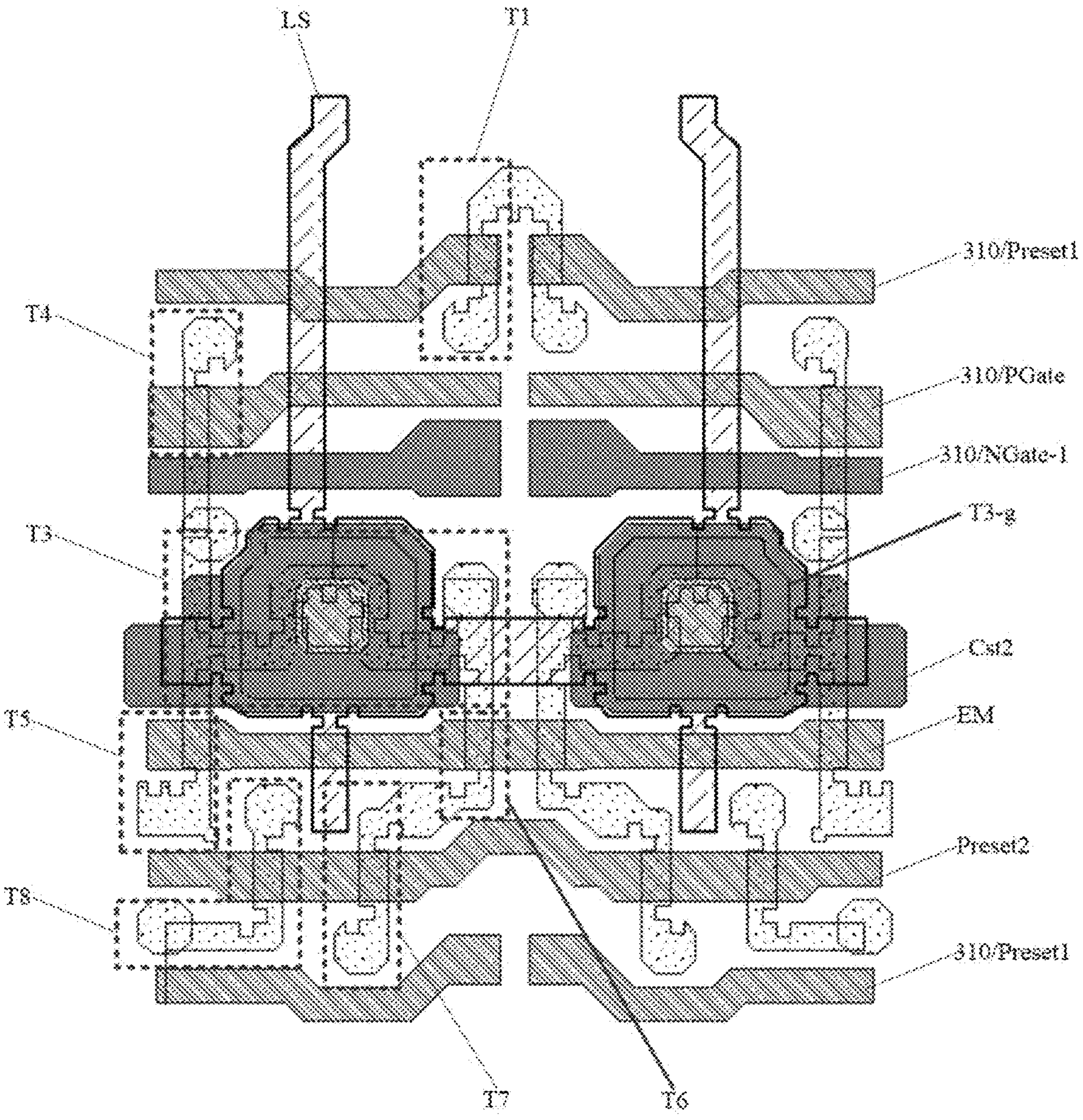
FIG. 39 is a schematic layout diagram of a second gate metal layer being provided on the basis of FIG. 37.
Figure 40:
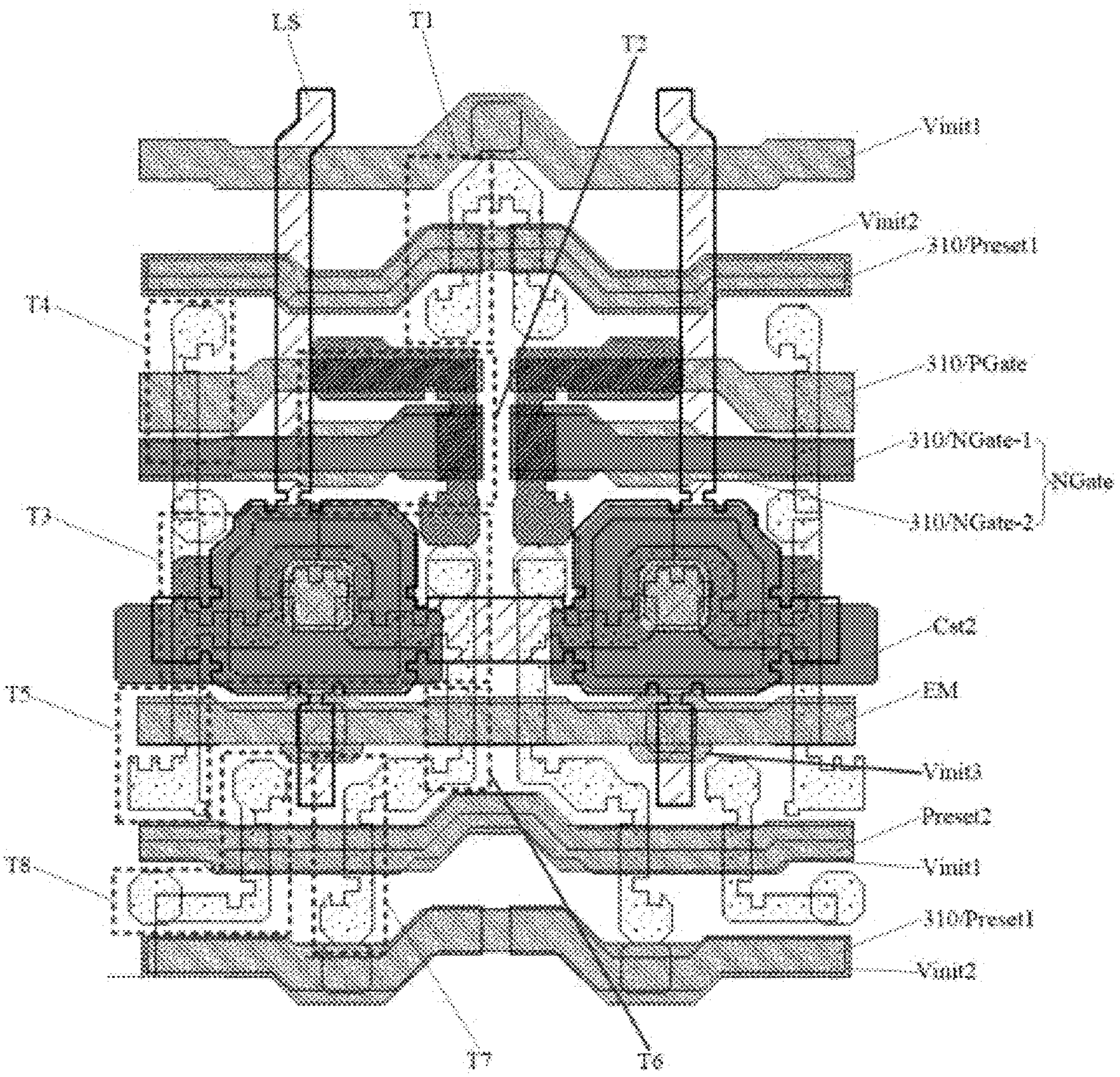
FIG. 40 is a schematic layout diagram of a second active layer and a third gate metal layer being provided on the basis of FIG. 39.
Figure 41:
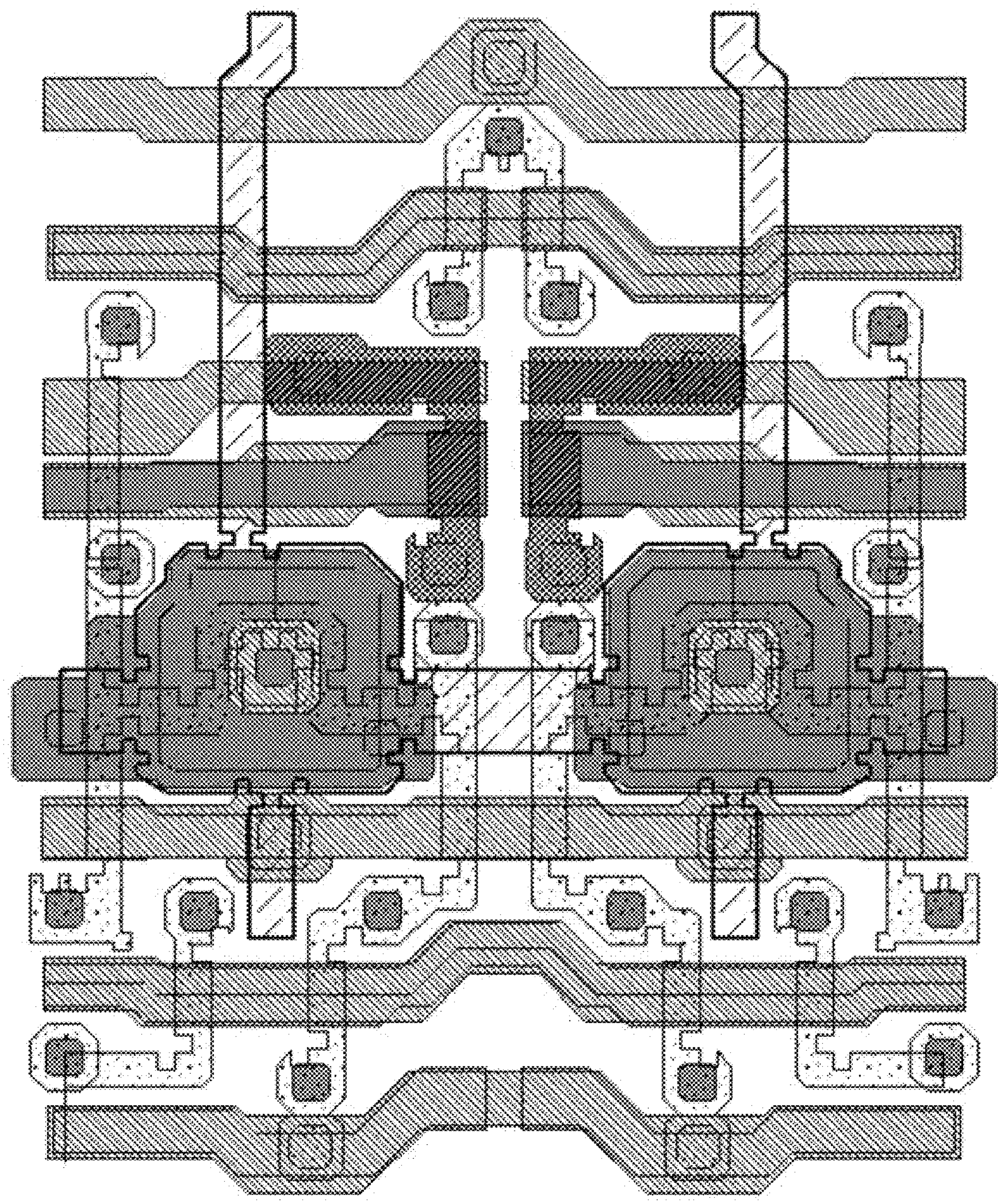
FIG. 41 is a schematic layout diagram of an interlayer insulating layer being provided on the basis of FIG. 40.
Figure 42:
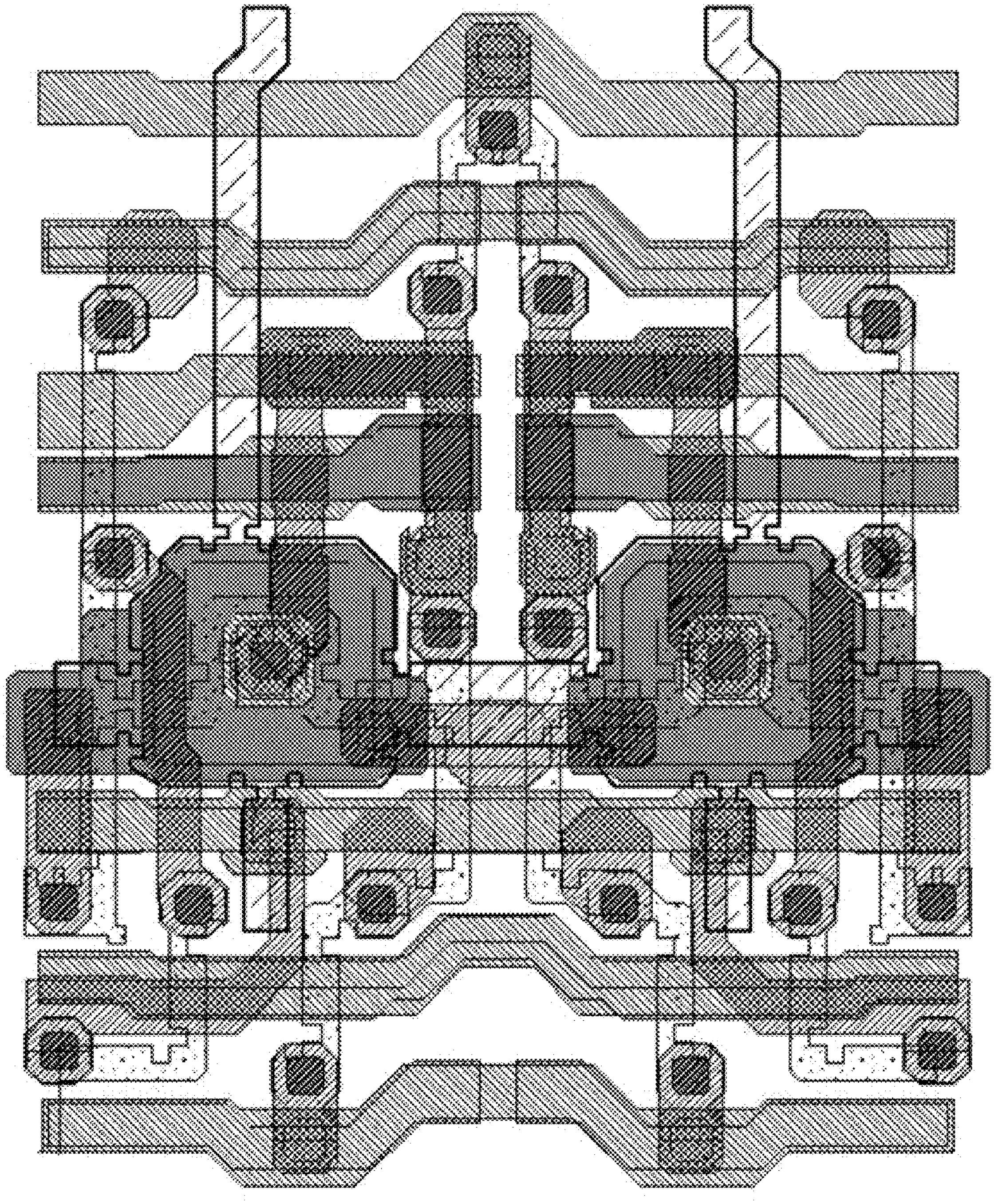
FIG. 42 is a schematic layout diagram of a first source and drain metal layer being provided on the basis of FIG. 41.

As shown in FIG. 36, illustratively, the second source and drain metal layer comprises: the data line Data, the power supply line ELVDD and the eleventh conductive connection portion 61, wherein the eleventh conductive connection portion 61 is coupled to the ninth conductive connection portion 59 and a corresponding anode layer.

As shown in FIGS. 10 to 36, in some embodiments, the sub-pixel comprises a sub-pixel driving circuit. The sub-pixel driving circuit comprises a driving transistor T3 and a compensation transistor T2, a first electrode of the compensation transistor T2 is coupled to a second electrode of the driving transistor T3, and a second electrode of the compensation transistor T2 is coupled to a gate electrode T3-*g* of the driving transistor T3.

Figure 23:
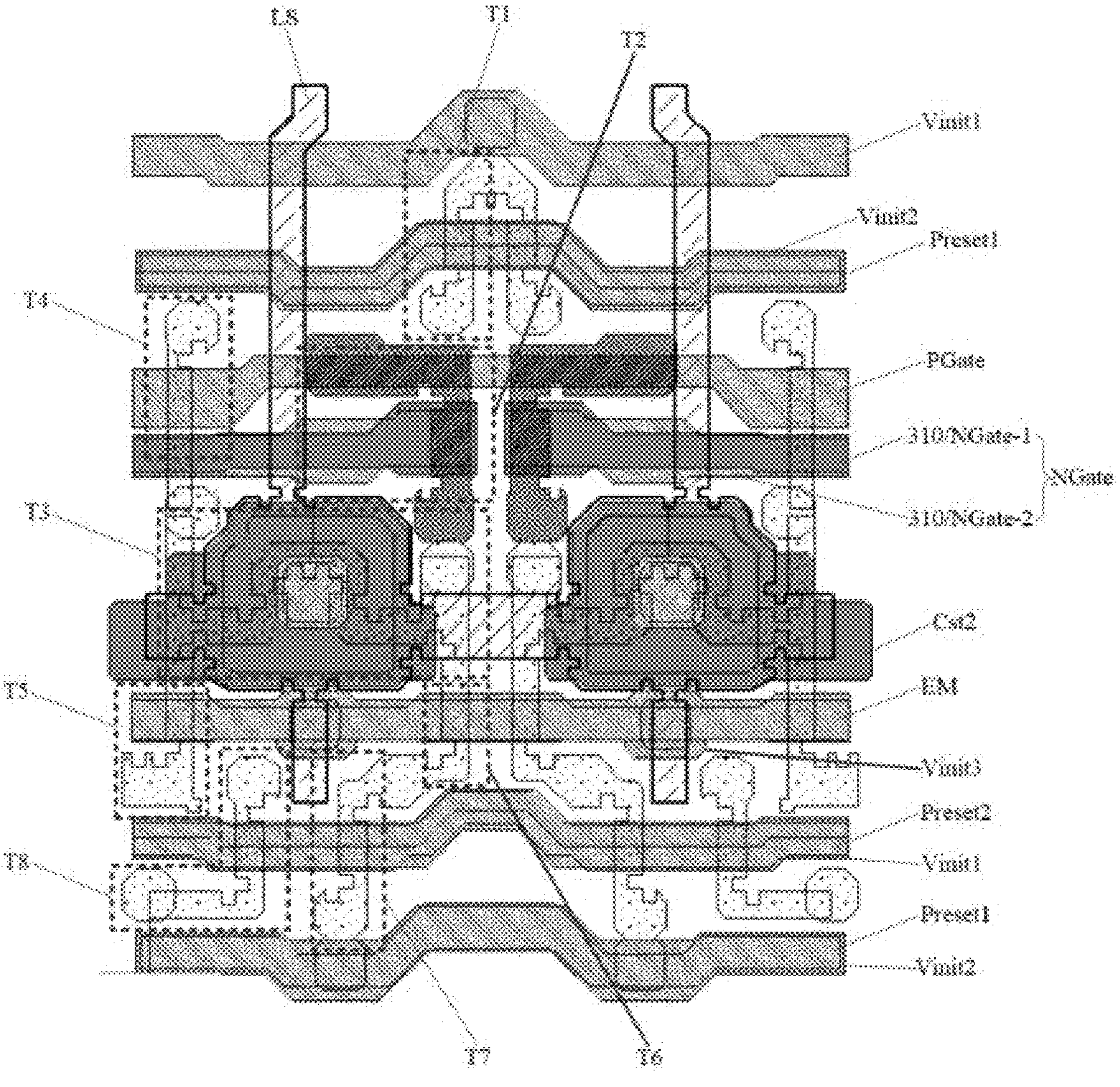
FIG. 23 is a schematic layout diagram of a third gate metal layer being provided on the basis of FIG. 21.

As shown in FIG. 23, the first scanning lines 31 comprises a first gate line NGate, and the scanning line segments 310 comprises a first gate line segment, and the first gate line segment is coupled to a gate electrode of a corresponding compensation transistor T2 which belongs to the same display sub-region as the first gate line segment.

Illustratively, the first gate line NGate comprises a first gate film layer NGate-1 and a second gate film layer NGate-2 which are arranged in a stack, the first gate film layer NGate-1 is formed by a second gate metal layer, and the second gate film layer NGate-2 is formed by a third gate metal layer. In each of spacing regions formed in the first gate line NGate, the first gate film layer NGate-1 and the second gate film layer NGate-2 are both broke.

Illustratively, the first gate line segment is reused as a gate electrode of a corresponding compensation transistors T2 belonging to the same display sub-region.

In the display substrate provided in the above-mentioned embodiment, by arranging the first scanning lines 31 to comprise the first gate line NGate, an independent controlling for the compensation transistor T2 in each of the display sub-regions can be achieved, thereby achieving optimized independent refreshing at each of the display sub-regions, which can further reduce the power consumption of the display substrate.

As shown in FIGS. 10 and 37 to 43, in some embodiments, the display substrate further comprises a first initialization signal line Vinit1. The sub-pixel driving circuit further comprises: a first reset transistor T1, wherein a first electrode of the first reset transistor T1 is coupled to a corresponding initialization signal line, and a second electrode of the first reset transistor T1 is coupled to a second electrode of the driving transistor T3.

The first scanning lines 31 further comprises a first reset line Preset1, and the scanning line segments 310 further comprises a first reset line segment, and the first reset line segment is coupled to a gate electrode of a corresponding first reset transistor T1 which belongs to the same display sub-region as the first reset line segment.

In the display substrate provided in the above-mentioned embodiment, by arranging the first scanning line 31 to further comprise the first reset line Preset1, an independent controlling for the first reset transistor T1 in each of the display sub-regions can be achieved, thereby achieving optimized independent refreshing at each of the display sub-regions, which can further reduce the power consumption of the display substrate while ensuring the displaying quality.

As shown in FIGS. 10 and 37 to 43, in some embodiments, the display substrate further comprises a plurality of data lines Data. The sub-pixel driving circuit further comprises: a data writing transistor T4, wherein a first electrode of the data writing transistor T4 is coupled to a corresponding data line Data, and a second electrode of the data writing transistor T4 is coupled to a first electrode of the driving transistor T3.

The first scanning lines 31 further comprises a second gate line PGate, and the scanning line segments 310 further comprises a second gate line segment, and the second gate line segment is coupled to a gate electrode of a corresponding data writing transistor T4 which belongs to the same display sub-region as the second gate line segment.

In the display substrate provided in the above-mentioned embodiment, by arranging the first scanning line 31 to further comprise the second gate line PGate, an independent controlling for the data writing transistor T4 in each of the display sub-regions can be achieved, thereby achieving optimized independent refreshing at each of the display sub-regions, which can further reduce the power consumption of the display substrate while ensuring the displaying quality.

Figure 43:
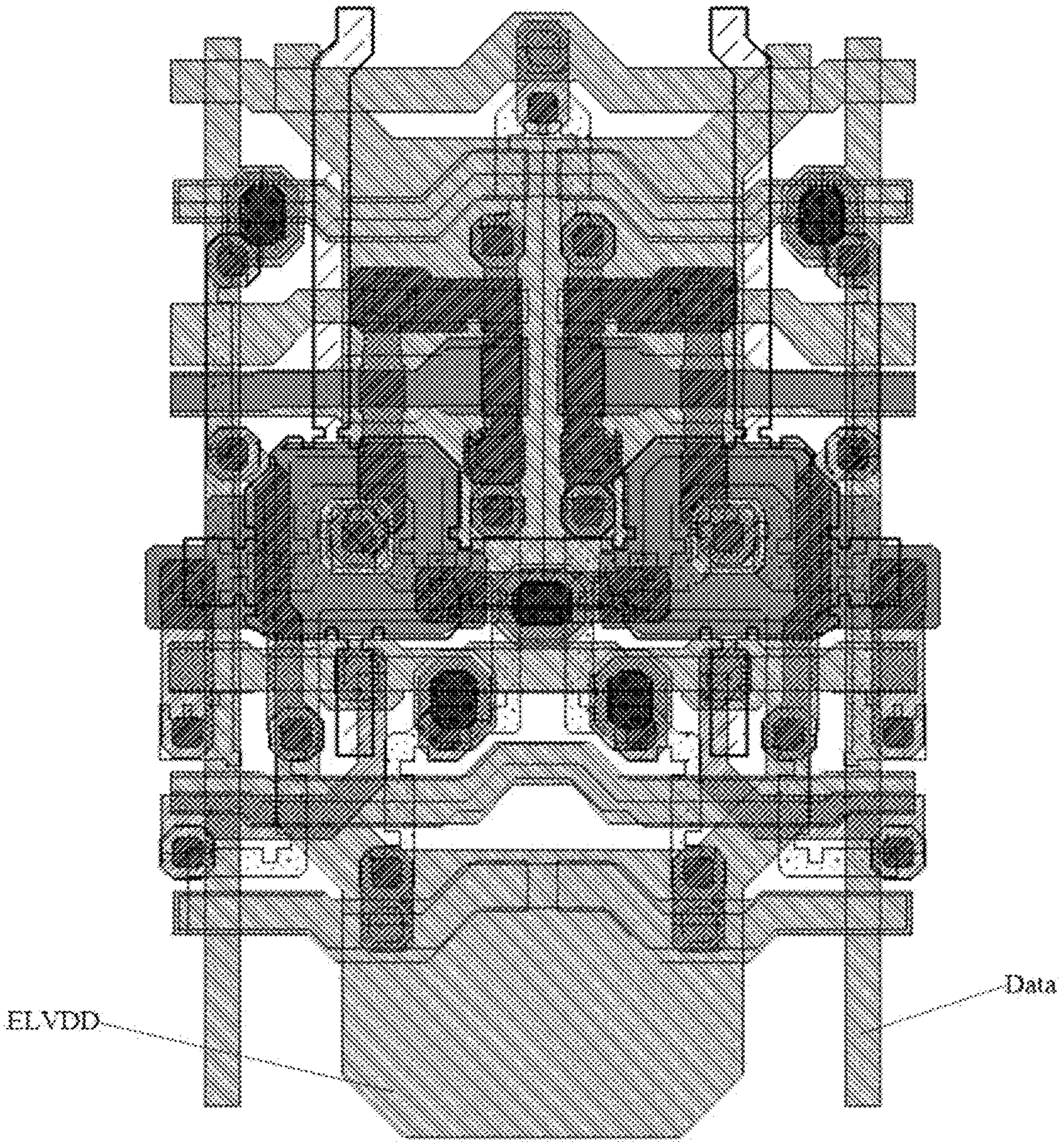
FIG. 43 is a schematic layout diagram of a second source and drain metal layer being provided on the basis of FIG. 42.
Figure 44:
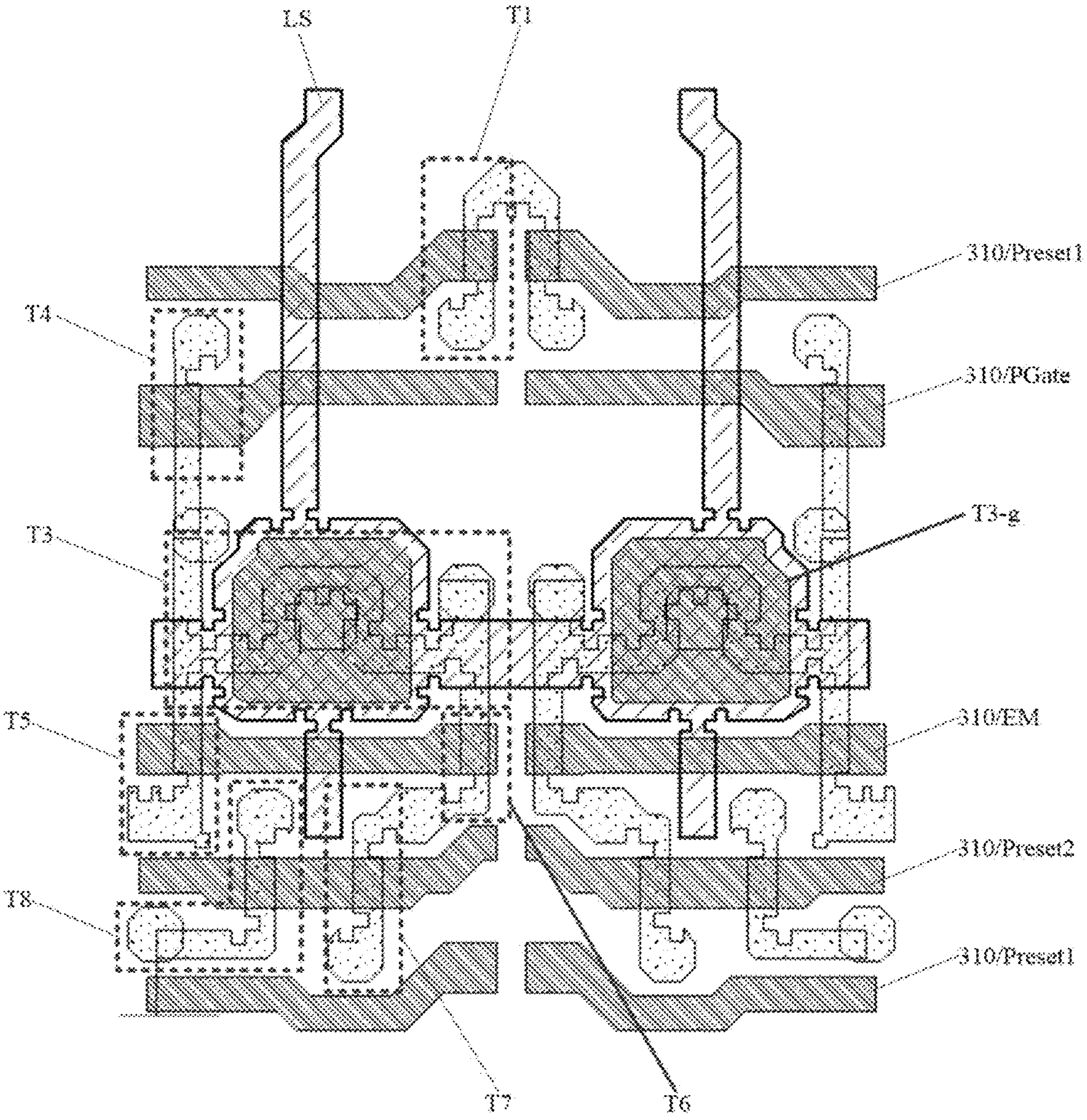
FIG. 44 is a schematic layout diagram of a third type of first gate metal layer being provided on the basis of FIG. 16.
Figure 45:
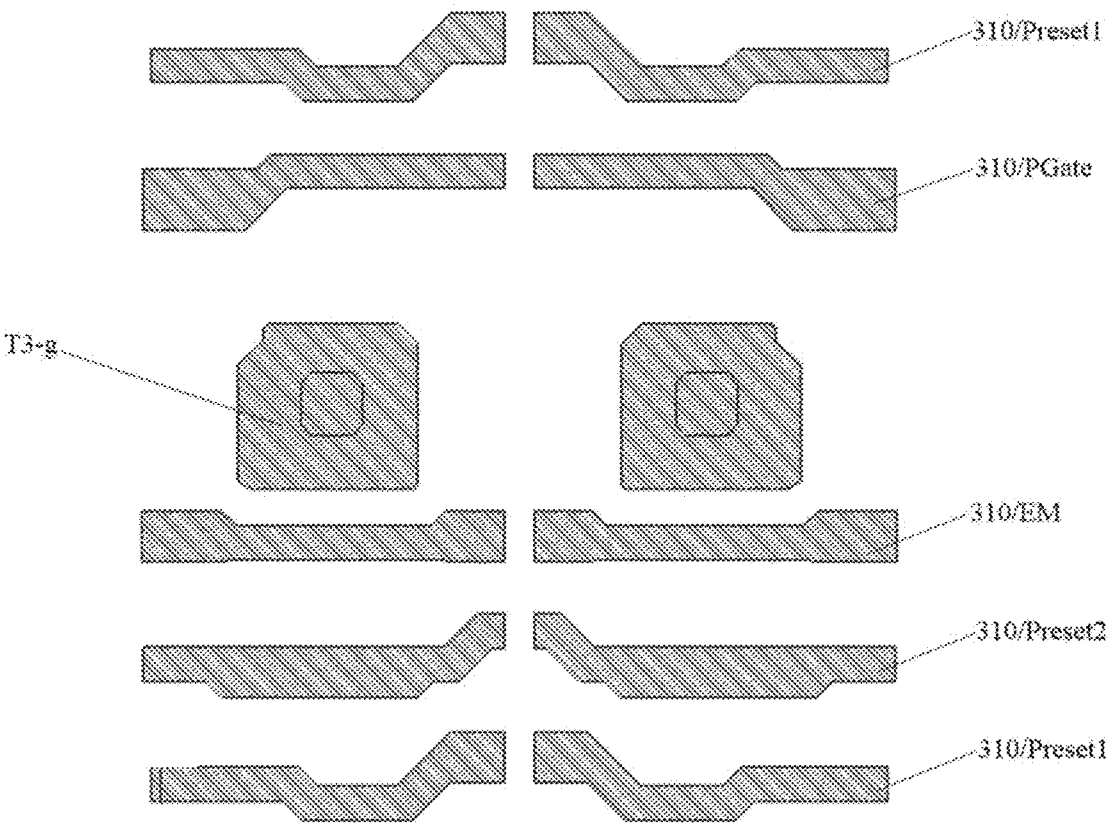
FIG. 45 is a schematic layout diagram of a first gate metal layer provided in FIG. 44.
Figure 46:
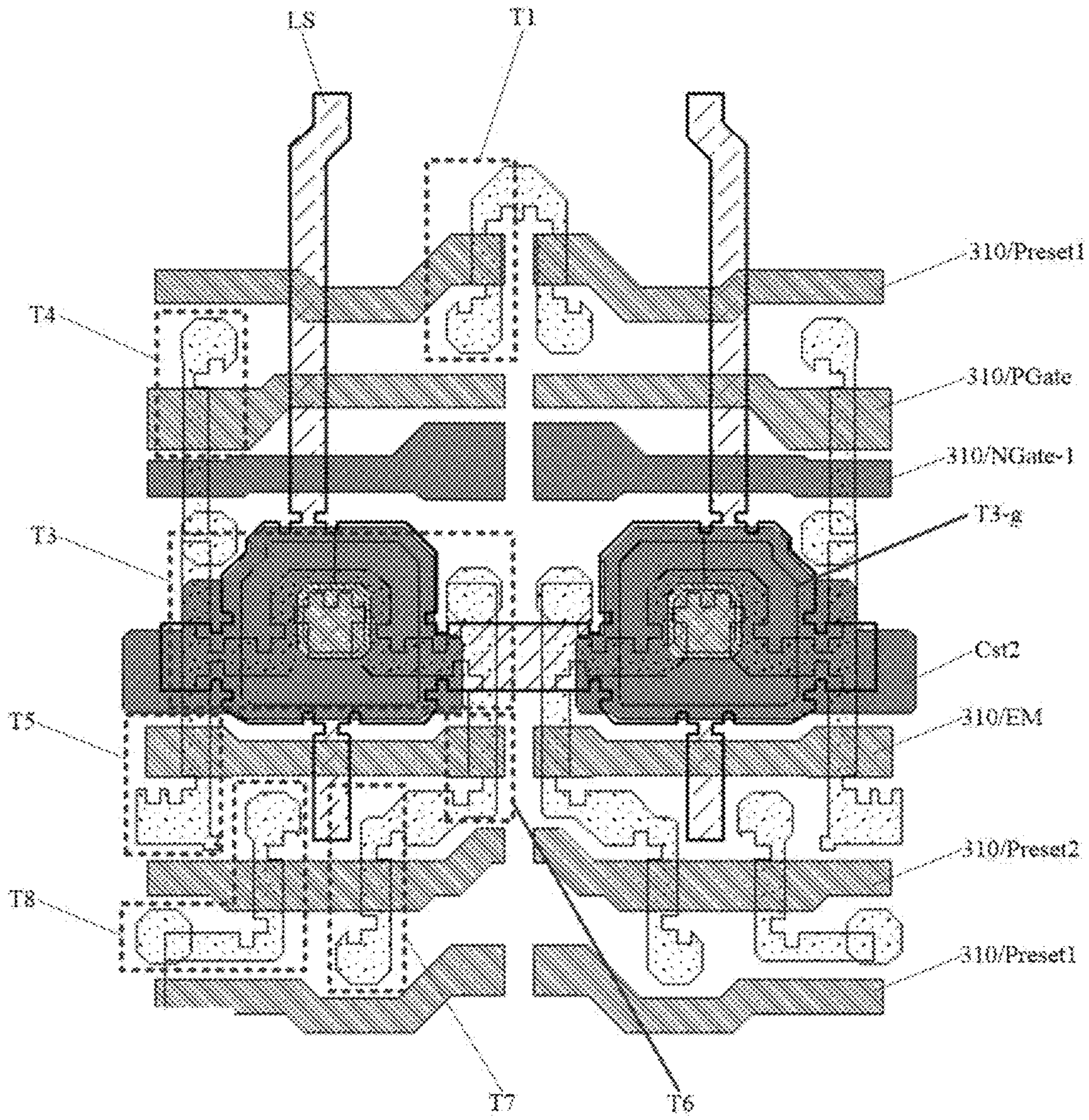
FIG. 46 is a schematic layout diagram of a second gate metal layer being provided on the basis of FIG. 44.

As shown in FIG. 43, in some embodiments, the display substrate further comprises a power supply line ELVDD, at least a portion of the power supply line ELVDD is located in a spacing region between adjacent first gate line segments; and/or at least a portion of the power supply line ELVDD is located in a spacing region between adjacent first reset line segments; and/or at least a portion of the power supply line ELVDD is located in a spacing region between adjacent second gate line segments.

Illustratively, the power supply line ELVDD fully covers the spacing region between adjacent first gate line segments.

Illustratively, the power supply line ELVDD fully covers the spacing region between adjacent ones of the first reset line segments.

Illustratively, the power supply line ELVDD fully covers the spacing region between adjacent second gate line segments.

Illustratively, the power supply line ELVDD at least partially covers a spacing region between adjacent second reset line segments.

Illustratively, the power supply line ELVDD at least partially covers a spacing region between adjacent light-emitting control line segments.

The above-mentioned arrangement enables the power supply line ELVDD located on the upper layer to shield the spacing region (namely, the position where the first scanning line 31 is broke), so as to reduce an influence of the spacing region on the displaying effect.

In some embodiments, the display substrate further comprises a data line Data. The data line Data at least partially covers a spacing region between adjacent the first gate line segments; and/or the data line Data at least partially covers a spacing region between adjacent first reset line segments; and/or the data line Data at least partially covers a spacing region between adjacent second gate line segments; and/or the data line Data at least partially covers a spacing region between adjacent the second reset line segments; and/or the data line Data at least partially covers a spacing region between adjacent the light-emitting control line segments.

In some embodiments, the display substrate further comprises an anode layer, at least a portion of the anode layer is located at a spacing region between adjacent the first gate line segments; and/or at least a portion of the anode layer is located at a spacing region between adjacent first reset line segments; and/or at least a portion of the anode layer is located at a spacing region between adjacent second gate line segments.

The above-mentioned arrangement enables the anode layer located on the upper layer to shield the spacing region, which can reduce the influence of the spacing region on the displaying effect.

In some embodiments, the display substrate comprises a first source and drain metal layer, at least a portion of the first source and drain metal layer is located in a spacing region between adjacent the first gate line segments; and/or at least a portion of the first source and drain metal layer is located in a spacing region between adjacent first reset line segments; and/or at least a portion of the first source and drain metal layer is located in a spacing region between adjacent second gate line segments.

The above-mentioned arrangement enables the first source and drain metal layer located on the upper layer to shield the spacing region, which can reduce the influence of the spacing region on the displaying effect.

As shown in FIGS. 10 and 44 to 50, in some embodiments, the display substrate further includes a power supply line ELVDD. The sub-pixel driving circuit further comprises: a power supply control transistor T5, a first electrode of the power supply control transistor T5 is coupled to the power supply line ELVDD, and a second electrode of the power supply control transistor T5 is coupled to a first electrode of the driving transistor T3.

The first scanning lines 31 further comprises a light-emitting control line EM, the scanning line segments 310 further comprises a light-emitting control line segment, and the light-emitting control line segment is coupled to a gate electrode of a corresponding power supply control transistor T5 which belongs to the same display sub-region as the light-emitting control line segment.

In the display substrate provided in the above-mentioned embodiment, by arranging the first scanning line 31 to further comprise the light-emitting control line EM, an independent controlling for the power supply control transistor T5 and the light-emitting control transistor T6 in each of the display sub-regions can be achieved, thereby achieving optimized independent refreshing at each of the display sub-regions, which can further reduce the power consumption of the display substrate while ensuring the displaying quality.

As shown in FIGS. 10 and 44 to 50, in some embodiments, the display substrate further comprises a third initialization signal line Vinit3 and a second reset line Preset2. The sub-pixel driving circuit further comprises: a third reset transistor T8, a first electrode of the third reset transistor T8 is coupled to the third initialization signal line Vinit3, a second electrode of the third reset transistor T8 is coupled to a first electrode of the driving transistor T3, and a gate electrode of the third reset transistor T8 is coupled to a corresponding second reset line Preset2.

Figure 47:
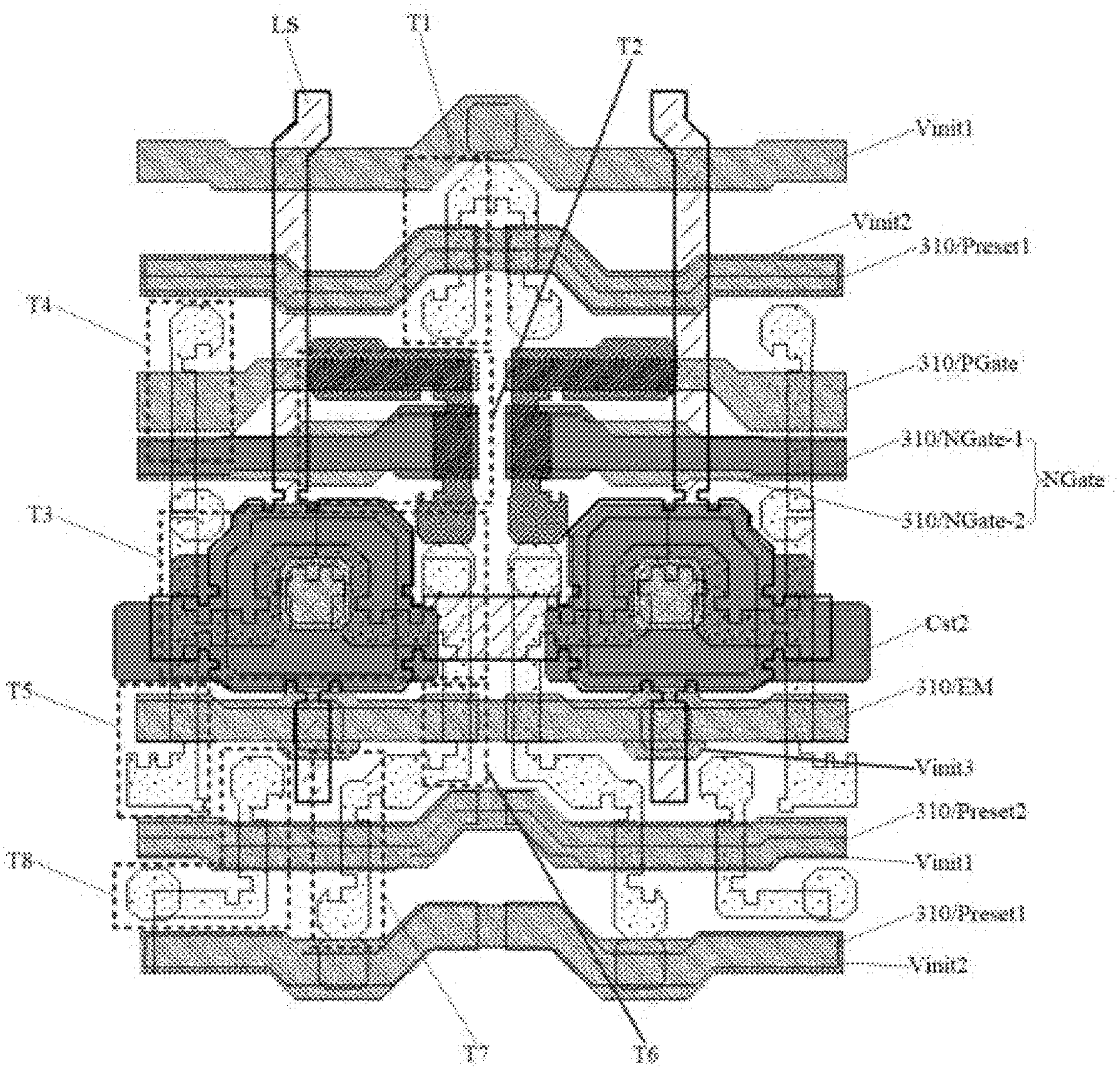
FIG. 47 is a schematic layout diagram of a second active layer and a third gate metal layer being provided on the basis of FIG. 46.
Figure 48:
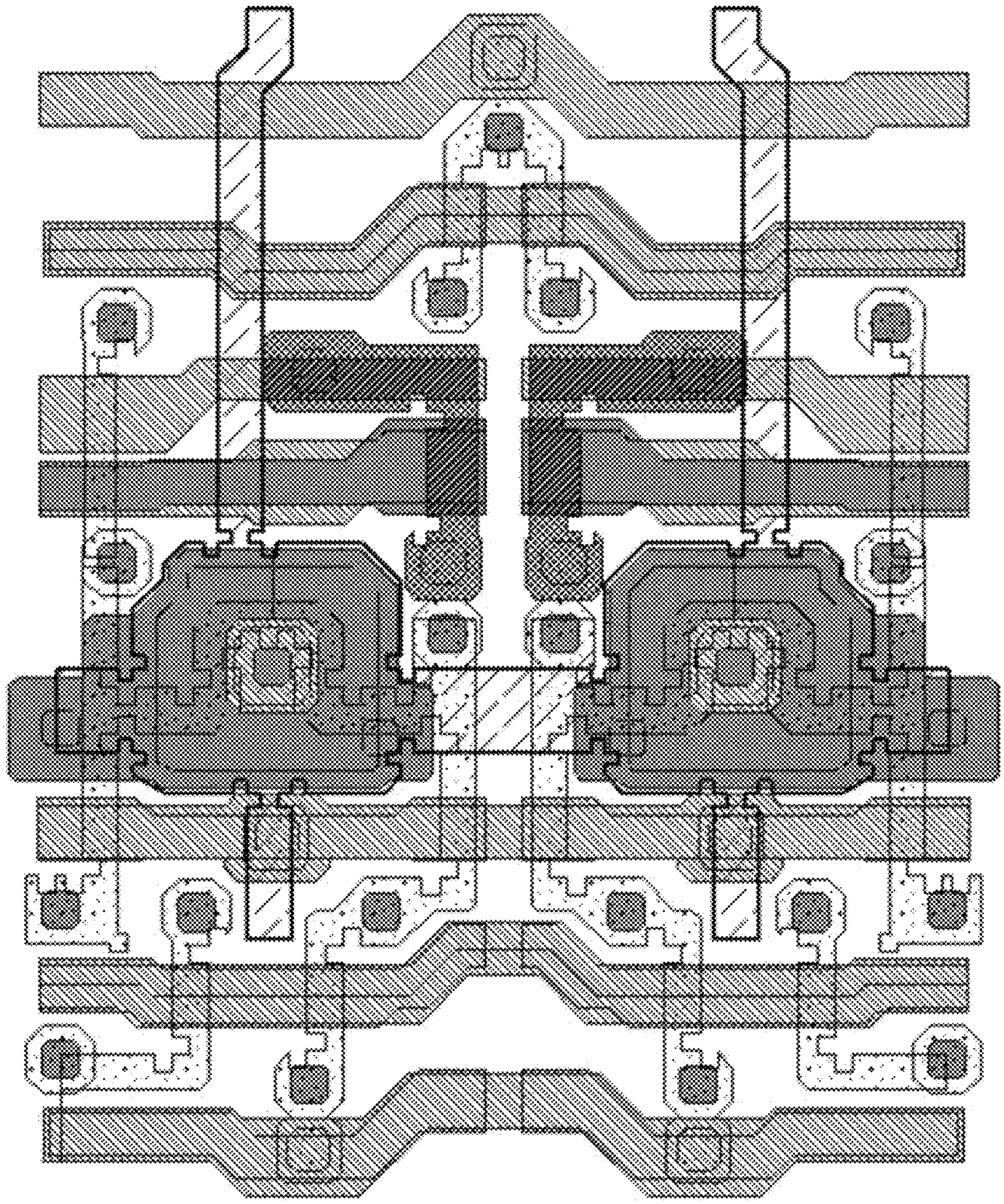
FIG. 48 is a schematic layout diagram of an interlayer insulating layer being provided on the basis of FIG. 47.
Figure 49:
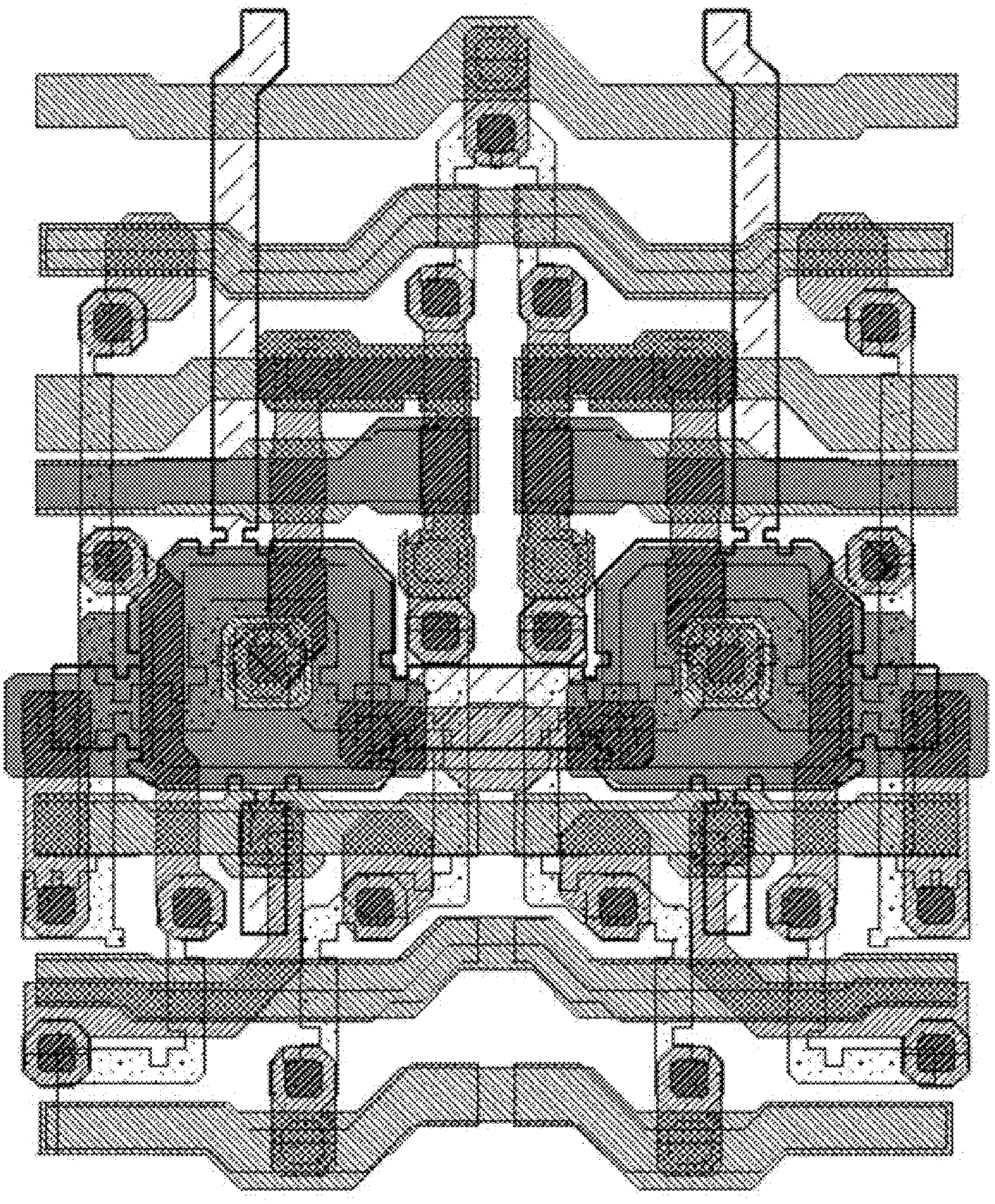
FIG. 49 is a schematic layout diagram of a first source and drain metal layer being provided on the basis of FIG. 48.
Figure 50:
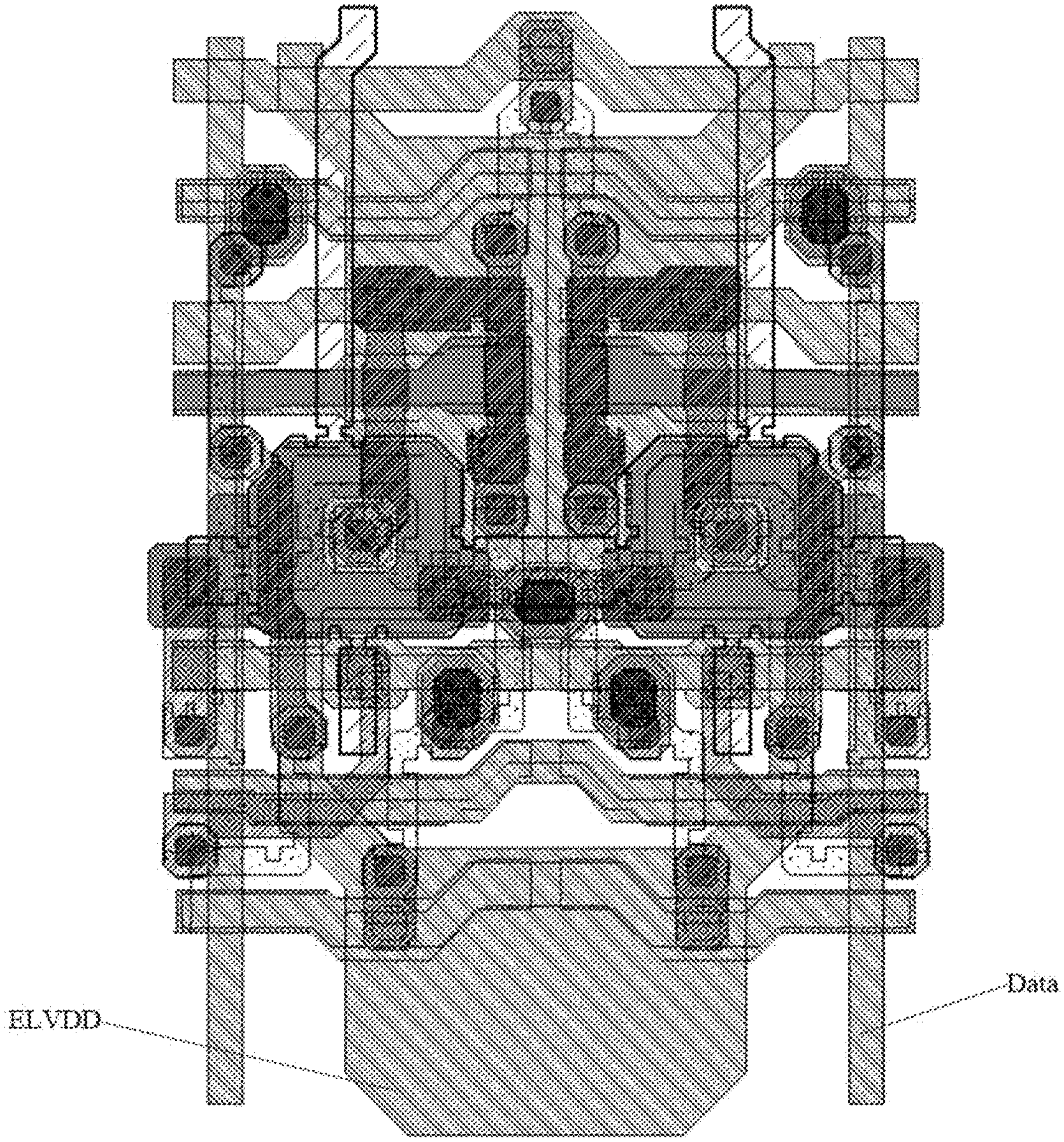
FIG. 50 is a schematic layout diagram of a second source and drain metal layer being provided on the basis of FIG. 49.

As shown in FIG. 47, at least a portion of the third initialization signal line Vinit3 is located in a spacing region between adjacent light-emitting control line segments.

The above-mentioned arrangement enables the third initialization signal line Vinit3 located on the upper layer to shield the spacing region between the light-emitting control line segments, which can reduce the influence of the spacing region on the displaying effect.

As shown in FIGS. 10 and 44 to 50, in some embodiments, the display substrate further comprises a third initialization signal line Vinit3. The sub-pixel driving circuit further comprises: a third reset transistor T8, a first electrode of the third reset transistor T8 is coupled to the third initialization signal line Vinit3, and a second electrode of the third reset transistor T8 is coupled to a first electrode of the driving transistor T3;

The first scanning lines 31 further comprises a second reset line Preset2, and the scanning line segments 310 further comprises a second reset line segment, and the second reset line segment is coupled to a gate electrode of a corresponding third reset transistor T8 which belongs to the same display sub-region as the second reset line segment.

In the display substrate provided in the above-mentioned embodiment, by arranging the first scanning line 31 to further comprise a second reset line Preset2, an independent controlling for the first reset transistor T1 in each of the display sub-regions can be achieved, thereby achieving optimized independent refreshing at each of the display sub-regions, which can further reduce the power consumption of the display substrate while ensuring the displaying quality.

As shown in FIGS. 10 and 44 to 50, in some embodiments, the display substrate further comprises a first initialization signal line Vinit1. The sub-pixel driving circuit further comprises: a first reset transistor T1 and a first reset line Preset1, wherein a first electrode of the first reset transistor T1 is coupled to a corresponding initialization signal line, a second electrode of the first reset transistor T1 is coupled to a second electrode of the driving transistor T3, and a gate electrode of the first reset transistor T1 is coupled to a corresponding first reset line Preset1.

As shown in FIG. 47, at least a portion of the first initialization signal line Vinit1 is located at a spacing region between adjacent second reset line segments.

The above-mentioned arrangement enables the first initialization signal line Vinit1 located on the upper layer to shield the spacing region between the second reset line segments, which can reduce the influence of the spacing region on the displaying effect.

It should be noted that schematic single-layer diagrams for some film layers in the embodiments corresponding to FIGS. 37 to 43 are the same as those in the embodiments corresponding to FIGS. 14 to 36, and the illustrations thereof are omitted herein. Schematic single-layer diagrams for some film layer in the embodiments corresponding to FIGS. 44 to 50 are the same as those in the embodiments corresponding to FIGS. 14 to 36, and the illustrations thereof are omitted herein.

In some embodiments, the display substrate further comprises: power supply lines ELVDD, first initialization signal lines Vinit1, second initialization signal lines Vinit2, third initialization signal line sVinit3 and a cathode layer;

- power supply lines ELVDD located in different display sub-regions are independent from each other; and/or,
- first initialization signal lines Vinit1 located in different display sub-regions are independent from each other; and/or,
- the second initialization signal lines Vinit2 located in different display sub-regions are independent from each other; and/or,
- the third initialization signal lines Vinit3 located in different display sub-regions are independent from each other; and/or,
- cathode layers in the different display sub-regions are independent from each other.

The above-mentioned arrangement enables an independent controlling for each of display sub-regions, thereby achieving optimized independent refreshing at each of the display sub-region, which can further reduce the power consumption of the display substrate while ensuring the displaying quality.

Embodiments of the present disclosure further include a display device, which includes the display substrate provided by the above embodiments.

It is noted that the display device may be any product or component with a display function, such as a television, a displayer, a digital photo frame, a mobile phone, a tablet computer, a wearable display product, a notebook, etc., wherein the display device further comprises a flexible circuit board, a printed circuit board and a backboard, etc.

In the display substrate provided in the above-mentioned embodiment provides, the display region is arranged to comprise at least two display sub-regions, the first scanning line is arranged to comprise at least two scanning line segments independent from each other, the at least two scanning line segments are located in different display sub-regions, the target row of sub-pixels are divided into at least two sub-pixel groups, the at least two sub-pixel groups are arranged to be located in different display sub-regions, and the scanning line segment is coupled with each of sub-pixels in a corresponding sub-pixel group which belongs to the same display sub-region as the scanning line segment. Such an arrangement enables the sub-pixel group within each display sub-region to be independently controlled via the corresponding scanning line segment, thereby enabling a refreshing per display sub-region, so that each display sub-region can adopt a different refresh rate. Therefore, the display substrate provided by the above-mentioned embodiments can achieve a split-screen refreshing while ensuring displaying effect, the power consumption of data transmission in the display substrate and at the system side is reduced, thereby effectively reducing the display power consumption of the display substrate.

Therefore, in a case where the display device provided by the embodiment includes the above-described display substrate, the above-described advantageous effects can also be realized and the description thereof will not be repeated here.

Embodiments of the present disclosure further provides a display substrate manufacturing method, which is applied for manufacturing the above-mentioned display substrate, which comprises a base substrate, the base substrate comprises a display region and a peripheral region located at a periphery of the display region, and the display region comprises: at least two display sub-regions.

the manufacturing method includes:

fabricating a plurality of scanning lines, wherein the plurality of scanning lines comprise a plurality of first scanning lines, the first scanning lines comprise at least two scanning line segments which are independent from each other, and the at least two scanning line segments are located in different display sub-regions; and fabricating a plurality of sub-pixels, wherein the plurality of sub-pixels are divided into a plurality of rows of sub-pixels, the plurality of rows of sub-pixels comprise a target row of sub-pixels, the target row of sub-pixels are divided into at least two sub-pixel groups, the at least two sub-pixel groups are located in different display sub-regions, and the scanning line segment is coupled to each sub-pixel in a corresponding sub-pixel group belonging to a same display sub-region.

In some embodiments, the step of fabricating a plurality of sub-pixels specifically comprises:

fabricating non-target rows of sub-pixels, wherein all sub-pixels comprised in a same non-target row of sub-pixels is located in a same display sub-region;

the step of fabricating a plurality of scanning lines specifically comprises:

fabricating a plurality of second scanning lines, wherein a second scanning line are coupled to each sub-pixel in a corresponding non-target row of sub-pixels.

It is to be noted that the signal line extending in the X direction means that: the signal line comprises a main part and a secondary part connected to the main part, the main part may be a line, a line segment or a bar-shaped body, the main part extends in the X-direction, and the length of the main part extending in the X-direction is greater than the length of the secondary part extending in another direction.

It is to be noted that the "same layer" in the embodiments of the present disclosure may refer to a film layer on the same structural layer. Optionally, for example, the film layer in the same layer may be a layer structure formed by forming a film layer for forming a specific pattern using the same film forming process and then patterning the film layer by one patterning process using the same mask plate. Depending on the particular pattern, a single patterning process may include multiple exposure, development, or etching processes, and the particular pattern in the resulting layer structure may or may not be continuous. The particular pattern may also be at different heights or have different thicknesses.

In the various method embodiments of the present disclosure, the serial number of each step cannot be used to define the order of each step, and for a person of ordinary skill in the art, without involving any inventive effort, changes in the order of each step are also within the scope of the present disclosure.

It should be noted that the various embodiments described herein are described in a progressive manner, the same or similar parts throughout the various embodiments can be referred to each other, with each embodiment focusing on the difference from the other embodiments. In particular, the method embodiments are described more simply because they are substantially similar to the product embodiments, and the description thereof can refer to the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "include" or "comprise", and the like, means that the presence of an element or item preceding the word covers the presence of the element or item listed after the word and equivalents thereof, but does not exclude other elements or items. The terms "connect", "couple" or "link" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the present disclosure has been described with reference to specific embodiments thereof, it will be understood various changes and substitutions that may be made by those skilled in the art without departing from the spirit of the disclosure fall within the protection scope of this disclosure. Accordingly, the protection scope of this disclosure is set forth in the claims.

What is claimed is:

1. A display substrate, comprising: a base substrate, wherein the base substrate comprises a display region and a peripheral region located at a periphery of the display region, the display region comprises at least two display sub-regions, wherein the display substrate further comprises:

a plurality of scanning lines, wherein the plurality of scanning lines comprise a plurality of first scanning lines, the first scanning line comprise at least two scanning line segments which are independent from each other, and the at least two scanning line segments are located in different display sub-regions; and a plurality of sub-pixels, wherein the plurality of sub-pixels are divided into a plurality of rows of sub-pixels, the plurality of rows of sub-pixels comprise a target row of sub-pixels, the target row of sub-pixels are divided into at least two sub-pixel groups, the at least two sub-pixel groups are located in different display sub-regions, and a scanning line segment of the at least two scanning line segments is coupled to each sub-pixel in a corresponding sub-pixel group belonging to a same display sub-region;

wherein the plurality of rows of sub-pixels further comprise non-target rows of sub-pixels, and all sub-pixels comprised in a same non-target row of sub-pixels are located in a same display sub-region; the plurality of scanning lines further comprise a plurality of second scanning lines, and a second scanning line is coupled to each sub-pixel in a corresponding non-target row of sub-pixels.

2. The display substrate according to claim 1, wherein the display region comprises two display sub-regions arranged along a first direction, the first scanning line comprises two scanning line segments arranged along the first direction, and at least a portion of the scanning line segment is located in a corresponding display sub-region; or, the display region comprises at least three display sub-regions arranged along a first direction, the first scanning line comprises at least three scanning line segments arranged along the first direction, and at least a portion of the scanning line segment is located in a corresponding display sub-region;

or, the display region further comprises a plurality of display sub-regions distributed in an array, the plurality of display sub-regions are divided into a plurality of rows of display sub-regions, and quantities of display sub-regions comprised in the plurality of rows of display sub-regions are the same or different.

3. The display substrate according to claim 1, wherein in a same first scanning line, an n-th spacing region is disposed between an n-th scanning line segment and an (n+1)-th scanning line segment, wherein n is an integer greater than or equal to 1; n-th spacing regions in at least some of the first scanning lines are located at different positions along a first direction;

or, in a same first scanning line, an n-th spacing region is disposed between an n-th scanning line segment and an (n+1)-th scanning line segment, wherein n is an integer greater than or equal to 1; n-th spacing regions in at least some of the first scanning lines are located in a same column along a second direction.

4. The display substrate according to claim 3, wherein the target row of sub-pixels comprises m sub-pixels arranged along the first direction, and a layout range for the n-th spacing region is between (m/2−a) and (m/2+a), wherein (m/2−a) represents a (m/2−a)-th sub-pixel, (m/2+a) represents a (m/2+a)-th sub-pixel; a meets: $a*d1 \leq d2$, wherein d1 is a width of a layout region occupied by one sub-pixel along the first direction, and d2 is a width of the display region along the first direction.

5. The display substrate according to claim 4, wherein in the plurality of first scanning lines, an n-th spacing region of an odd-numbered first scanning line and an n-th spacing region of an even-numbered first scanning lines are located at different positions along the first direction.

6. The display substrate according to claim 5, wherein in the plurality of first scanning lines, the n-th spacing region of the odd-numbered first scanning line is adjacent to the (m/2−a)-th sub-pixel, and the n-th spacing region of the even-numbered first scanning line is adjacent to the (m/2+a)-th sub-pixel.

7. The display substrate according to claim 1, wherein the display substrate further comprises:

a first gate driving circuit to a k-th gate driving circuit, wherein the first scanning line comprises k scanning line segments arranged along a first direction, wherein k is an integer greater than or equal to 2;

the first gate driving circuit and the k-th gate driving circuit are located in the peripheral region and are oppositely disposed along the first direction, and the display region is located between the first gate driving circuit and the k-th gate driving circuit; and the first gate driving circuit is coupled to a 1-st scanning line segment adjacent to the first gate driving circuit, and the k-th gate driving circuit is coupled to a k-th scanning line segment adjacent to the k-th gate driving circuit.

8. The display substrate according to claim 7, wherein k is an integer greater than or equal to 3; and a second gate driving circuit to a (k−1)-th gate driving circuit are located in the display region; a y-th gate driving circuit is coupled to a y-th scanning line segment, wherein y is an integer satisfying $2 \leq y \leq k-1$;

or, wherein k is an integer greater than or equal to 3; and a second gate driving circuit to a (k−1)-th gate driving circuit are located in the peripheral region, and the second gate driving circuit to the (k−1)-th gate driving circuit are located at one side of the display region along the second direction; a y-th gate driving circuit is coupled to a y-th scanning line segment, wherein y is an integer satisfying $2 \leq y \leq k-1$.

9. The display substrate according to claim 1, wherein the sub-pixel comprises a sub-pixel driving circuit; the sub-pixel driving circuit comprises a driving transistor and a compensation transistor, a first electrode of the compensation transistor is coupled to a second electrode of the driving transistor, and a second electrode of the compensation transistor is coupled to a gate electrode of the driving transistor; and the first scanning line comprises a first gate line, the scanning line segment comprises a first gate line segment, and the first gate line segment is coupled to a gate electrode of a corresponding compensation transistor belonging to a same display sub-region.

10. The display substrate according to claim 9, wherein the display substrate further comprises a first initialization signal line; the sub-pixel driving circuit further comprises a first reset transistor, a first electrode of the first reset transistor is coupled to a corresponding initialization signal line, and a second electrode of the first reset transistor is coupled to the second electrode of the driving transistor; and the first scanning lines further comprises a first reset line, the scanning line segments further comprises a first reset line segment, and the first reset line segment is coupled to a gate electrode of a corresponding first reset transistor belonging to a same display sub-region.

11. The display substrate according to claim 10, wherein the display substrate further comprises a plurality of data lines; the sub-pixel driving circuit further comprises: a data writing transistor, a first electrode of the data writing transistor is coupled to a corresponding data line, and a second electrode of the data writing transistor is coupled to a first electrode of the driving transistor; and the first scanning lines further comprises a second gate line, the scanning line segments further comprises a second gate line segment, and the second gate line segment is coupled to a gate electrode of a corresponding data writing transistor belonging to a same display sub-region.

12. The display substrate according to claim 11, wherein the display substrate further comprises a power supply line, at least a portion of the power supply line is located in a spacing region between adjacent first gate line segments; and/or at least a portion of the power supply line is located in a spacing region between adjacent first reset line segments; and/or at least portion of the power supply line is located in a spacing region between adjacent second gate line segments.

13. The display substrate according to claim 9, wherein the display substrate further comprises a power supply line; the sub-pixel driving circuit further comprises: a power supply control transistor, a first electrode of the power supply control transistor is coupled to the power supply line, and a second electrode of the power supply control transistor is coupled to a first electrode of the driving transistor; and the first scanning lines further comprises a light-emitting control line, the scanning line segments further comprises a light-emitting control line segment, and the light-emitting control line segment is coupled to a gate electrode of a corresponding power supply control transistor belonging to a same display sub-region.

14. The display substrate according to claim 13, wherein the display substrate further comprises a third initialization signal line and a second reset line; the sub-pixel driving circuit further comprises a third reset transistor, a first electrode of the third reset transistor is coupled to the third initialization signal line, a second electrode of the third reset transistor is coupled to the first electrode of the driving transistor, and a gate electrode of the third reset transistor is coupled to a corresponding second reset line; and at least a portion of the third initialization signal line is located in a spacing region between adjacent light-emitting control line segments.

15. The display substrate according to claim 9, wherein the display substrate further comprises a third initialization signal line; the sub-pixel driving circuit further comprises a third reset transistor, a first electrode of the third reset transistor is coupled to the third initialization signal line, and a second electrode of the third reset transistor is coupled to a first electrode of the driving transistor; and the first scanning lines further comprises a second reset line, the scanning line segments further comprises a second reset line segment, and the second reset line segment is coupled to a gate electrode of a corresponding third reset transistor belonging to a same display sub-region.

16. The display substrate according to claim 15, wherein the display substrate further comprises a first initialization signal line; the sub-pixel driving circuit further comprises: a first reset transistor and a first reset line, a first electrode of the first reset transistor is coupled to a corresponding initialization signal line, a second electrode of the first reset transistor is coupled to the second electrode of the driving transistor, and a gate electrode of the first reset transistor is coupled to a corresponding first reset line; and at least a portion of the first initialization signal line is located in a spacing region between adjacent second reset line segments.

17. The display substrate according to claim 9, wherein the display substrate further comprises: power supply lines, first initialization signal lines, second initialization signal lines, third initialization signal lines and a cathode layer;

power supply lines located in different display sub-regions are independent of each other; and/or, first initialization signal lines located in different display sub-regions are independent from each other; and/or, second initialization signal lines located in different display sub-regions are independent from each other; and/or, third initialization signal lines located in different display sub-regions are independent from each other; and/or, cathode layers located in the different display sub-regions are independent of each other.

18. A display substrate manufacturing method, for manufacturing a display substrate, the display substrate comprising a base substrate, the base substrate comprising a display region and a peripheral region located at a periphery of the display region, the display region comprising: at least two display sub-regions;

wherein the manufacturing method comprises:

fabricating a plurality of scanning lines, wherein the plurality of scanning lines comprise a plurality of first scanning lines, the first scanning lines comprise at least two scanning line segments which are independent from each other, and the at least two scanning line segments are located in different display sub-regions; and fabricating a plurality of sub-pixels, wherein the plurality of sub-pixels are divided into a plurality of rows of sub-pixels, the plurality of rows of sub-pixels comprise a target row of sub-pixels, the target row of sub-pixels are divided into at least two sub-pixel groups, the at least two sub-pixel groups are located in different display sub-regions, and a scanning line segment of the at least two scanning line segments is coupled to each sub-pixel in a corresponding sub-pixel group belonging to a same display sub-region;

wherein the fabricating a plurality of sub-pixels comprises:

fabricating non-target rows of sub-pixels, wherein all sub-pixels comprised in a same non-target row of sub-pixels are located in a same display sub-region; and the fabricating a plurality of scanning lines comprises:

fabricating a plurality of second scanning lines, wherein a second scanning line is coupled to each sub-pixel in a corresponding non-target row of sub-pixels.

19. A display substrate, comprising: a base substrate, wherein the base substrate comprises a display region and a peripheral region located at a periphery of the display region, the display region comprises at least two display sub-regions, wherein the display substrate further comprises:

a plurality of scanning lines, wherein the plurality of scanning lines comprise a plurality of first scanning lines, the first scanning line comprise at least two scanning line segments which are independent from each other, and the at least two scanning line segments are located in different display sub-regions; and a plurality of sub-pixels, wherein the plurality of sub-pixels are divided into a plurality of rows of sub-pixels, the plurality of rows of sub-pixels comprise a target row of sub-pixels, the target row of sub-pixels are divided into at least two sub-pixel groups, the at least two sub-pixel groups are located in different display sub-regions, and a scanning line segment of the at least two scanning line segments is coupled to each sub-pixel in a corresponding sub-pixel group belonging to a same display sub-region;

wherein in a same first scanning line, an n-th spacing region is disposed between an n-th scanning line segment and an (n+1)-th scanning line segment, wherein n is an integer greater than or equal to 1; n-th spacing regions in at least some of the first scanning lines are located at different positions along a first direction;

or, in a same first scanning line, an n-th spacing region is disposed between an n-th scanning line segment and an (n+1)-th scanning line segment, wherein n is an integer greater than or equal to 1; n-th spacing regions in at least some of the first scanning lines are located in a same column along a second direction.

* * * * *